United States Patent
Lee et al.

(10) Patent No.: US 12,131,781 B2
(45) Date of Patent: Oct. 29, 2024

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Jaeduk Lee, Seongnam-si (KR); Kinam Kim, Seoul (KR); Sujin Ahn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 413 days.

(21) Appl. No.: 17/689,005

(22) Filed: Mar. 8, 2022

(65) Prior Publication Data

US 2022/0293180 A1    Sep. 15, 2022

(30) Foreign Application Priority Data

Mar. 12, 2021  (KR) ........................ 10-2021-0032831

(51) Int. Cl.
| | |
|---|---|
| *G11C 16/04* | (2006.01) |
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 41/41* | (2023.01) |
| *H10B 43/10* | (2023.01) |
| *H10B 43/27* | (2023.01) |

(Continued)

(52) U.S. Cl.
CPC ...... *G11C 16/0483* (2013.01); *H01L 23/5226* (2013.01); *H01L 23/5283* (2013.01); *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02)

(58) Field of Classification Search
CPC ............ G11C 16/0483; H01L 23/5226; H01L 23/5283; H10B 43/35
See application file for complete search history.

(56) References Cited

U.S. PATENT DOCUMENTS

| | | |
|---|---|---|
| 5,812,454 A | 9/1998 | Choi |
| 8,482,057 B2 | 7/2013 | Yeh |

(Continued)

FOREIGN PATENT DOCUMENTS

KR    10-2013-0070148 A    6/2013

*Primary Examiner* — Anthony Ho
(74) *Attorney, Agent, or Firm* — Myers Bigel, P.A.

(57) ABSTRACT

Provided are semiconductor devices and data storage systems including the same. The semiconductor devices may include first and second separation structures parallel to each other, a block between the first and second separation structures, and bit lines on the block. The block includes strings, the bit lines include a first bit line electrically connected to first and second strings, each of the strings includes a lower select transistor, memory cell transistors, and upper select transistors connected in series, the upper select transistors in each of the strings include a first upper select transistor and a second upper select transistor below the first upper select transistor. The first upper select transistors of the first and second strings may share a single first upper select gate electrode. Gate electrodes of the lower select transistors of the first and second strings may include surfaces coplanar with each other.

20 Claims, 44 Drawing Sheets

(51) Int. Cl.
  *H10B 43/35*    (2023.01)
  *H10B 43/40*    (2023.01)

(56) References Cited

U.S. PATENT DOCUMENTS

| | | |
|---|---|---|
| 8,588,001 B2 | 11/2013 | Sim et al. |
| 9,236,340 B2 | 1/2016 | Lee et al. |
| 9,401,209 B2 | 7/2016 | Shim et al. |
| 9,412,462 B2 | 8/2016 | Park et al. |
| 9,601,208 B2 | 3/2017 | Lee |
| 2004/0124466 A1 | 7/2004 | Walker et al. |
| 2006/0044872 A1 | 3/2006 | Nazarian |
| 2020/0279608 A1 | 9/2020 | Shibata et al. |

SEMICONDUCTOR DEVICES AND DATA STORAGE SYSTEMS INCLUDING THE SAME

CROSS-REFERENCE TO RELATED APPLICATION(S)

This application claims priority to Korean Patent Application No. 10-2021-0032831 filed on Mar. 12, 2021 in the Korean Intellectual Property Office, the disclosure of which is incorporated herein by reference in its entirety.

BACKGROUND

The present inventive concept relates to a semiconductor device and a data storage system including the same.

Semiconductor devices capable of storing high-capacity data in electronic systems requiring data storage may be desirable. Therefore, methods for increasing capacity of data storage of semiconductor devices have been researched. For example, to increase capacity of data storage of semiconductor devices, a semiconductor device including memory cells arranged three-dimensionally instead of memory cells arranged two-dimensionally has been proposed.

SUMMARY

An aspect of the present inventive concept is to provide semiconductor devices capable of improving the degree of integration thereof.

An aspect of the present inventive concept is to provide data storage systems including those semiconductor devices.

According to some embodiments of the present inventive concept, a semiconductor device includes: a first separation structure and a second separation structure parallel to each other on a lower structure: a block (e.g., a memory cell block)between the first separation structure and the second separation structure on the lower structure; and bit lines on the first and second separation structures and the block, wherein the block includes strings (e.g., memory cell strings), the bit lines include a first bit line that is electrically connected to at least two strings among the strings, the at least two strings electrically connected to the first bit line include a first string and a second string, each of the strings includes a lower select transistor, memory cell transistors, and upper select transistors connected in series in a vertical direction, the upper select transistors in each of the strings include a first upper select transistor and a second upper select transistor below the first upper select transistor, the first upper select transistor of the first string and the first upper select transistor of the second string share one first upper select gate electrode, the lower select transistor of the first string includes a first lower select gate electrode, and the lower select transistor of the second string includes a second lower select gate electrode disposed to be coplanar with the first lower select gate electrode and electrically separated from the first lower select gate electrode. In some embodiments, the plurality of memory cell transistors may be between the lower select transistor and the plurality of upper select transistors, and the lower select transistor, the plurality of memory cell transistors, and the plurality of upper select transistors may be connected in series. In some embodiments, the first upper select transistor of the first string and the first upper select transistor of the second string may respectively include first and second portions of a single first upper select gate electrode.

According to some embodiments of the present inventive concept, a semiconductor device includes: a lower structure; a stack structure including interlayer insulating layers and gate electrodes alternately stacked on the lower structure; separation structures penetrating through the stack structure; vertical structures penetrating through the stack structure between the separation structures; and bit lines electrically connected to the vertical structures on the stack structure and the separation structures, wherein the stack structure includes a stack portion disposed between a pair of separation structures adjacent and parallel to each other, among the separation structures, the gate electrodes of the stack portion include a plurality of lower select gate electrodes spaced apart from each other on the same plane, word lines stacked and spaced apart from each other on the lower select gate electrodes in a vertical direction, and upper select gate electrodes stacked and spaced apart from each other on the word lines in the vertical direction, and the word lines and the upper select gate electrodes include opposing side surfaces in contact with the pair of separation structures, respectively. In some embodiments, each of the plurality of vertical structures may be electrically connected to at least one of the plurality of bit lines.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, terms such as "up," "upper portion," "upper surface," "down," "lower portion", "lower surface," "side surface," etc, may be understood as being referred to based on the drawings. Terms such as "upper", "middle" and "lower" may be replaced with other terms, e.g., "first," "second" and "third," etc. to be used to describe elements of the specification. Terms such as "first" and "second" may be used to describe various elements, but the elements are not limited by the terms, and "first element" may be referred to as "second element." As used herein, an element or region that is "covering" or "filling" another element or region may completely or partially cover or fill the other element or region.

Figure 1:
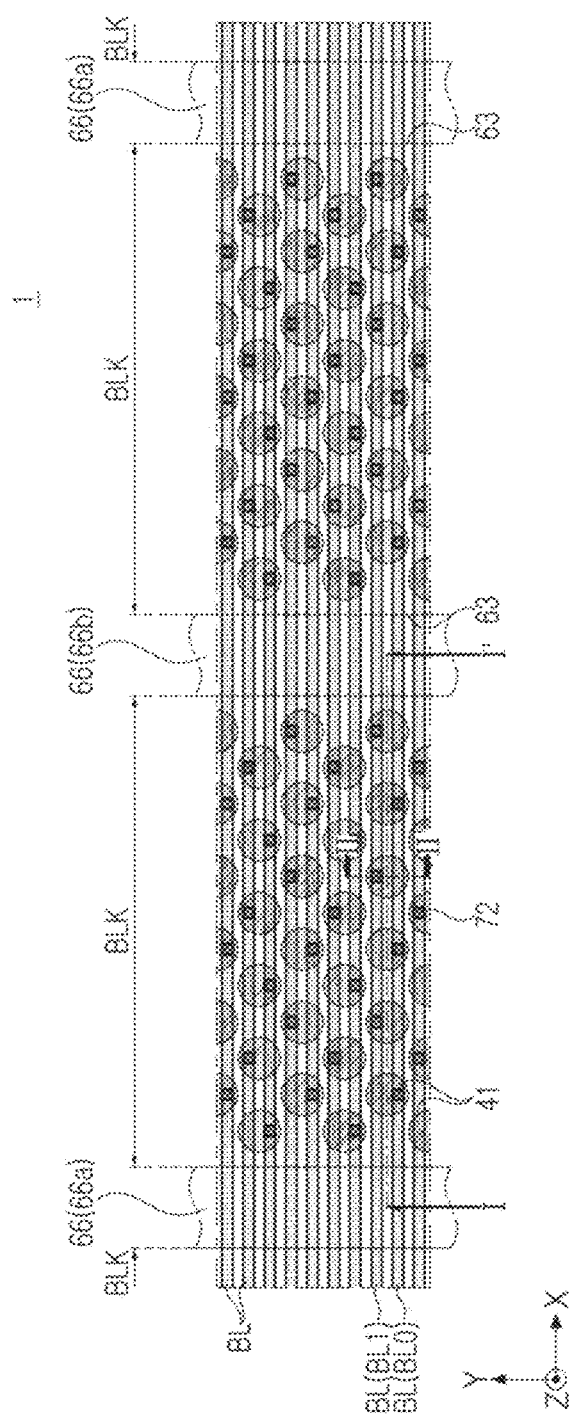
FIGS. 1, 2, 3A, 3B and 4 are schematic views illustrating examples of a semiconductor device according to an embodiment of the present inventive concept.
Figure 2:
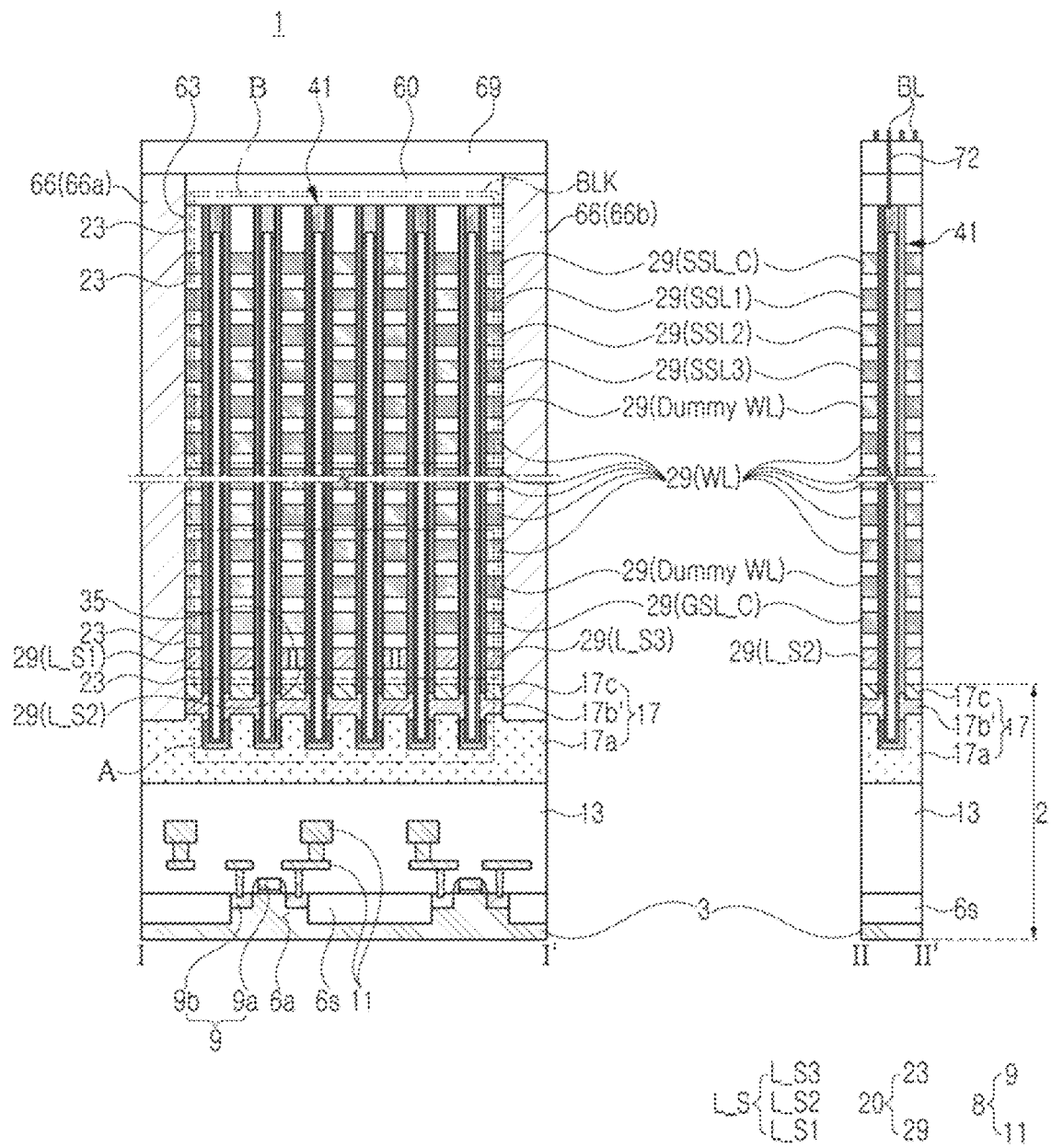
Figure 3A:
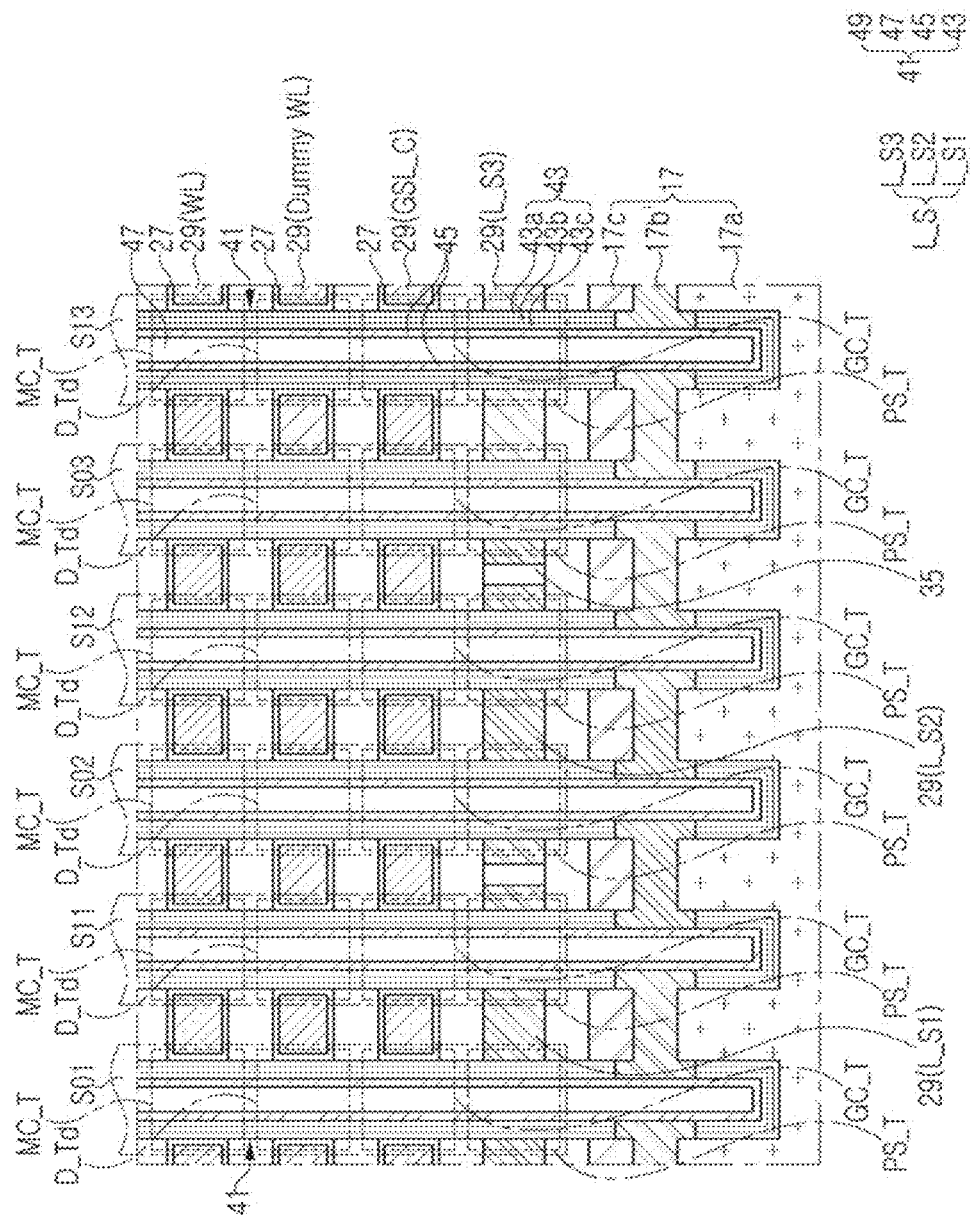
Figure 3B:
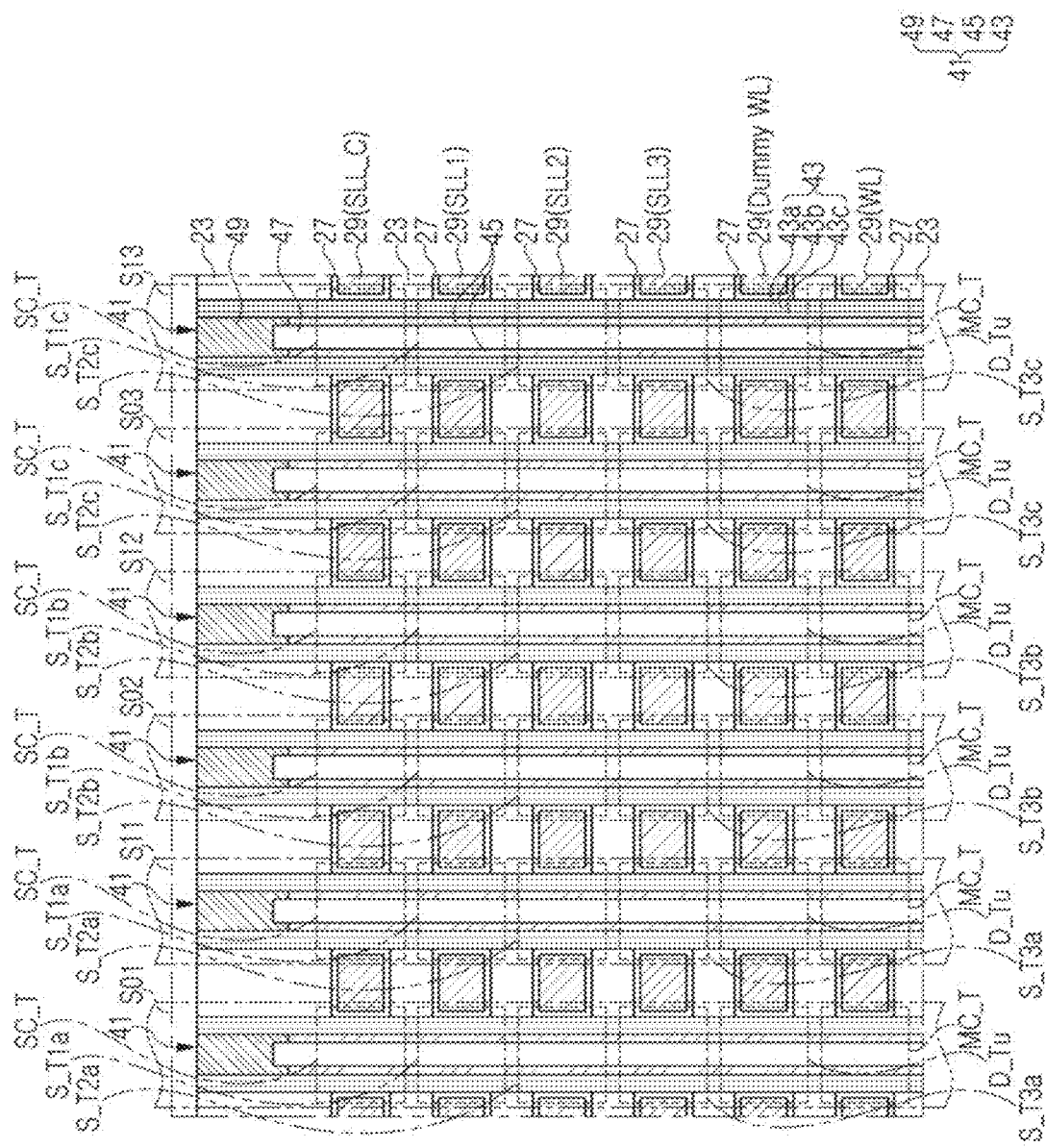
Figure 4:
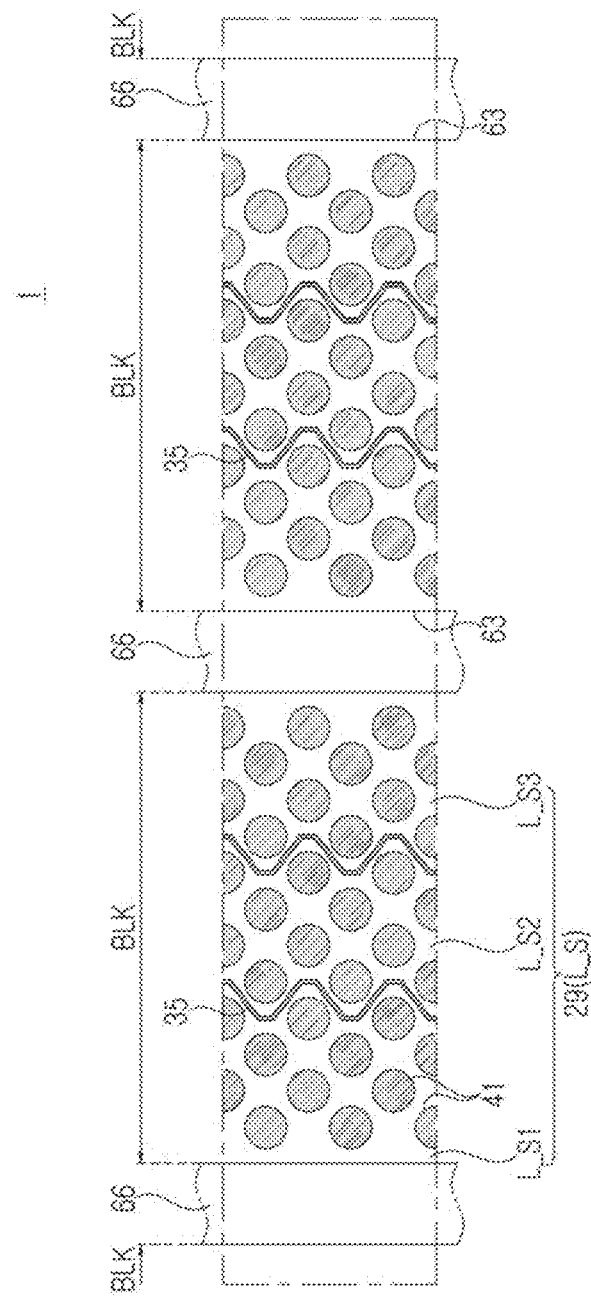

First, an example of a semiconductor device according to an embodiment of the present inventive concept will be described with reference to FIGS. 1 to 4. FIG. 1 is a plan view schematically illustrating an example of a semiconductor device according to an embodiment of the present inventive concept, FIG. 2 is a schematic cross-sectional view illustrating regions taken along lines I-I' and II-II' of FIG. 1, FIG. 3A is an partially enlarged cross-sectional view of a region marked with 'A' in FIG. 2, FIG. 3B is a partially enlarged cross-sectional view of a region marked with 'B' of FIG. 2, and FIG. 4 is a plan view schematically illustrating some components of FIGS. 2 and 3A.

Referring to FIGS. 1 to 4, a semiconductor device 1 according to an embodiment of the present inventive concept includes a lower structure 2, a stack structure 20 on the lower structure 2, separation structures 66 penetrating through the stack structure 20, vertical structures 41 penetrating through the stack structure 20 between the separation structures 66, and bit lines BL electrically connected to the vertical structures 41 on the stack structure 20 and the separation structures 66.

The lower structure 2 may include a semiconductor substrate 3, a peripheral circuit 8 on the semiconductor substrate 3, a lower insulating layer 13 covering the peripheral circuit 8 on the semiconductor substrate 3, and a patterned structure 17 on the lower insulating layer 13. The peripheral circuit 8 may include a circuit element 9 and a circuit interconnection 11 electrically connected to the circuit element 9. The circuit element 9 may include a peripheral gate 9a formed on the peripheral active region 6a defined by the device isolation layer 6s and peripheral source/drain 9b formed in the peripheral active region 6a. The patterned structure 17 may include a first patterned layer 17a, a second patterned layer 17b on the first patterned layer 17a, and a third patterned layer 17c on the second patterned layer 17b. The first patterned layer 17a may have a thickness greater than a thickness of each of the second patterned layer 17b and the third patterned layer 17c. At least one of the first patterned layer 17a, the second patterned layer 17b, or the third patterned layer 17c may include a silicon layer. For example, the first patterned layer 17a, the second patterned layer 17b, and the third patterned layer 17c may include a doped polysilicon layer, e.g., a polysilicon layer having an N-type conductivity.

The stack structure 20 may include interlayer insulating layers 23 and gate electrodes 29 that are alternately stacked. The interlayer insulating layers 23 may be formed of, for example, silicon oxide.

The stack structure 20 may further include a gate dielectric layer 27 including a portion interposed between the gate electrodes 29 and the vertical structures 41, while covering upper and lower surfaces of each of the gate electrodes 29. The gate dielectric layer 27 may include, for example, a high-k material.

The semiconductor device 1 may further include a first upper insulating layer 60 on the stack structure 20. The separation structures 66 may be disposed in separation trenches 63 penetrating through the first upper insulating layer 60 and the stack structure 20 and extending into the lower structure 2. The separation structures 66 may penetrate the first upper insulating layer 60 and the stack structure 20 and extend into the patterned structure 17 of the lower structure 2. The separation structures 66 may penetrate the third patterned layer 17c and the second patterned layer 17b of the patterned structure 17.

In some embodiments, the separation structures 66 may be formed of an insulating material. For example, the separation structures 66 may be formed of silicon oxide and/or a high-k dielectric having a higher dielectric constant than that of silicon oxide. As used herein, the term "and/or" includes any and all combinations of one or more of the associated listed items.

In some embodiments, the separation structures 66 may include a conductive pattern and an insulating material layer covering a side surface of the conductive pattern.

The semiconductor device 1 may further include a second upper insulating layer 69 on the first upper insulating layer 60 and the separation structures 66. The first and second upper insulating layers 60 and 69 may be formed of silicon oxide.

The semiconductor device 1 further includes bit line contact plugs 72 penetrating through the first and second upper insulating layers 60 and 69 and electrically connected to the vertical structures 41.

The bit lines BL may be disposed on the second upper insulating layer 69. The bit lines BL may be electrically connected to the vertical structures 41 through the bit line contact plugs 72.

The stack structure 20 may include a stack portion disposed between a pair of first and second separation structures 66a and 66b adjacent and parallel to each other, among the separation structures 66. In some embodiments, no separation structure 66 is provided between the first and second separation structures 66a and 66b that are adjacent to each other as illustrated in FIG. 1. Each of the first and second separation structures 66a and 66b may extend longitudinally in a direction (e.g., Y direction in FIG. 1) and may be parallel to each other.

In the stack structure 20, the gate electrodes 29 of the stack portion may include a plurality of lower select gate electrodes L_S spaced apart from each other on the same plane, word lines WL spaced apart from each other on the lower select gate electrodes L_S in a vertical direction Z, and upper select gate electrodes SSL3, SSL2, SSL1, and SSL_C spaced apart from each other and stacked on the word lines WL in the vertical direction Z.

The lower select gate electrodes L_S may be spaced apart from each other by insulating separation patterns 35. The insulating separation patterns 35 may be formed of, for example, silicon oxide. The lower select gate electrodes L_S may be electrically isolated from each other. For example, the lower select gate electrodes L_S may include a first lower select gate electrode L_S1, a second lower select gate electrode L_S2, and a third lower select gate electrode L_S3 spaced apart from each other and electrically separated from each other.

In an example embodiment, a planar shape of the lower select gate electrodes L_S may be the same as that shown in the plan view of FIG. 4. For example, as illustrated in FIG. 4, each of the insulating separation patterns 35 disposed between the adjacent lower select gate electrodes L_S may have a wavy shape.

The upper select gate electrodes SSL3, SSL2, SSL1, and SSL_C may include an upper common select gate electrode SSL_C, a first upper select gate electrode SSL1 below the upper common select gate electrode SSL_C, a second upper select gate electrode SSL2 below the first upper select gate electrode SSL1, and a third upper select gate electrode SSL3 below the second upper select gate electrode SSL2.

In an example embodiment, the gate electrodes 29 may further include a lower common select gate electrode GSL_C between the lower select gate electrodes L_S and the word lines WL.

In an example embodiment, the gate electrodes 29 may further include a dummy word line Dummy WL between the word lines WL and the lower common select gate electrode GSL_C and may include a dummy word line Dummy WL between and the word lines WL and the third upper select gate electrode SSL3.

Among the gate electrodes 29 of the stack structure 20, the lower common select gate electrode GSL_C, the dummy word line Dummy W L, the word lines WL, and the upper select gate electrodes SSL1, SSL2, and SSL3 and the upper common select gate electrode SSL_C may be formed of a first conductive material, and the lower select gate electrodes L_S1, L_S2, and L_S3 may be formed of a second conductive material different from the first conductive material. For example, the first conductive material may include at least one of W, Ru, Mo, Ni, NiSi, Co, CoSi, Ti, TiN, or WN, and the second conductive material may include at least one of polysilicon, W, Ru, Mo, Ni, NiSi, Co, CoSi, Ti, TiN, or WN.

Each of the word lines WL, the dummy word lines Dummy WL, the lower common select gate electrode GSL_C, and the upper select gate electrodes SSL3, SSL2, SSL1, and SSL_C may have both side surfaces in contact with the pair of first and second separation structures 66a and 66b.

The vertical structures 41 may extend into the patterned structure 17 of the lower structure 2 through the stack structure 20. For example, the vertical structures 41 may downwardly extend through the stack structure 20, penetrate the third patterned layer 17c and the second patterned layer 17b', and extend into the first pattern layer 17a.

Each of the vertical structures 41 may include an insulating core pattern 47, a channel layer 45 covering a side surface and a bottom surface of the insulating core pattern 47, a pad pattern 49 in contact with the channel layer 45 on the insulating core pattern 47, and a dielectric structure 43 covering at least an outer surface of the channel layer 45. The dielectric structure 43 may include a first dielectric layer 43a, a second dielectric layer 43c, and a charge trap layer 43b between the first and second dielectric layers 43a and 43c. The second dielectric layer 43c may be interposed between the charge trap layer 43b and the channel layer 45.

The insulating core pattern 47 may include, for example, silicon oxide, e.g., silicon oxide that may be formed by atomic layer deposition or silicon oxide in which voids are formed. The second dielectric layer 43c may include, for example, silicon oxide or silicon oxide doped with impurities. The first dielectric layer 43a may include, for example, at least one of silicon oxide and a high dielectric layer. The charge trap layer 43b may include a material capable of storing data by trapping a charge, e.g., silicon nitride. The charge trap layer 43b may include regions capable of storing data in a semiconductor device such as a flash memory device. The channel layer 45 may include, for example, a silicon layer, e.g., an undoped silicon layer or a silicon layer having a P-type conductivity. The pad pattern 49 may include, for example, at least one of doped polysilicon, metal nitride (e.g., TiN, etc.), metal (e.g., W, etc.), and a metal-semiconductor compound (e.g., TiSi, etc.).

The bit line contact plugs 72 may be in contact with and electrically connected to the pad patterns 49 of the vertical structures 41.

In a portion of each of the vertical structures 41 extending into the patterned structure 17, the second patterned layer 17b may be in contact with the channel layer 45 penetrating through the dielectric structure 43, and the dielectric structure 43 may be separated into upper and lower portions by the second patterned layer 17b.

In some embodiments, blocks BLK may be defined between the separation structures 66. For example, the blocks BLK may include one block BLK disposed between the first and second separation structures 66a and 66b parallel to each other. Each of the blocks BLK may include the gate electrodes 29, channel layers 45 of the vertical structures 41 facing the gate electrodes 29, and the dielectric structures 43 between the gate electrodes 29 and the channel layers 45 of the vertical structures 41, between the pair of separation structures 66a and 66b parallel to each other. The block may also be referred to as a memory cell block.

Hereinafter, one block BLK disposed between the first and second separation structures 66a and 66b adjacent and parallel to each other will be mainly described. The block BLK may include strings S01, S11, S02, S12, S03, and S13 electrically connected to the bit lines BL. Each of the strings S01, S11, S02, S12, S03, and S13 may include transistors connected in series in the vertical direction Z. The strings may also be referred to as a memory cell strings.

Figure 5:
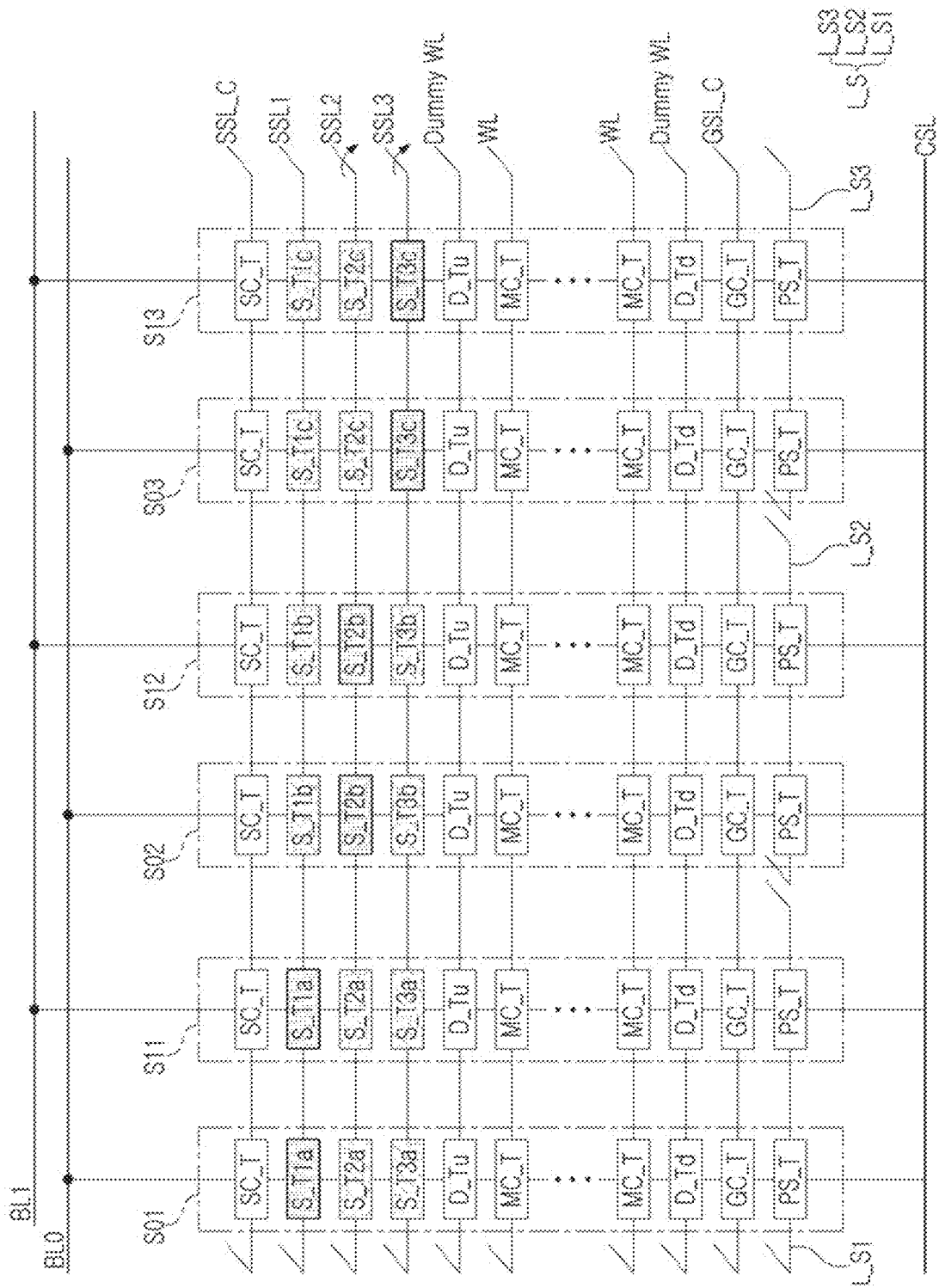
FIGS. 5 and 6 are schematic views illustrating a circuit of an example of a semiconductor device according to an embodiment of the present inventive concept.
Figure 6:
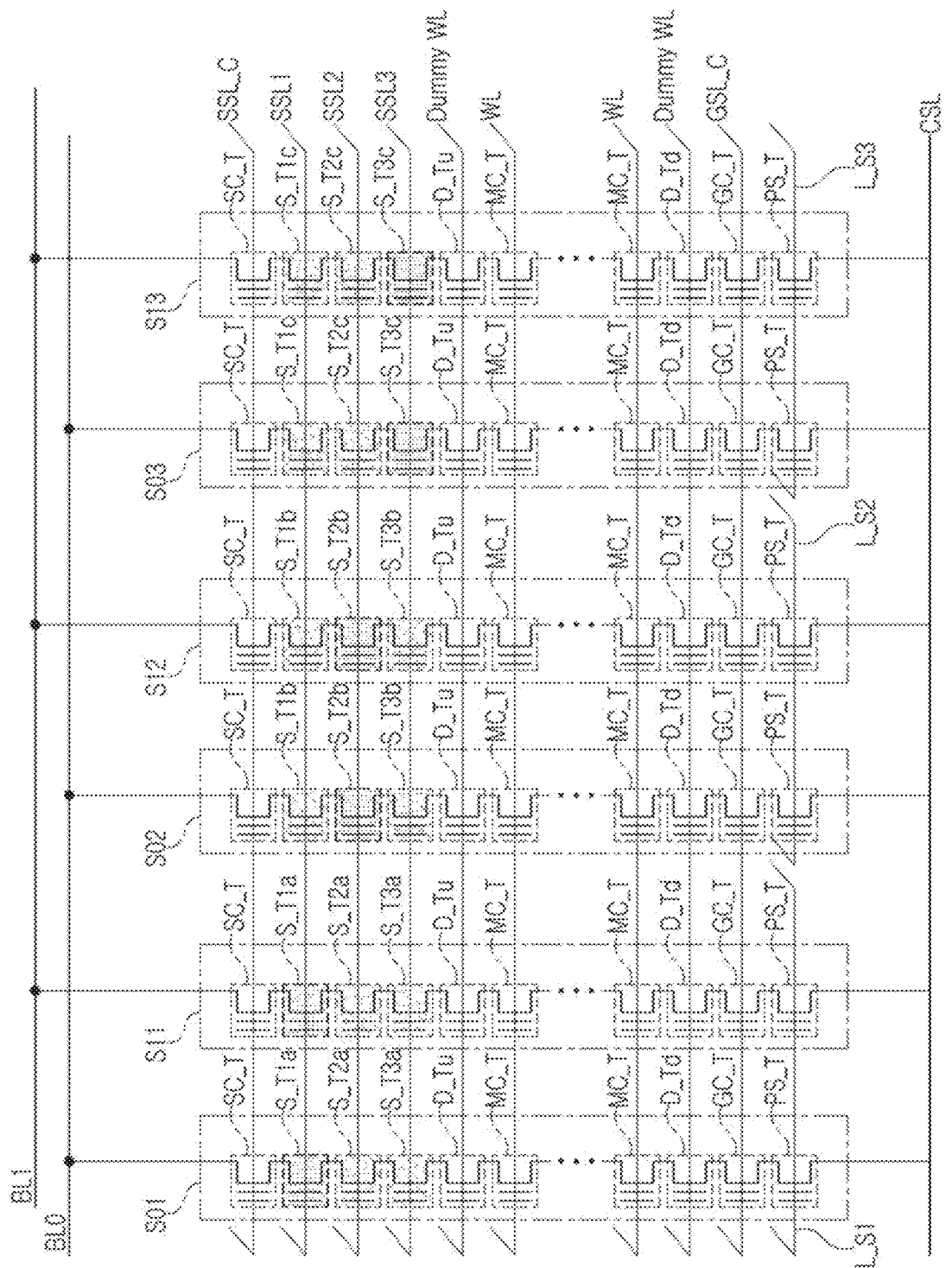

An example of the block BLK including such transistors will be described with reference to FIGS. 5 and 6 together with FIGS. 1 to 4. FIGS. 5 and 6 are schematic views illustrating circuits of examples of a semiconductor device according to an embodiment of the present inventive concept. FIG. 5 is a view conceptually illustrating the strings S01, S11, S02, S12, S03, and S13 and the first and second bit lines BL0 and BL2, and FIG. 6 is a circuit diagram illustrating the strings S01, S11, S02, S12, S03, and S13 and the first and second bit lines BL0 and BL2.

Referring to FIGS. 5 and 6 together with FIGS. 1 to 4, each of the bit lines BL may be electrically connected to at least two strings disposed between the first and second separation structures 66a and 66b. The bit lines BL may include a first bit line BL0 and a second bit line BL1 parallel to each other and adjacent to each other. Among the bit lines BL, the first bit line BL0 may be an even-numbered bit line, and the second bit line BL1 may be an odd-numbered bit line. In some embodiments, no bit line BL is provided between the first bit line BL0 and a second bit line BL1 as illustrated in FIG. 1 such that the first bit line BL0 is adjacent to the second bit line BL1.

The strings S01, S11, S02, S12, S03, and S13 may be electrically connected to a common source CSL below the strings S01, S11, S02, S12, S03, and S13. The common source CSL may be at least a portion of the patterned structure 17 of FIGS. 2 and 3A. For example, the common source CSL may be a polysilicon layer having an N-type conductivity in the patterned structure 17. For example, the common source CS may include the second patterned layer 17b in contact with the channel layers 45 of the vertical structures 41 and the first patterned layer 17a in contact with the second patterned layer 17b.

The strings S01, S11, S02, S12, S03, and S13 may include a first string S01, a second string S02, and a third string S03 electrically connected to the first bit line BL0 and may include a fourth string S11, a fifth string S12, and a sixth string S13 electrically connected to the second bit line BL1.

Each of the strings S01, S11, S02, S12, S03, and S13 may include a lower select transistor PS_T, a lower common select transistor GC_T, memory cell transistors MT_C and upper select transistors connected in series in the vertical direction Z.

Each of the strings S01, S11, S02, S12, S03, and S13 may further include a dummy transistor D_Td between the lower select transistor PS_T and the memory cell transistors MC_Ts and a dummy transistor D_Tu between the memory cell transistor MC_Ts and the upper select transistors.

In each of the strings S01, S11, S02, S12, S03, and S13, the upper select transistors may include first upper select transistors S_T1a, S_T1b, S_T1c positioned on the same height level (e.g., the same height from the substrate 3) and second upper select transistors S_T2a, S_T2b, and S_T2c positioned on the same height level below the first upper select transistors S_T1a, S_T1b, and S_T1c.

In each of the strings S01, S11, S02, S12, S03, and S13, the upper select transistors may further include third upper select transistors S_T3a, S_T3b, and S_T3c positioned on the same height level below the second upper select transistors S_T2a, S_T2b, and S_T2c.

In each of the strings S01, S11, S02, S12, S03, and S13, the upper select transistors may further include an upper common select transistor SC_T on the first upper select transistor S_T1a, S_T1b, and S_T1c.

In one block BLK disposed between the first and second separation structures 66a and 66b adjacent and parallel to each other, memory cell transistors positioned on the same height level, among the memory cell transistors MC_Ts, may share one word line, and upper select transistors positioned on the same height level, among the upper select transistors, may share one upper select gate electrode. Here, one word line may have both side surfaces in contact with the first and second separation structures 66a and 66b, and the one upper select gate electrode may have both sides in contact with the first and second separation structures 66a and 66b. As used herein, "a gate electrode X shared by transistors A and B" (or similar language) refers to a gate electrode X that includes portions respectively functioning as gates of the transistors A and B, and the transistors A and B respectively include those portions of the gate electrode X.

In one block BLK disposed between the first and second separation structures 66a and 66b, the first upper select transistor S_T1a of the first string S01, the first upper select transistor S_T1b of the second string S02, the first upper select transistor S_T1c of the third string S03, the first upper select transistor S_T1a of the fourth string S11, the first upper select transistor S_T1b of the fifth string S12, and the first upper select transistor S_T2c of the sixth string S13 may share one first upper select gate electrode SSL1. Similarly, in one block BLK disposed between the first and second separation structures 66a and 66b, the second upper select transistors S_T2a, S_T2b, and S_T2c positioned on the same height level may share one second upper select gate electrode SSL2, and the third upper select transistors S_T3a, S_T3b, and S_T3c positioned on the same height level may share one third upper select gate electrode SSL3.

In one block BLK disposed between the first and second separation structures 66a and 66b, the lower common select transistors GC_T positioned on the same height level may share one lower common select gate electrode GSL_C, and the upper common select transistors SC_T positioned on the same height level may share one upper common select gate electrode SSL_C.

In one block BLK disposed between the first and second separation structures 66a and 66b, the lower select transistor PS_T of the first string S01 electrically connected to the first bit line BL0 and the lower select transistor PS_T of the fourth string S11 electrically connected to the second bit line BL1 may share one first lower select gate electrodes L_S1, the lower select transistor PS_T of the second string S02 electrically connected to the first bit line BL0 and the lower select transistor PS_T of the fifth string S12 electrically connected to the second bit line BL1 may share one second lower select gate electrode L_S2, and the lower select transistor PS_T of the third string S03 electrically connected to the first bit line BL0 and the lower select transistor PS_T of the sixth string S13 electrically connected to the second bit line BL1 may share one third lower select gate electrode L_S3.

In one block BLK disposed between the first and second separation structures 66a and 66b, the first lower select gate electrode L_S1 of the lower select transistor PS_T of the first string S01, the second lower select gate electrode L_S2 of the lower select transistor PS_T of the second string S02, and the third lower select gate electrode L_S3 of the lower select transistor PS_T of the third string S03 may be electrically isolated from each other and/or physically separated from each other. Accordingly, the first to third lower select gate electrodes L_S1, L_S2, and L_S3 disposed on the same height level, that is, on the same plane, may be electrically separated from each other.

Figure 7:
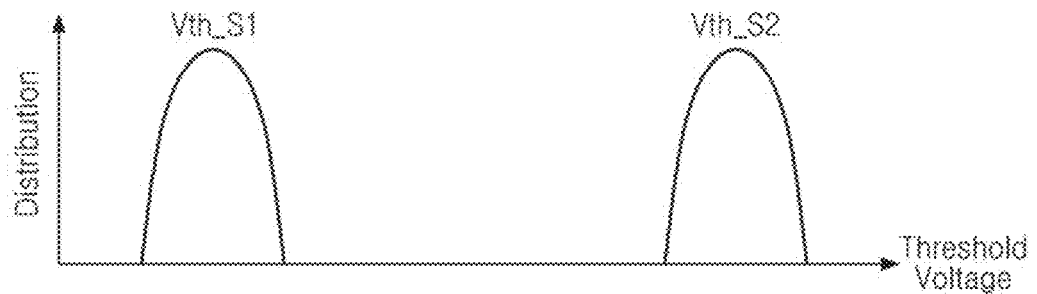
FIG. 7 is a view schematically illustrating an example of threshold voltages of upper select transistors of a semiconductor device according to an embodiment of the present inventive concept.

In some embodiments, the upper select transistors of the strings S01, S11, S02, S12, S03, and S13 disposed between the pair of separation structures 66a and 66b and positioned on the same height level may include one or more first threshold voltage transistors and a plurality of second threshold voltage transistors. Here, a number of the plurality of second threshold voltage transistors may be greater than a number of the one or more first threshold voltage transistors. The upper select transistors disposed between the pair of separation structures 66a and 66b, sharing the channel layer of any one of the vertical structures 41, and positioned at different height levels may include one or more first threshold voltage transistors and a plurality of second threshold voltage transistors. Here, a number of the plurality of second threshold voltage transistors may be greater than a number of the one or more first threshold voltage transistors. Examples of the first threshold voltage and the second threshold voltage will be described with reference to FIG. 7. FIG. 7 is a view schematically illustrating an example of threshold voltages of upper select transistors of a semiconductor device according to an embodiment of the present inventive concept.

Referring to FIG. 7 together with FIGS. 1 to 6, in each of the strings S01, S11, S02, S12, S03, and S13, the upper select transistors connected in series may include a first group of upper select transistors S_T1a, S_T2b, S_T3c having a first threshold voltage Vth_S1 and a second group of upper select transistors S_T2a, S_T3a, S_T1b, S_T3b, S_T1c, S_T2c having a second threshold voltage Vth_S2 different from the first threshold voltage Vth_S1. The second threshold voltage Vth_S2 may be greater than the first threshold voltage Vth_S1.

In an example embodiment, the first threshold voltage Vth_S1 may be a negative voltage, and the second threshold voltage Vth_S2 may be a positive voltage.

In an example embodiment, a voltage difference between the first threshold voltage Vth_S1 and the second threshold voltage Vth_S2 may be about 2 V or more. For example, the second threshold voltage Vth_S2 may be greater than the first threshold voltage Vth_S1 by about 2V or more.

In each of the first and fourth strings S01 and S11, the first upper select transistor S_T1a may have the first threshold voltage Vth_S1, and the second and third upper select transistors S_T2a and S_T3a may have the second threshold voltage Vth_S2.

In each of the second and fifth strings S02 and S12, the second upper select transistor S_T2b may have the first threshold voltage Vth_S1, and the first and third upper select transistors S_T1b and S_T3b may have the second threshold voltage Vth_S2.

In each of the third and sixth strings S03 and S13, the third upper select transistor S_T3c may have the first threshold voltage Vth_S1, and the second and third upper select transistors S_T2c and S_T3c may have the second threshold voltage Vth_S2.

In some embodiments, the transistors having the first threshold voltage Vth_S1 may be referred to as first threshold voltage transistors, and the transistors having the second threshold voltage Vth_S2 may be referred to as second threshold voltage transistors.

Figure 8:
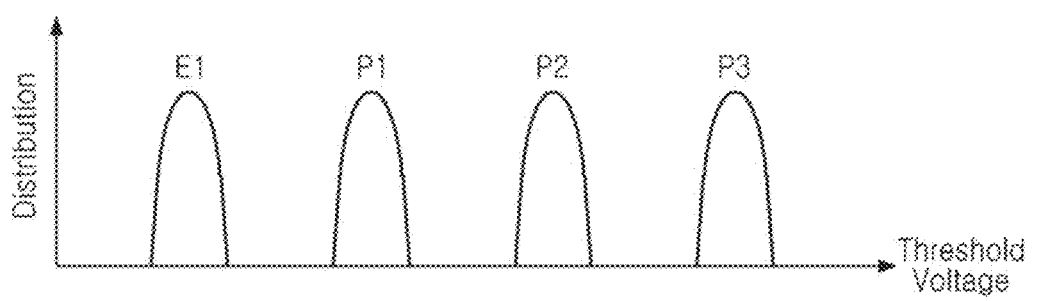
FIG. 8 is a view schematically illustrating another example of threshold voltages of upper select transistors of a semiconductor device according to an embodiment of the present inventive concept.

Next, another example of threshold voltages of the upper select transistors of the strings S01, S1, S02, S12, S03, and S13 will be described with reference to FIG. 8. FIG. 8 is a view schematically illustrating another example of threshold voltages of upper select transistors of a semiconductor device according to an embodiment of the present inventive concept.

Referring to FIG. 8 together with FIGS. 1 to 6, in each of the strings S01, S11, S02, S12, S03, and S13, the upper select transistors connected in series may include upper select transistors S_T1a, S_T2b, S_T3c having a first threshold voltage E1 and upper select transistors S_T2a, S_T3a, S_T1b, S_T3b, S_T1c, and S_T2c having second to third threshold voltages P1, P2, and P3 different from the first threshold voltage Vth_S1.

In each of the first and fourth strings S01 and S11, the first upper select transistor S_T1a may have the first threshold voltage E1, in each of the second and fifth strings In S02 and S12, the second upper select transistor S_T2b may have the first threshold voltage E1, and in each of the third and sixth strings S03 and S13, the third upper select transistor S_T3c may have the first threshold voltage E1.

In the second, third, fifth, and sixth strings S02, S03, S12, and S13, the first upper select transistors S_T1b and S_T1c positioned on the same height level may have a second threshold voltage P1.

In the first, fourth, third, and sixth strings S01, S11, S03, and S13, the second upper select transistors S_T2a and S_T2c positioned on the same height level may have a third threshold voltage P2.

In the first, second, fourth, and fifth strings S01, S02, S11, and S12, the third upper select transistors S_T3a and S_T3b positioned on the same height level may have a fourth threshold voltage P3.

The first to fourth threshold voltages E1, P1, P2, and P3 may be different voltages.

In an example embodiment, the voltage may increase from the first threshold voltage E1 to the fourth threshold voltage P3. In some embodiments, the first threshold voltage E1 may have the lowest value, the fourth threshold voltage P3 may have the highest value, and the second threshold voltage P1 and the third threshold voltage P2 may have values between the lowest value and the highest value as illustrated in FIG. 8.

In an example embodiment, a voltage difference between adjacent threshold voltages (e.g., P1 and P2) among the first to fourth threshold voltages E1, P1, P2, and P3 may be about 2V or more.

In an example embodiment, in the second, third, fifth and sixth strings S02, S03, S12, and S13, the first upper select transistors S_T1b and S_T1c positioned on the same height level may have the third threshold voltage P2 or the fourth threshold voltage P3, instead of the second threshold voltage P1.

In the first, fourth, third, and sixth strings S01, S11, S03, and S13, the second upper select transistors S_T2a and S_T2c positioned on the same height level may have the second threshold voltage P1 or the fourth threshold voltage P3, instead of the third threshold voltage P2.

In the first, second, fourth, and fifth strings S01, S02, S11, and S12, the third upper select transistors S_T3a and S_T3b positioned on the same height level may have the second threshold voltage P1 or the third threshold voltage P2, instead of the fourth threshold voltage P3.

In some embodiments, in each of the strings S01, S11, S02, S12, S03, and S13, the upper select transistors connected in series may have at least three threshold voltages that are different from each other.

Each of the first and fourth strings S01 and S11 may include a first upper select transistor S_T1a having the first threshold voltage E1, a second upper select transistor S_T2a having the third threshold voltage P2, and a third upper select transistor S_T3a having the fourth threshold voltage P3.

Each of the second and fifth strings S02 and S12 may include a first upper select transistor S_T1b having the second threshold voltage P1, a second upper select transistor S_T2b having the first threshold voltage E1 and a third upper select transistor S_T3b having the fourth threshold voltage P3.

Each of the third and sixth strings S03 and S13 may include a first upper select transistor S_T1c having the second threshold voltage P1, a second upper select transistor S_T2c having the third threshold voltage P2 and a third upper select transistor S_T3c having the first threshold voltage E1.

A voltage difference between a threshold voltage of the first upper select transistor S_T1a of the first string S01 and a threshold voltage of the first upper select transistor S_T1b of the second string S02 may be about 2 V or more.

In an embodiment, when there are three strings electrically connected to any one bit line in any one block BLK, an upper select transistor including the first threshold voltage E1 and an upper select transistor having any one threshold voltage, among the second to fourth threshold voltages P1, P2, and P3, may be disposed on the same height level.

In an embodiment, when there are three strings electrically connected to any one bit line in any one block BLK, any one string may include upper select transistors arranged in a vertical direction and having different threshold voltages, and any one of the upper select transistors having different voltages may be the upper select transistor having the first threshold voltage E1.

In an embodiment, in any one block BLK, there may be two or four strings electrically connected to any one bit line.

In an example embodiment, when there are two strings electrically connected to any one bit line in one block BLK, the third and sixth strings S03 and S13 in FIG. 5 are may be omitted, and the third upper select gate electrode SSL3 and the third upper select transistors S_T3a, S_T3b, and S_T3c may be omitted.

In an example embodiment, when there are four strings electrically connected to any one bit line in any one block BLK, an additional string electrically connected to the first bit line BL0 in FIG. 5 and an additional string electrically connected to the second bit line BL1 may be added.

Figure 9:
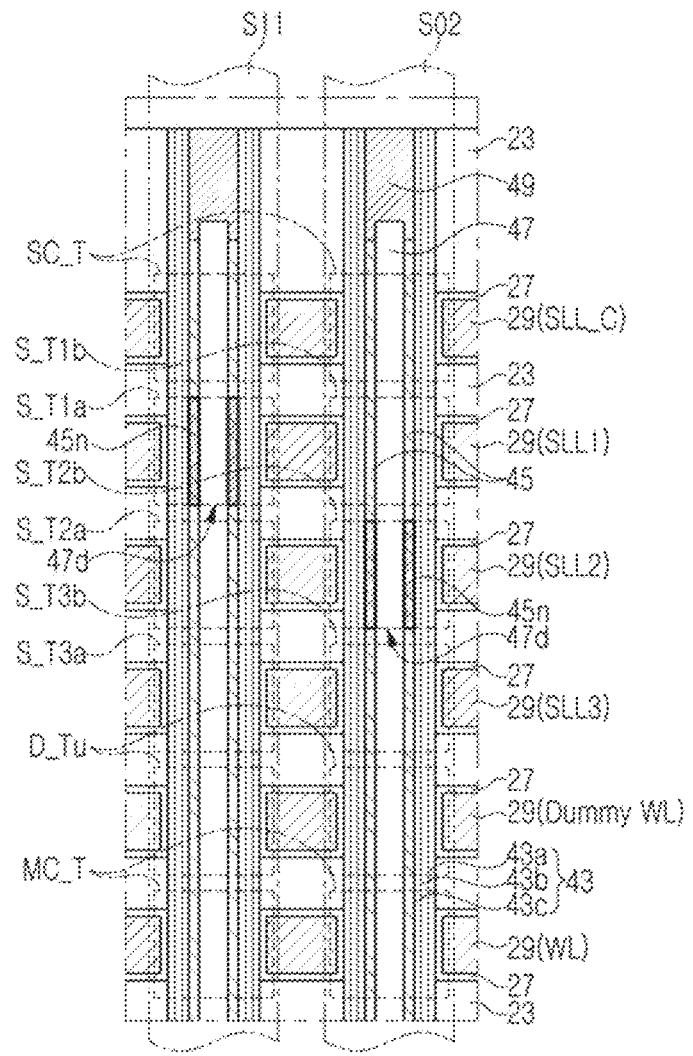
FIG. 9 is a partially enlarged cross-sectional view illustrating a modified embodiment of a semiconductor device according to an embodiment of the present inventive concept.

Referring back to FIG. 7 together with FIGS. 1 to 6, as described above, in each of the strings S01, S11, S02, S12, S03, and S13, the upper select transistors connected in series may include upper select transistors S_T1a, S_T2b, and S_T3c having the first threshold voltage Vth_S1 and upper select transistors S_T2a, S_T3a, S_T1b, S_T3b, S_T1c, and S_T2c having the second threshold voltage Vth_S2. In each of the strings S01, S11, S02, S12, S03, and S13, the upper select transistors connected in series may be configured as enhancement mode transistors, but the present inventive concept is not limited thereto and the upper select transistors connected in series may include depletion mode transistors and enhancement mode transistors. Hereinafter, with reference to FIG. 9, an example embodiment of the upper select transistors S_T1a, S_T2b, and S_T3c having the first threshold voltage Vth_S1 and the upper select transistors S_T2a, S_T3a, S_T1b, S_T3b, S_T1c, and S_T2c having the second threshold voltage Vth_S2 described above will be described. FIG. 9 is an enlarged partial view of a region including the fourth string S11 and the second string S02 in FIG. 3B.

Referring to FIG. 9 together with FIGS. 1 to 7, in an example embodiment, the upper select transistors S_T1a, S_T2b, and S_T3c having the first threshold voltage Vth_S1 may be depletion mode transistors, and the upper select transistors S_T2a, S_T3a, S_T1b, S_T3b, S_T1c, and S_T2c having the second threshold voltage Vth_S2 may be enhancement mode transistors.

In the channel layer 45 of each of the vertical structures 41, a region of the channel layer 45 included in the upper select transistors S_T1a, S_T2b, and S_T3c, which may be the depletion mode transistor, may be defined as a first channel region 45n. In a region of the channel layer 45 included in the upper select transistors S_T2a, S_T3a, S_T1b, S_T3b, S_T1c, and S_T2c, which may be the enhancement mode transistors, the channel layer 45 may be defined as a second channel region 45u.

In an example embodiment, in the channel layer 45, the first channel region 45n may be a region having an N-type conductivity doped with "P" or "As," and the second channel region 45u may be an undoped region, e.g., an intrinsic semiconductor region.

In another example, in the channel layer 45, the first channel region 45n may be an undoped region or a region having an N-type conductivity, and the second channel region 45u may be a region having a P-type conductivity.

Gap-fill insulating layers 47 of the vertical structures 41 may include doped regions 47d adjacent to the channel layers 45 of the region included in the upper select transistors S_T1a, S_T2b, and S_T3c, which may be the depletion mode transistors. The doped regions 47d of the gap-fill insulating layers 47 may be regions doped with impurities such as "P" or "As." In the gap-fill insulating layers 47, the remaining regions vertically adjacent to the doped regions 47d in the vertical direction may be regions not doped with impurities such as "P" or "As." The remaining regions of the gap-fill insulating layers 47 vertically adjacent to the doped regions 47d in the vertical direction may not include impurities (e.g., P or As) that are intentionally doped. In some embodiments, those remaining regions of the gap-fill insulating layers 47 may include impurities diffused from the doped regions 47d but may have an impurity concentration far lower than an impurity concentration in the doped regions 47d.

Since the upper select transistors S_T1a, S_T2b, and S_T3c, which may be the depletion mode transistors, may be disposed at different height levels, the doped regions 47d of the gap-fill insulating layers 47 may be disposed at different height levels.

In another example, some of the doped regions 47d of the gap-fill insulating layers 47 may overlap the first channel regions 45n, and the other may be positioned below the first channel regions 45n adjacent thereto.

Figure 10:
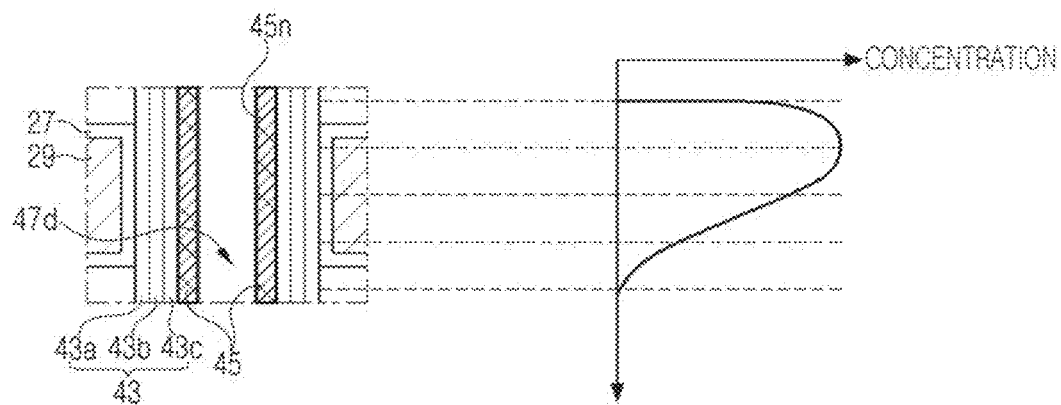
FIG. 10 is an exemplary view illustrating an example of a doping profile of a channel layer in a modified embodiment of a semiconductor device according to an embodiment of the present inventive concept.

Next, a doping profile of the first channel region 45n of the upper select transistors S_T1a, S_T2b, and S_T3c, which may be the depletion mode transistors, will be described with reference to FIGS. 10 and 11. Here, the first channel region 45n may include an impurity (e.g., P or As), and the doping profile may be a doping profile of an impurity such as P or As. FIG. 10 is a view illustrating an example of a doping profile of a channel layer 45 in a semiconductor device according to an embodiment of the present inventive concept, and FIG. 11 is a view illustrating another example of a doping profile of a channel layer 45 in a semiconductor device according to an embodiment of the present inventive concept.

First, referring to FIG. 10, a portion of the channel layer 45, that is, the first channel region 45n, of the upper select transistors S_T1a, S_T2b, and S_T3c, which may be the depletion mode transistors, may have a doping profile of impurities changing in a vertical direction. The doping profile may have a structure in which an upper portion and a lower portion thereof are asymmetric, and the upper portion of the doping profile may change more steeply than the lower portion of the doping profile.

Figure 11:
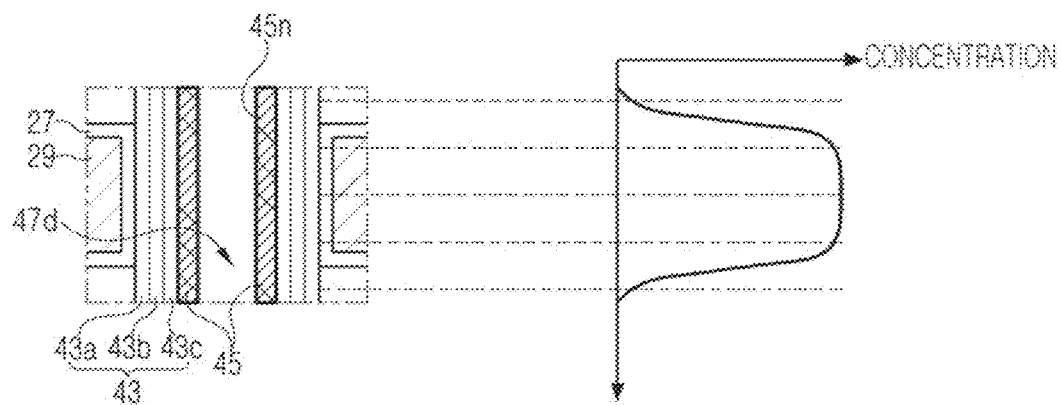
FIG. 11 is an exemplary view illustrating another example of a doping profile of a channel layer in a modified embodiment of a semiconductor device according to an embodiment of the present inventive concept.

In another example, referring to FIG. 11, a portion of the channel layer 45, that is, the first channel region 45n, of the upper select transistors S_T1a, S_T2b, and S_T3c, which may be the depletion mode transistors, may have a doping profile of an impurity changing in a vertical direction, and the doping profile may have a structure in which an upper portion and a lower portion thereof are substantially symmetrical.

Next, a method of setting threshold voltages of the upper select transistors of the strings S01, S11, S02, S12, S03, and S13 described above with reference to FIG. 5, 6, 7 or 8 will be described with reference to FIG. 12.

Figure 12:
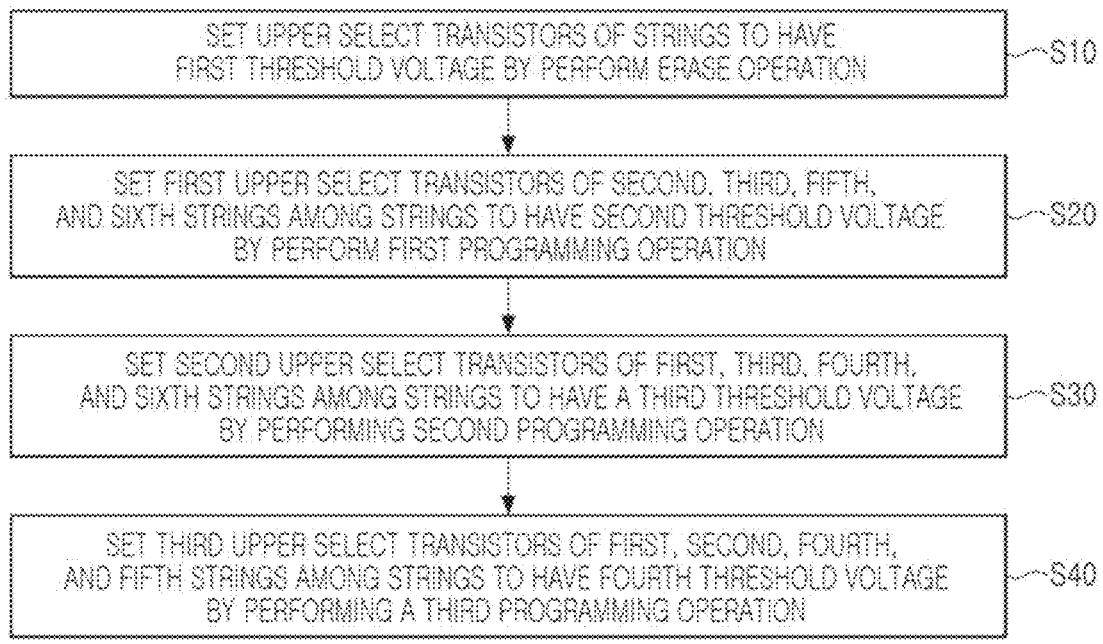
FIG. 12 is a flowchart illustrating a method of setting threshold voltages of upper select transistors of a semiconductor device according to an embodiment of the present inventive concept.

FIG. 12 is a flowchart illustrating a method of setting threshold voltages of upper select transistors of a semiconductor device according to an embodiment of the present inventive concept.

Referring to FIG. 12 together with FIGS. 5, 6, and 8, an erase operation may be performed to set the upper select transistors S_T1a, S_T1b, S_T1c, S_T2a, S_T2b, S_T2c, S_T3a, S_T3b, and S_T3c of the strings S01, S02, S03, S11, S12, and S3 to have the first threshold voltage (e.g., Vth_S1 of FIG. 7 or E1 of FIG. 8) (S10). In this state, electrons in the charge trap layer 43b of the dielectric structure (e.g., 43 of FIG. 3B) of the upper select transistors S_T1a, S_T1b, S_T1c, S_T2a, S_T2b, S_T2c, S_T3a, S_T3b, and S_T3c are transferred to the channel layer 45.

A first programming operation may be performed to set the first upper select transistors S_T1b and S_T1c of the second, third, fifth, and sixth memory cell strings S02, S03, S12, and S13 in the strings S01, S02, S03, S11, S12, and S13 to have the second threshold voltage (e.g., P1 of FIG. 8) (S20).

A second programming operation may be performed to set the second upper select transistors S_T2a and S_Ta2c of the first, third, fourth, and sixth memory cell strings S01, S03, S11, and S13 of the strings S01, S02, S03, S11, S12, and S13 to have the third threshold voltage (e.g., P2 of FIG. 8) (S30).

A third programming operation may be performed to set the third upper select transistors S_T3a and S_T3b of the first, second, fourth, and fifth memory cell strings S01, S02, S11, and S12 among the strings S01, S02, S03, S11, S12, and S13 to have a fourth threshold voltage (e.g., P3 of FIG. 8) (S40).

In an example embodiment, if the second to fourth threshold voltages set by the first to third programming operations are different from each other, the second to fourth threshold voltages P1, P2, and P3 as illustrated in FIG. 8 may be set.

The first upper select transistor S_T1a of the first and fourth strings S01 and S11, the second upper select transistor S_T2b of the second and fifth strings S02 and S12, and the third upper select transistor S_T3c of the third and sixth strings S03 and S13, not set to have the second threshold voltage Vth_S2 by the first to third programming operations, may have the first threshold voltage (e.g., Vth_S1 of FIG. 7 or E1 of FIG. 8).

In another example, when the second to fourth threshold voltages set by the first to third programming operations are the same, the second threshold voltage Vth_S2 as illustrated in FIG. 7 may be set.

Figure 13:
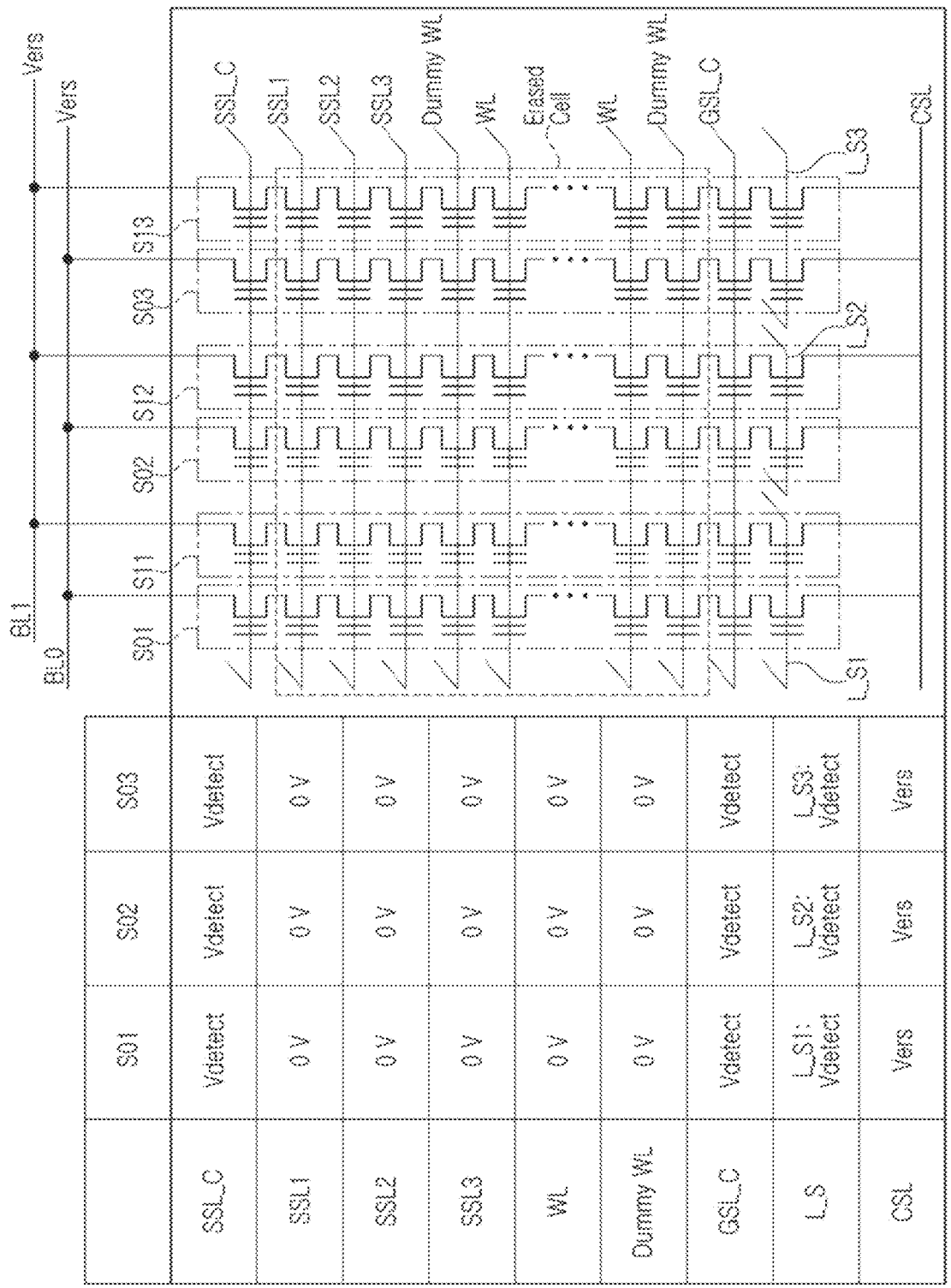
FIG. 13 is a schematic view illustrating an erase operation on upper select transistors of a semiconductor device according to an embodiment of the present inventive concept.

Next, an example of the operation (S10) of setting the upper select transistors S_T1a, S_T1b, S_T1c, S_T2a, S_T2b, S_T2c, S_T3a, S_T3b, and S_T3c of the strings S01, S02, S03, S11, S12, and S13 to have the first threshold voltage (e.g., Vth_S1 in FIG. 7 or E1 in FIG. 8) by perform the erase operation described above with reference to FIG. 12 will be described with reference to FIG. 13. FIG. 13 is a schematic view illustrating an erase operation performed on upper select transistors of a semiconductor device according to an embodiment of the present inventive concept.

Referring to FIG. 13, an erase operation may be performed on at least the upper select transistors S_T1a, S_T1b, S_T1c, S_T2a, S_T2b, S_T2c, S_T3a, S_T3b, and S_T3c. For example, in order to perform an erase operation to cause electrons trapped in the charge trap layer 43b of the upper select transistors S_T1a, S_T1b, S_T1c, S_T2a, S_T2b, S_T2c, S_T3a, S_T3b, and S_T3c to escape into the channel layer 45, an erase voltage Vers may be applied into the channel layer 45 of the upper select transistors S_T1a, S_T1b, S_T1c, S_T2a, S_T2b, S_T2c, S_T3a, S_T3b, and S_T3c, and 0 V may be applied to the first to third upper select gate electrodes SSL1, SSL2, and SSL3.

In an example embodiment, in order to apply the erase voltage Vers to the channel layer 45 of the upper select transistors S_T1a, S_T1b, S_T1c, S_T2a, S_T2b, S_T2c, S_T3a, S_T3b, and S_T3c, the erase voltage Vers may be applied to the common source CSL and the bit lines BL0 and BL1.

A voltage V detect may be applied to the upper common select gate electrode SSL_C, the lower common select gate electrode GSL_C, and the lower select gate electrodes L_S of the common upper select transistor SC_T, the common lower select transistor GC_T and the lower select transistors PS_T so that an erase operation may not occur on the common upper select transistor SC_T, the common lower select transistor GC_T, and the lower select transistors PS_T and the erase voltage Vers may be transferred to the channel layer 45 of the upper select transistors S_T1a, S_T1b, S_T1c, S_T2a, S_T2b, S_T2c, S_T3a, S_T3b, and S_T3c. The voltage V detect may be greater than 0 V and less than the erase voltage Vers.

In an example embodiment, the threshold voltage of the common upper select transistor SC_T may be greater than 0 V.

In an example embodiment, while performing an erase operation on the upper select transistors S_T1a, S_T1b, S_T1c, S_T2a, S_T2b, S_T2c, S_T3a, S_T3b, and S_T3c, an erase operation may be simultaneously performed on the memory cell transistors MC_T and the dummy transistors D_Td and D_Tu. In this case, 0 V may be applied to the dummy word lines dummy WL and the word lines WL.

Figure 14:
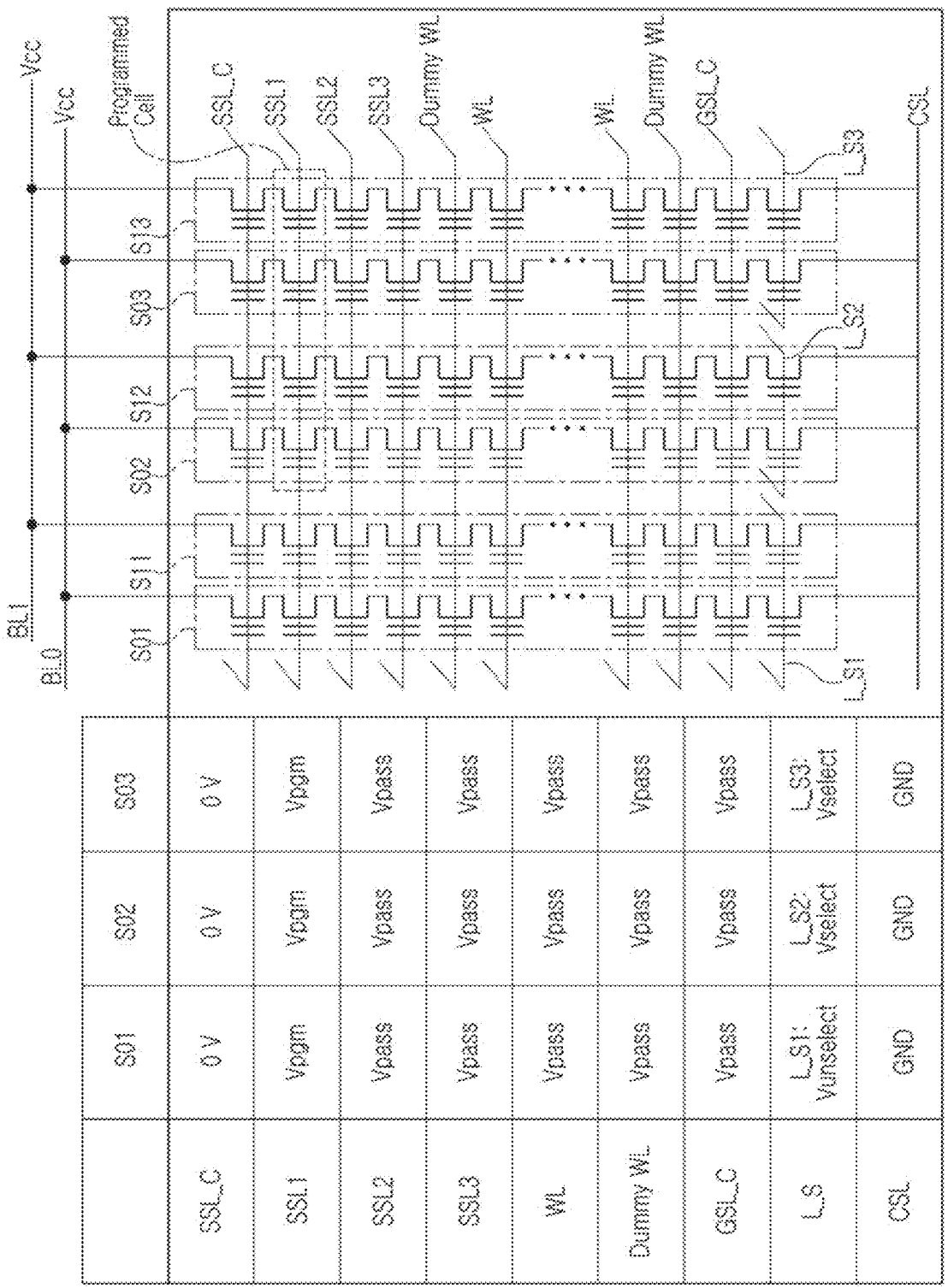
FIGS. 14 to 16 are schematic views illustrating a programming operation for upper select transistors of a semiconductor device according to an embodiment of the present inventive concept.
Figure 15:
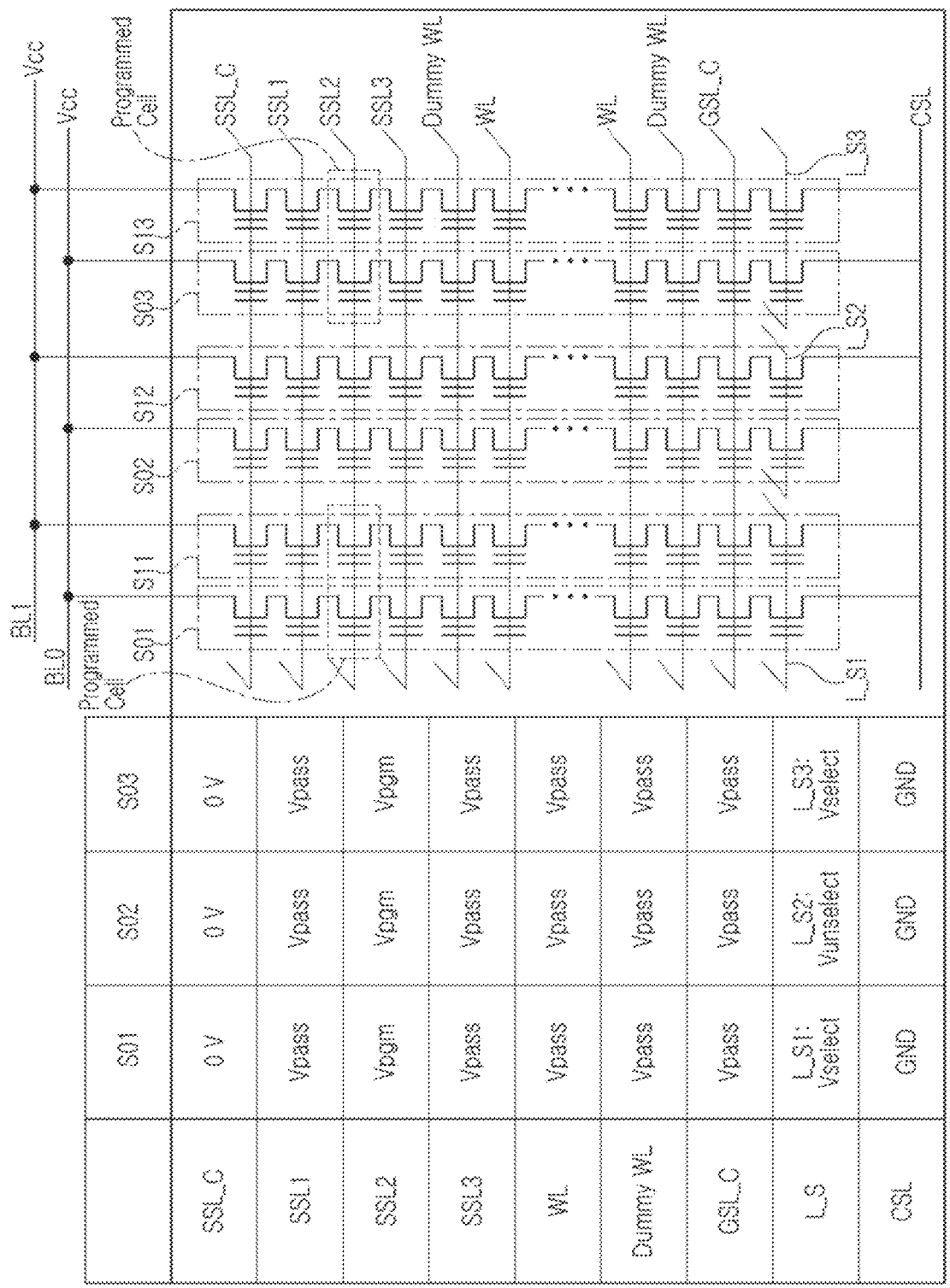
Figure 16:
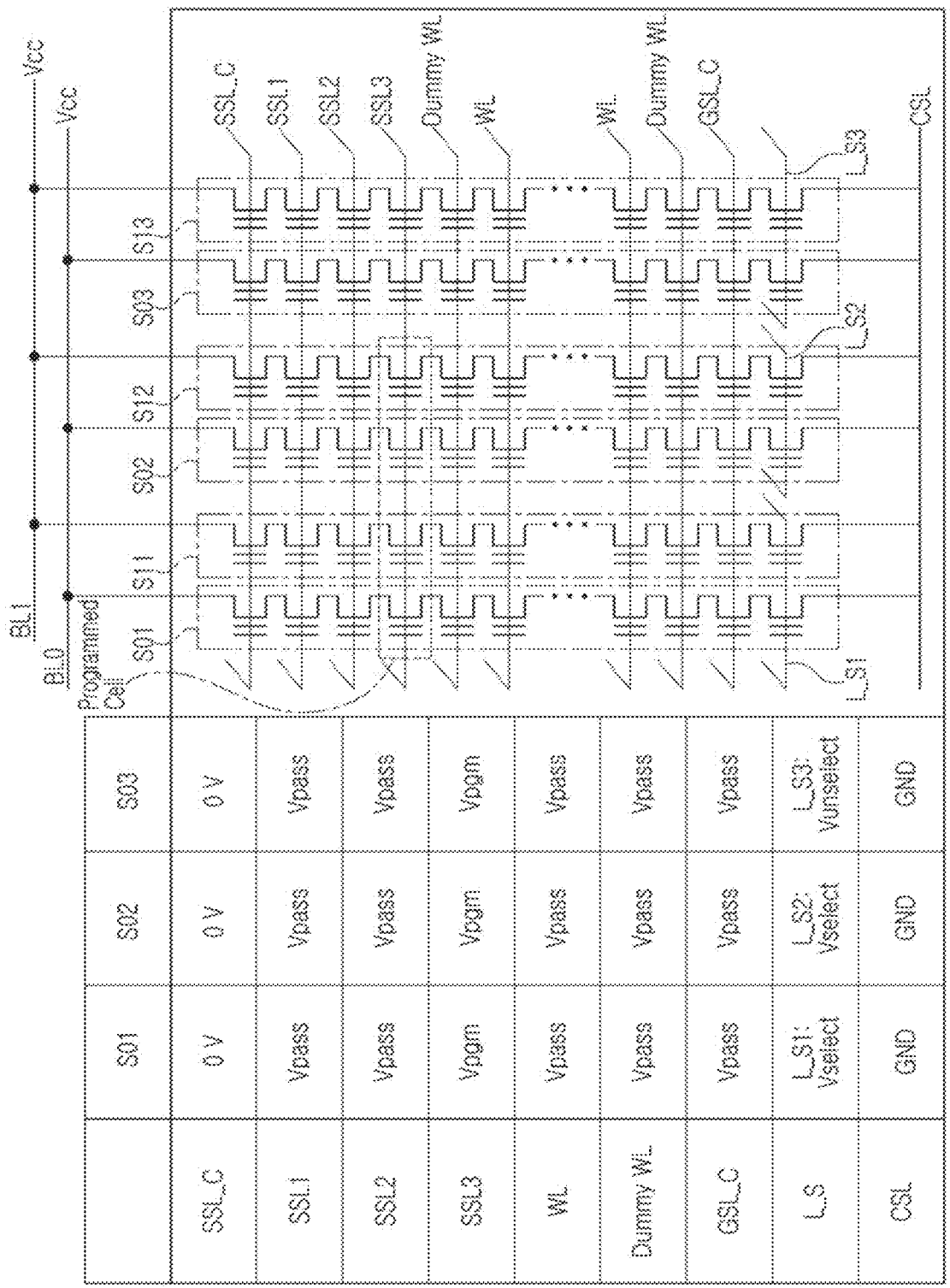

Next, a programming operation for upper select transistors of a semiconductor device according to an embodiment of the present inventive concept will be described with reference to FIGS. 14 to 16. FIGS. 14 to 16 are schematic views illustrating a programming operation on upper select transistors of a semiconductor device according to an embodiment of the present inventive concept.

First, an example of the operation (S20) of setting the first upper select transistors S_T1b and S_T1c of the second, third, fifth, and sixth memory cell strings S02, S03, S12, and S13 among the strings S01, S02, S03, S1, S12, and S13 to have the second threshold voltage (e.g., Vth_S2 of FIG. 7A and P1 of FIG. 8) by performing the first programming operation described above with reference to FIG. 12 will be described with reference to FIG. 14. Referring to FIG. 14, an example of the operation (S20) of setting the first upper select transistors S_T1b and S_T1c of the second, third, fifth, and sixth memory cell strings S02, S03, S12, and S13 among the strings S01, S02, S03, S11, S12, and S13 to have the second threshold voltage (e.g., Vth_S2 of FIG. 7A and P1 of FIG. 8) by performing the first programming operation described above with reference to FIG. 10 may include applying a source voltage VCC to the bit lines BL, applying 0 V to the upper common select gate electrode SSL_C, applying a pass voltage Vpass to the second and third upper select gate electrodes SSL2 and SSL3, the dummy word line Dummy WL, the word lines WL, and the lower common select gate electrode GSL_C, applying a ground voltage GND to the common source CSL, applying a unselect voltage Vunselect to the first lower select gate electrode L_S1, applying a select voltage Vselect to the second and third lower select gate electrodes L_S2 and L_S3, and applying a program voltage Vpgm to the first upper select gate electrode SSL1. Here, the lower select transistors (e.g., PS_T of FIG. 5) including the first to third lower select gate electrodes L_S1, L_S2 and L_S3 may have the same threshold voltage, and the first lower select gate electrode L_S1, and the lower select transistor PS_T including the first lower select gate electrode L_S1 may be turned off when the unselect voltage Vunselect is applied to the first lower select gate electrodes L_S1, and the lower select transistors PS_T including the second and third lower select gate electrodes L_S2 and L_S3 may be turned on when the select voltage Vselect is applied to the second and third lower select gate electrodes L_S2 and L_S3. Here, the unselected voltage Vunselect applied to the first lower select gate electrode L_S1 may be lower than the threshold voltage of the lower select transistor PS_T, and the select voltage Vselect applied to the second and third lower select gate electrodes L_S2 and L_S3 may be higher than the threshold voltage of the lower select transistor PS_T. By applying the voltages in this manner, electrons are trapped in the charge trap layer 43b of the first upper select transistors S_T1b and S_T1c of the second, third, fifth, and sixth memory cell strings S02, S03, S12, and S13 among the strings S01, S02, S03, S11, S12, and S13 so that the first upper select transistors S_T1b and S_T1c of the second, third, fifth and sixth memory cell strings S02, S03, S12, and S13 may be programmed to have the second threshold voltage (e.g., Vth_S2 of FIG. 7A and P1 of FIG. 8).

Referring to FIG. 15, an example of the operation (S30) of setting the second upper select transistors S_T2a and S_T2c of the first, third, fourth, and sixth memory cell strings S01, S03, S11, and S13 among the strings S01, S02, S03, S11, S12, and S13 to have the third threshold voltage (e.g., Vth_S2 of FIG. 7 and P2 of FIG. 8) by performing the second programming operation described above with reference to FIG. 12 will be described with reference to FIG. 15. Referring to FIG. 15, an example of the operation (S30) of setting the second upper select transistors S_T2a and S_T2c of the first, third, fourth, and sixth memory cell strings S01, S03, S11, and S13 among the strings S01, S02, S03, S11, S12, and S13 to have the third threshold voltage (e.g., Vth_S2 of FIG. 7 and P2 of FIG. 8) by performing the second programming operation described above with reference to FIG. 10 may include applying the source voltage VCC to the bit lines BL0 and BL1, applying 0 V to the upper common select gate electrode SSL_C, applying the pass voltage Vpass to the first and third upper select gate electrodes SSL1 and SSL3, the dummy word line Dummy WL, the word lines WL, and the lower common select gate electrode GSL_C, applying the ground voltage GND to the common source CSL, applying the unselect voltage Vunselect to the second lower select gate electrode L_S2, applying the select voltage Vselect to the first and third lower select gate electrodes L_S1 and L_S3, and applying the program voltage Vpgm to the second upper select gate electrode SSL2. By applying the voltages in this manner, electrons may be trapped in the charge trap layer 43b of the second upper select transistors S_T2a and S_T2c of the first, third, fourth, and sixth memory cell strings S01, S03, S11, and S13 among the strings S01, S02, S03, S11, S12, and S13, so as to be programmed.

Referring to FIG. 16, the first, second, fourth, and fifth memories among the strings S01, S02, S03, S11, S12, and S13 may be programmed by performing the third programming operation described with reference to FIG. 12. An example of the third programming operation (S40) of setting the third upper select transistors S_T3a and S_T3b of the cell strings S01, S02, S11, and S12 to the fourth threshold voltage (e.g., Vth_S2 in FIG. 7 or P3 in FIG. 8) will be described with reference to FIG. 16. Referring to FIG. 16, an example of the operation (S40) of setting the third upper select transistors S_T3a and S_T3b of the first, second, fourth, and fifth memory cell strings S01, S02, S11, and S12 among the strings S01, S02, S03, S11, S12, and S13 to have the fourth threshold voltage (e.g., Vth_S2 of FIG. 7 and P3 of FIG. 8) by performing the third programming operation described above with reference to FIG. 12. Referring to FIG. 16, an example of the third programming operation (S40) may include applying the source voltage VCC to the bit lines BL, applying 0 V to the upper common select gate electrode SSL_C, applying the pass voltage Vpass to the first and second upper select gate electrodes SSL1 and SSL2, the dummy word line Dummy WL, the word lines WL, and the lower common select gate electrode GSL_C, applying the ground voltage GND to the common source CSL, applying the unselect voltage Vunselect to the third lower select gate electrode L_S3, applying the select voltage Vselect to the first and second lower select gate electrodes L_S1 and L_S2, and applying the program voltage Vpgm to the third upper select gate electrode SSL3. By applying the voltages in this manner, electrons may be trapped in the charge trap layer 43b of the third upper select transistors S_T3a and S_T3b of the first, second, fourth, and fifth memory cell strings S01, S02, S11, and S12, so as to be programmed.

Figure 17:
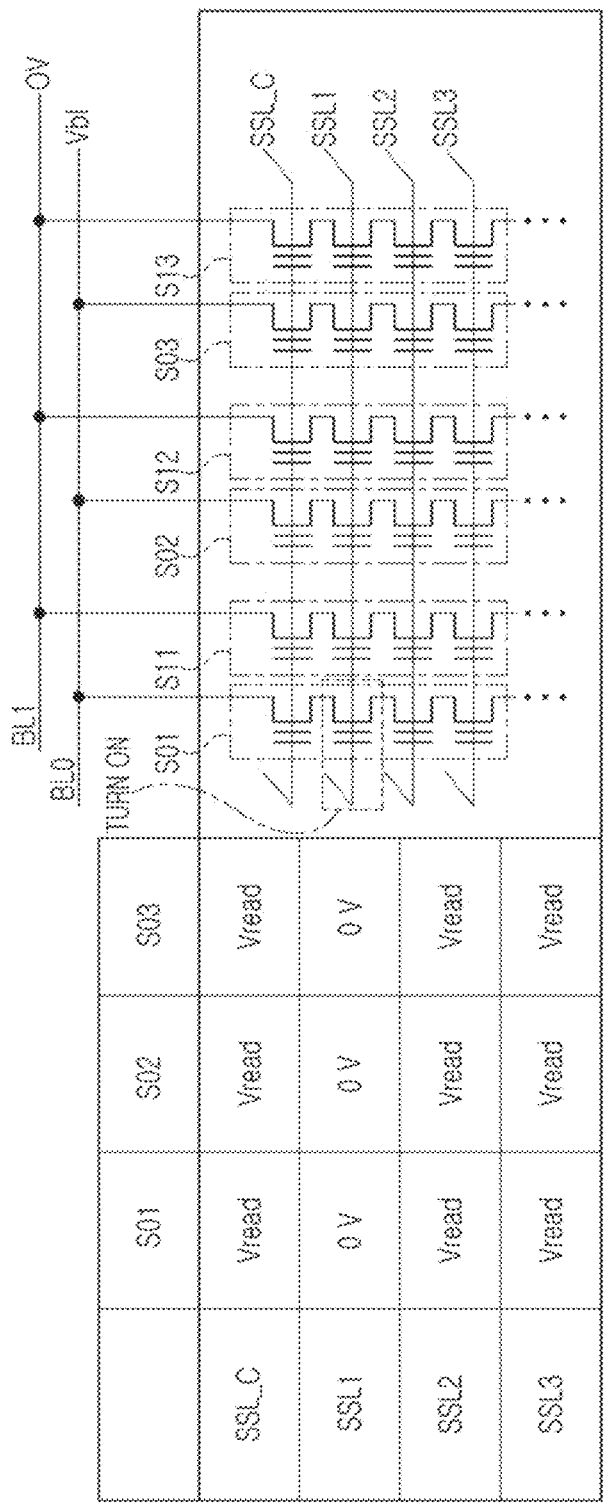
FIG. 17 is a schematic view illustrating operations on upper select transistors in a read operation for memory cell transistors of a semiconductor device according to an embodiment of the present inventive concept.

Next, an example embodiment of a method of selecting the upper select transistors of a desired string in case of a read operation on information stored in the memory cell transistors MC_T of the block BLK in a semiconductor device according to an embodiment of the present inventive concept will be described. FIG. 17 is a schematic view illustrating an operation of upper select transistors in a read operation on memory cell transistors of a semiconductor device according to an example embodiment of the present inventive concept.

Referring to FIG. 17, a bit line voltage Vb1 may be applied to a bit line electrically connected to strings on which a read operation is desired, e.g., an even-numbered bit line BL0, among the bit lines BL, 0 V may be applied to a bit line electrically connected to the strings for which a read operation is not desired, e.g., an odd-numbered bit line BL1, 0 V may be applied to the common source CSL, 0 V may be applied to a select gate electrode having a select transistor to be turned on among the first to third upper select gate electrodes SSL1, SSL2, and SSL3, a read pass voltage Vread may be applied to the remaining select gate electrodes, and a voltage for reading information stored in the memory cell transistors MC_T may be applied to the word lines WL. Here, among the select transistors sharing the select gate electrode to which 0 V is applied, the select transistor having the first threshold voltage Vth_S1 described above with reference to FIGS. 5, 6, and 7 may be turned on (ON-state) and the select transistor having the second threshold voltage Vth_S2 may be turned off (OFF-state). The read pass voltage Vread may be applied to the lower common select gate electrode GSL_C and the lower select gate electrodes L_S.

Figure 18:
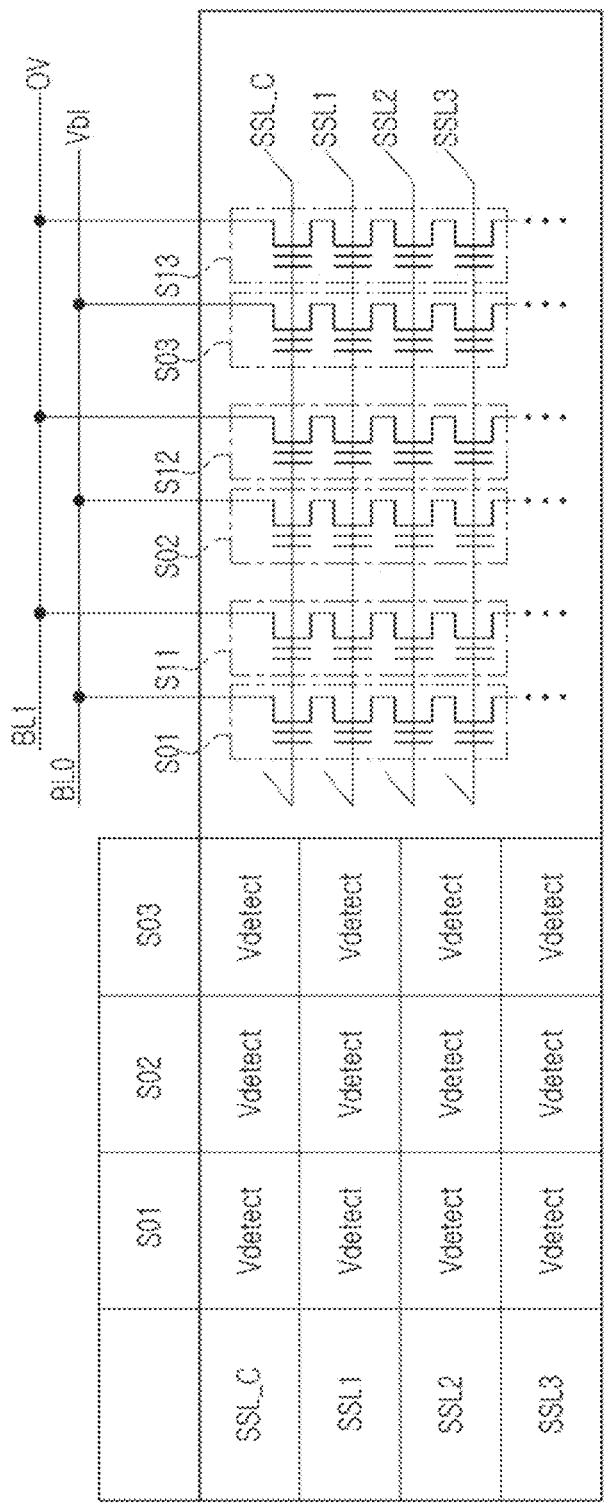
FIG. 18 is a schematic view illustrating an operation on upper select transistors in an erase operation for memory cell transistors of a semiconductor device according to an embodiment of the present inventive concept.

Next, the upper select transistors described above during the erase operation of the block BLK in the semiconductor device according to an embodiment of the present inventive concept will be described with reference to FIG. 18. FIG. 18 is a schematic view illustrating an operation of upper select transistors in an erase operation of memory cell transistors of a semiconductor device according to an embodiment of the present inventive concept.

Referring to FIG. 18, an erase operation for the memory cell transistors MC_T may include an operation in which the electrons trapped in the charge trap layer 43b of the memory cell transistors MC_T escape into the channel layer 45 of the memory cell transistors MC_T due to a F-N tunneling phenomenon occurring in a state in which 0 V is applied to the word lines WL of the memory cell transistors MC_T and an erase voltage is applied to the channel layer 45 of the memory cell transistors MC_T. During the erase operation of the memory cell transistors MC_T, the voltage Vdetect may be applied to the first to third upper select gate electrodes SSL1, SSL2, and SSL3, the upper common select gate electrode SSL_C, the lower common select gate electrode GSL_C, and the lower select gate electrodes L_S so that an erase operation may not be performed on the upper select transistors S_T1a, S_T1b, S_T1c, S_T2a, S_T2b, S_T2c, S_T3a, S_T3b, and S_T3c, the common upper select transistor SC_T, the common lower select transistor GC_T, and the lower select transistors PS_T. The voltage Vdetect may be greater than 0 V and less than the erase voltage Vers.

Figure 19:
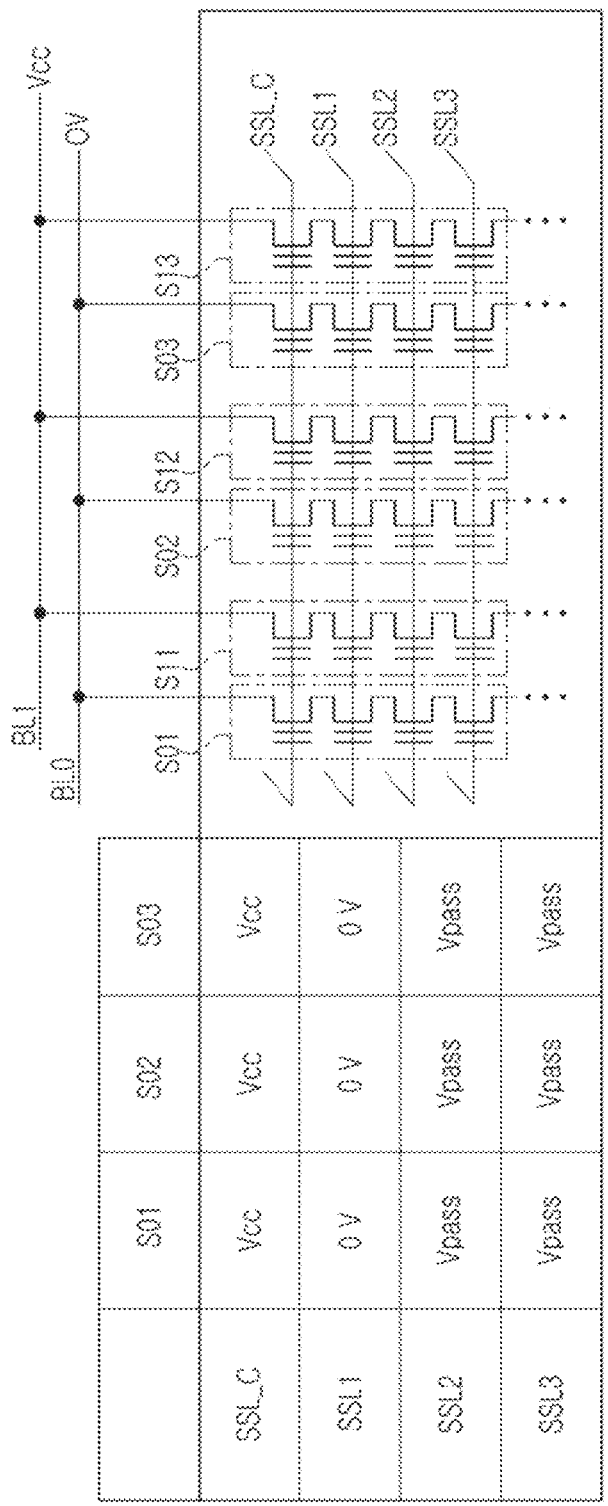
FIG. 19 is a schematic view illustrating an operation on upper select transistors in a programming operation for memory cell transistors of a semiconductor device according to an embodiment of the present inventive concept.

Next, the upper select transistors described above during the programming operation of the block BLK in the semiconductor device according to an embodiment of the present inventive concept will be described with reference to FIG. 19. FIG. 19 is a schematic view illustrating an operation of upper select transistors in a programming operation for memory cell transistors of a semiconductor device according to an embodiment of the present inventive concept.

Referring to FIG. 19, in order to program a memory cell of a desired memory cell transistor of a desired string among the memory cell transistors MC_T, a program voltage may be applied to a selected word line. In this case, 0 V may be applied to a bit line (e.g., BL0) electrically connected to a string including a memory cell to be programmed, a source voltage VCC may be applied to another bit line (e.g., BL1), a ground voltage may be applied to the common source CSL, the source voltage VCC may be applied to the upper common select gate electrode SSL_C, 0 V may be applied to an upper select gate electrode included in the upper select transistor having the first threshold voltage Vth_S1 in the string, and the pass voltage Vpass may be applied to the remaining upper select gate electrodes. Here, in the upper select transistor having the first threshold voltage Vth_S1 and the upper transistor having the second threshold voltage Vth_S2 sharing the upper select gate electrode to which 0 V is applied, the upper select transistor having the first threshold voltage Vth_S1 may be turned on and the upper transistor having the second threshold voltage Vth_S2 may be turned off.

Figure 20:
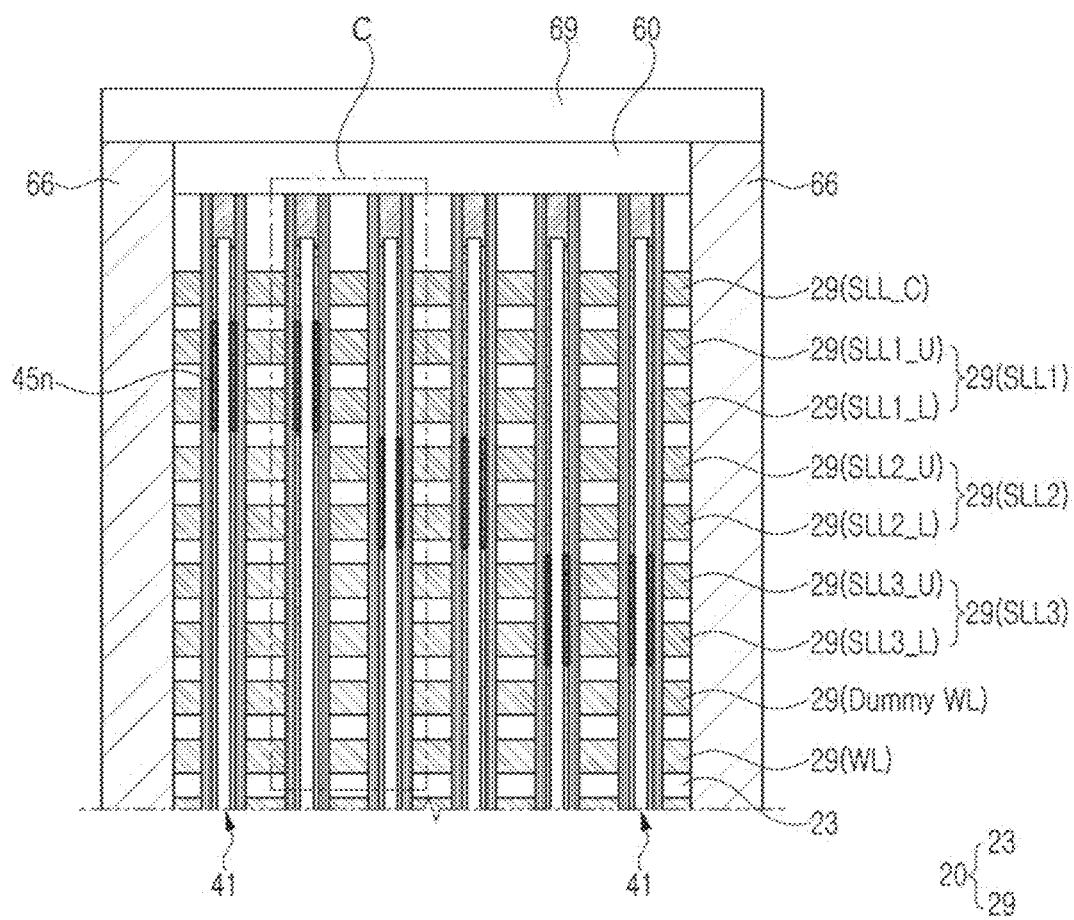
FIGS. 20 and 21 are schematic partially enlarged cross-sectional views illustrating a modified embodiment of a semiconductor device according to an embodiment of the present inventive concept.

Next, a modified embodiment of a semiconductor device according to an embodiment of the present inventive concept will be described with reference to FIGS. 20 and 21. FIG. 20 is a schematic partially enlarged cross-sectional view illustrating a modified embodiment of a semiconductor device according to an embodiment of the present inventive concept, and FIG. 21 is an partially enlarged view of a portion indicated by 'C' of FIG. 20.

Figure 21:
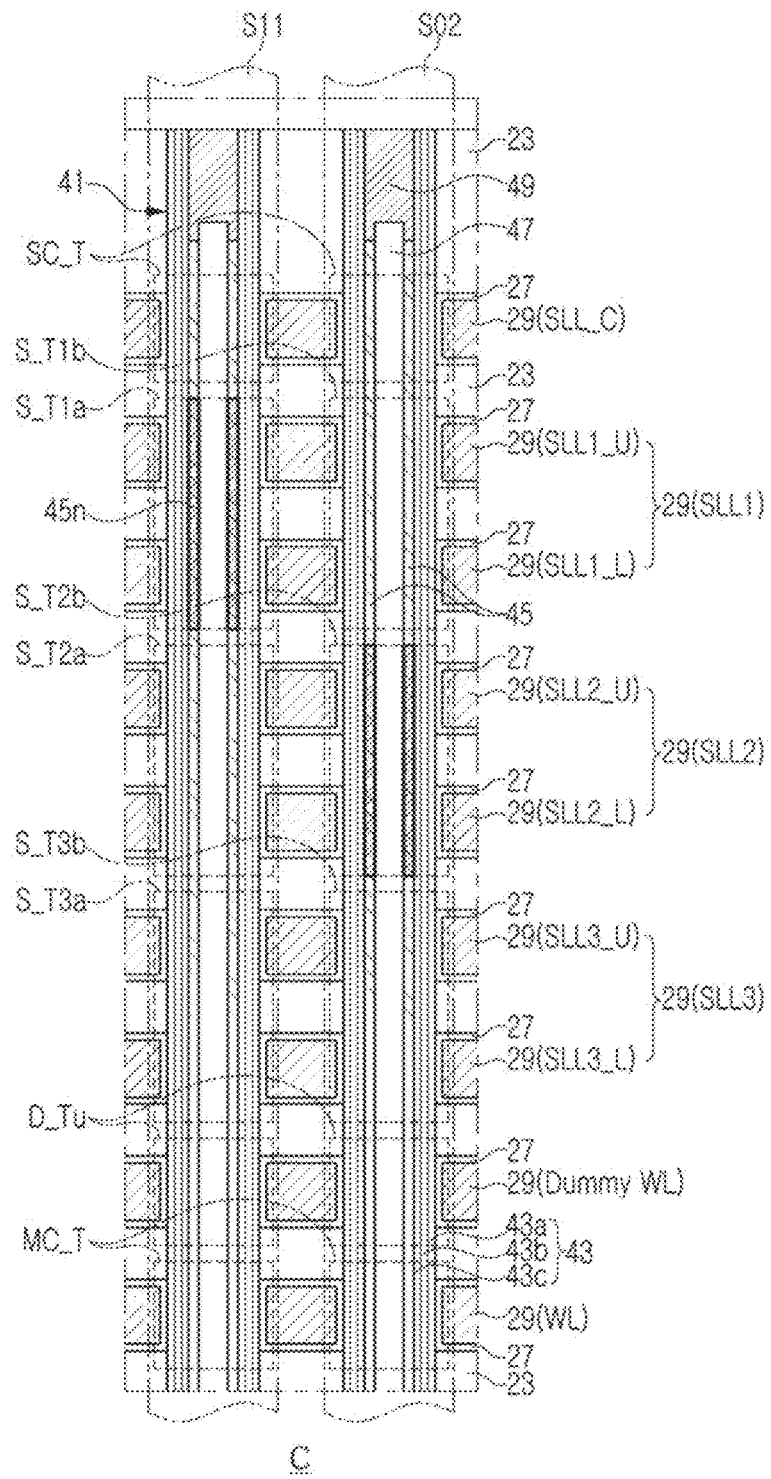

Referring to FIGS. 20 and 21, the first upper select gate electrode SSL1 may include two first upper select gate electrodes SSL1_L and SSL1_U spaced apart from each other in the vertical direction, the second upper select gate electrode SSL2 may include two second upper select gate electrodes SSL2_L and SSL2_U spaced apart from each other in the vertical direction, and the third upper select gate electrode SSL3 may include two third upper select gate electrodes SSL3_L and SSL3_U spaced apart from each other in the vertical direction. For example, each of the first upper select transistors S_T1a and S_T1b may include two first upper select gate electrodes SSL1_L and SSL1_U, each of the second upper select transistors S_T2a and S_T2b may include two second upper select gate electrodes SSL2_L and SSL2_U, and each of the third upper select transistors S_T3a and S_T3b may include two third upper select gate electrodes SSL3_L and SSL3_U.

Figure 22:
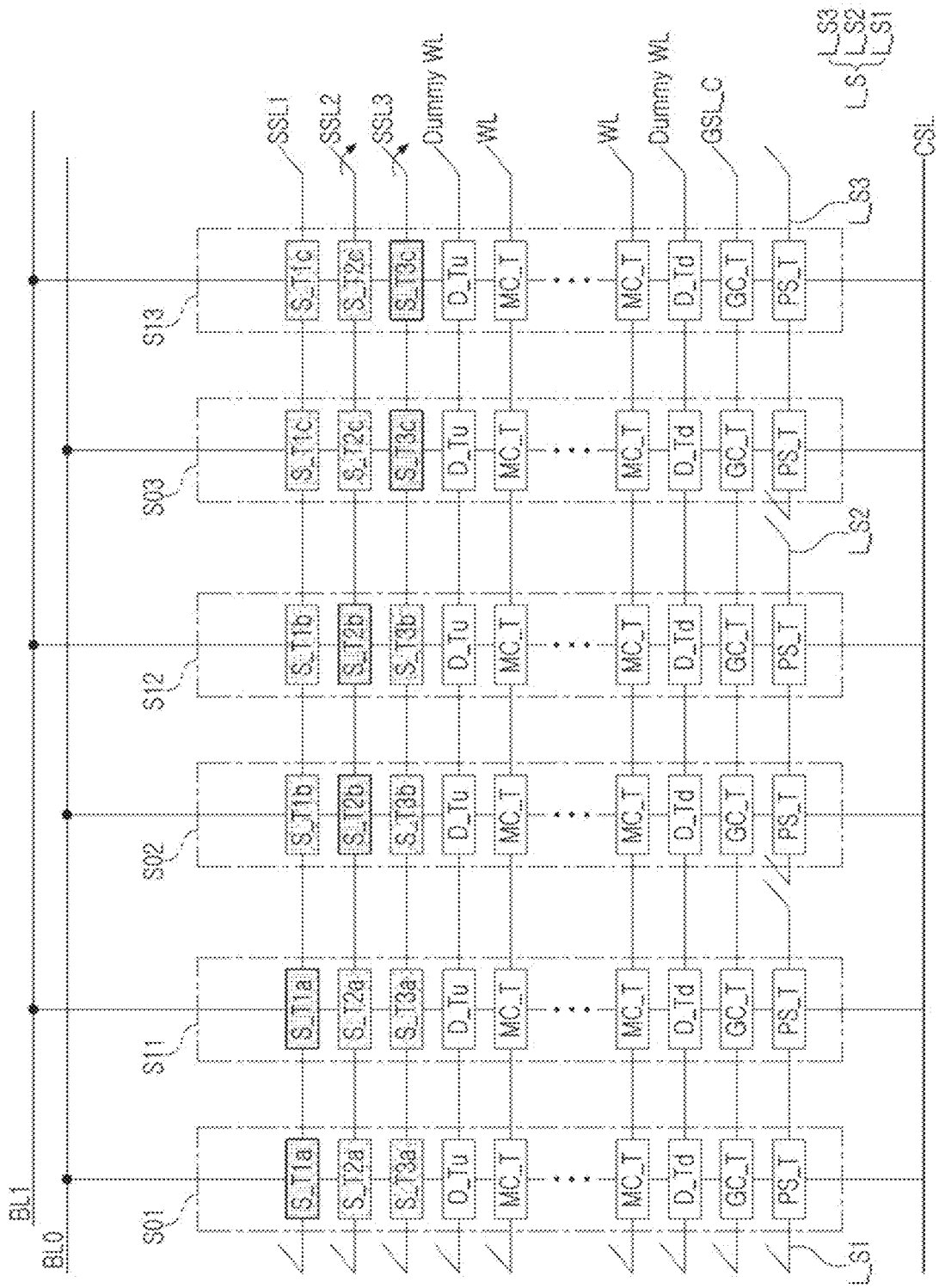
FIG. 22 is a schematic view illustrating a circuit of a modified embodiment of a semiconductor device according to an embodiment of the present inventive concept.

A modified embodiment of a semiconductor device according to an embodiment of the present inventive concept will be described with reference to FIG. 22. FIG. 22 is a schematic view illustrating a circuit of a modified embodiment of a semiconductor device according to an embodiment of the present inventive concept.

Referring to FIG. 22, in FIG. 5, the upper common select gate electrode SSL_C and the upper common select transistors SC_T may be omitted. In this case, the upper select transistors S_T1a, S_T2b, and S_T3c having the first threshold voltage Vth_S1 may be depletion mode transistors as described above with reference to FIG. 9.

A modified embodiment of a semiconductor device according to an embodiment of the present inventive concept will be described with reference to FIGS. 23 and 24.

Figure 23:
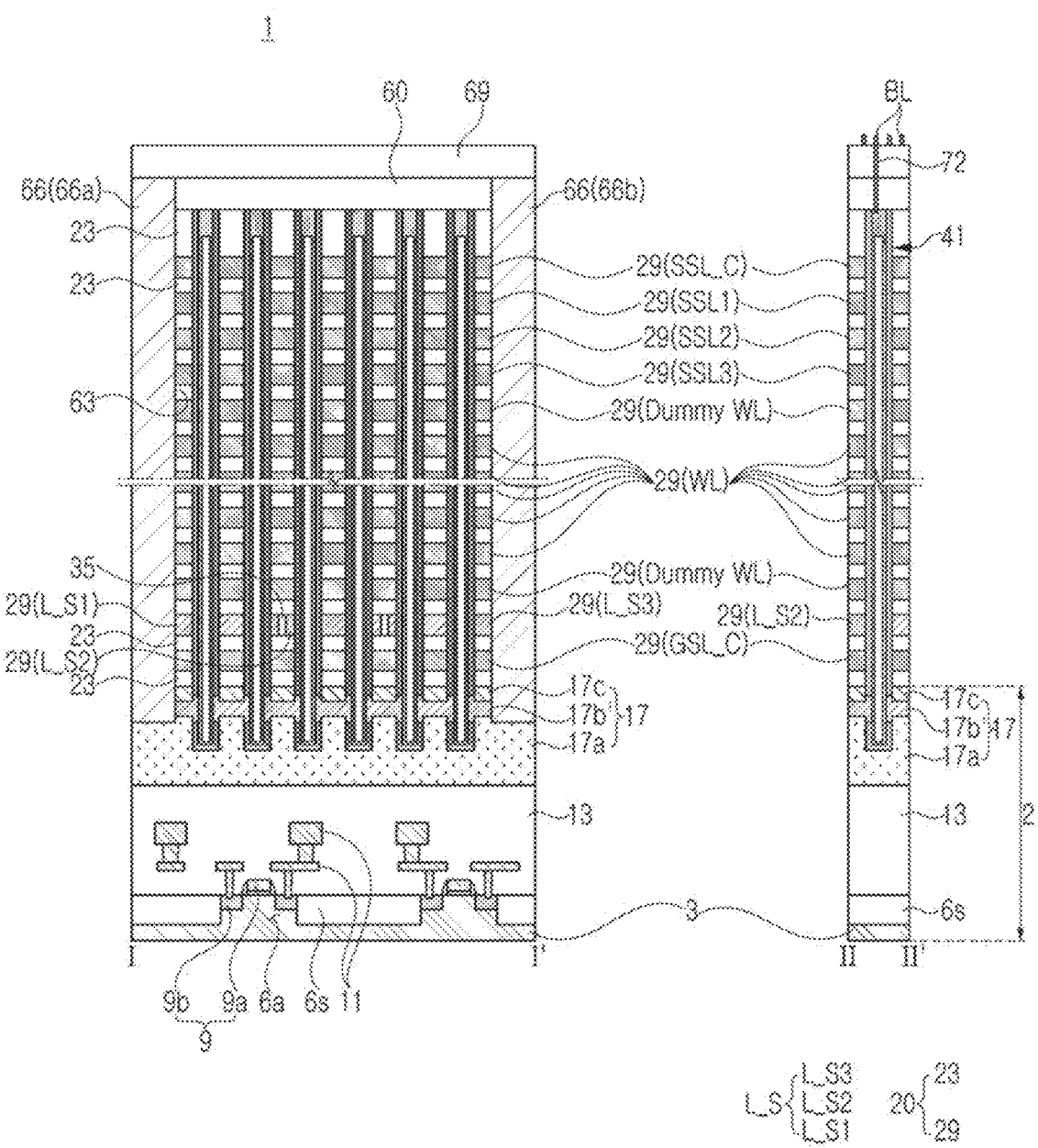
FIGS. 23 and 24 are schematic views illustrating a modified embodiment of a semiconductor device according to an embodiment of the present inventive concept.
Figure 24:
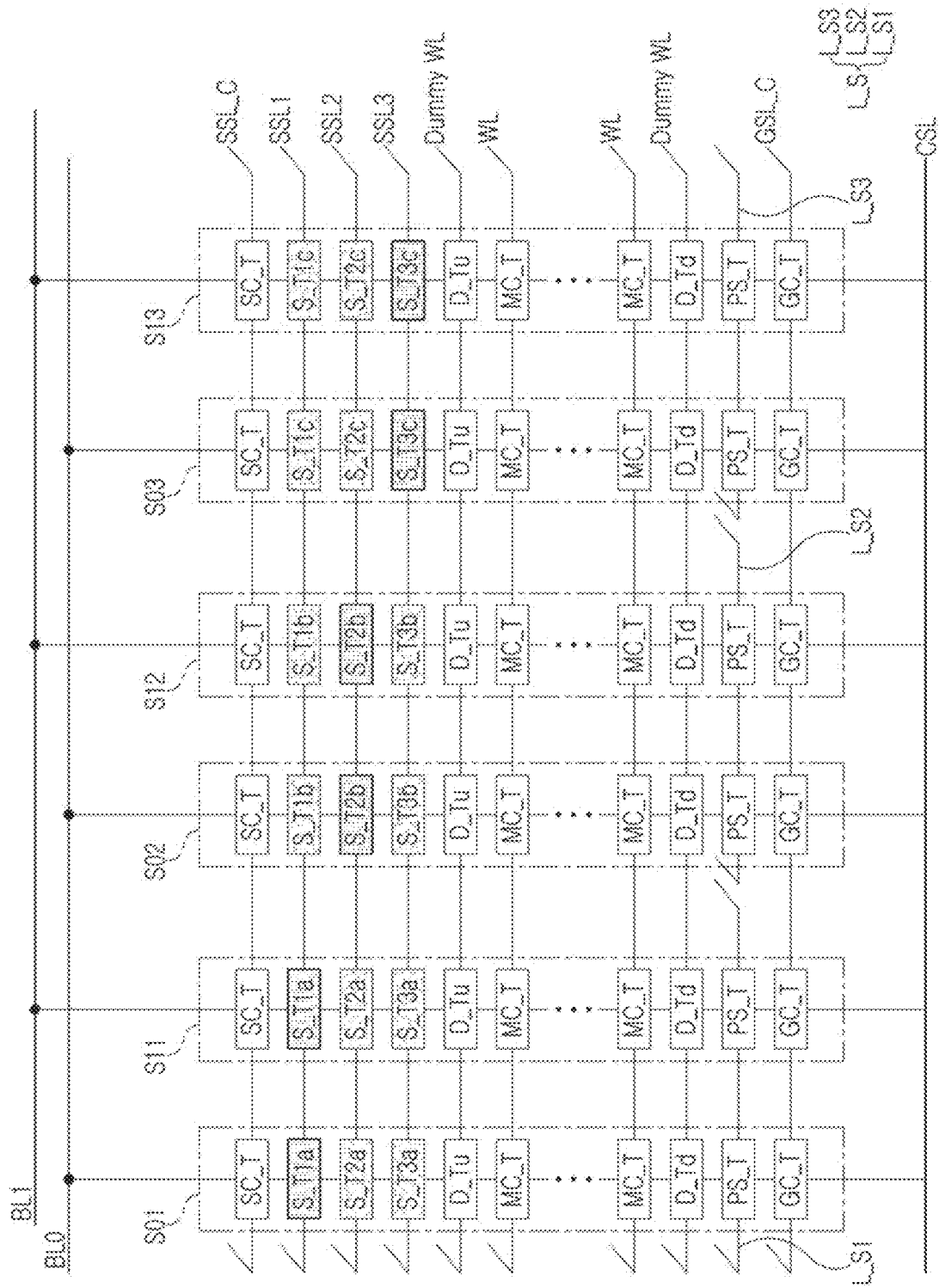

FIG. 23 is a schematic cross-sectional view illustrating a modified embodiment of a semiconductor device according to an embodiment of the present inventive concept, and FIG. 24 is a schematic view illustrating a circuit of a modified embodiment of a semiconductor device according to an embodiment of the present inventive concept.

Referring to FIGS. 23 and 24, positions of the lower select gate electrodes L_S and the lower common select gate electrode GSL_C described with reference to FIGS. 1 to 6 may be interchanged. For example, the lower select gate electrodes L_S may be disposed on the lower common select gate electrode GSL_C. Accordingly, the lower select transistors PS_T may be disposed on the lower common select transistors GC_T.

Figure 25:
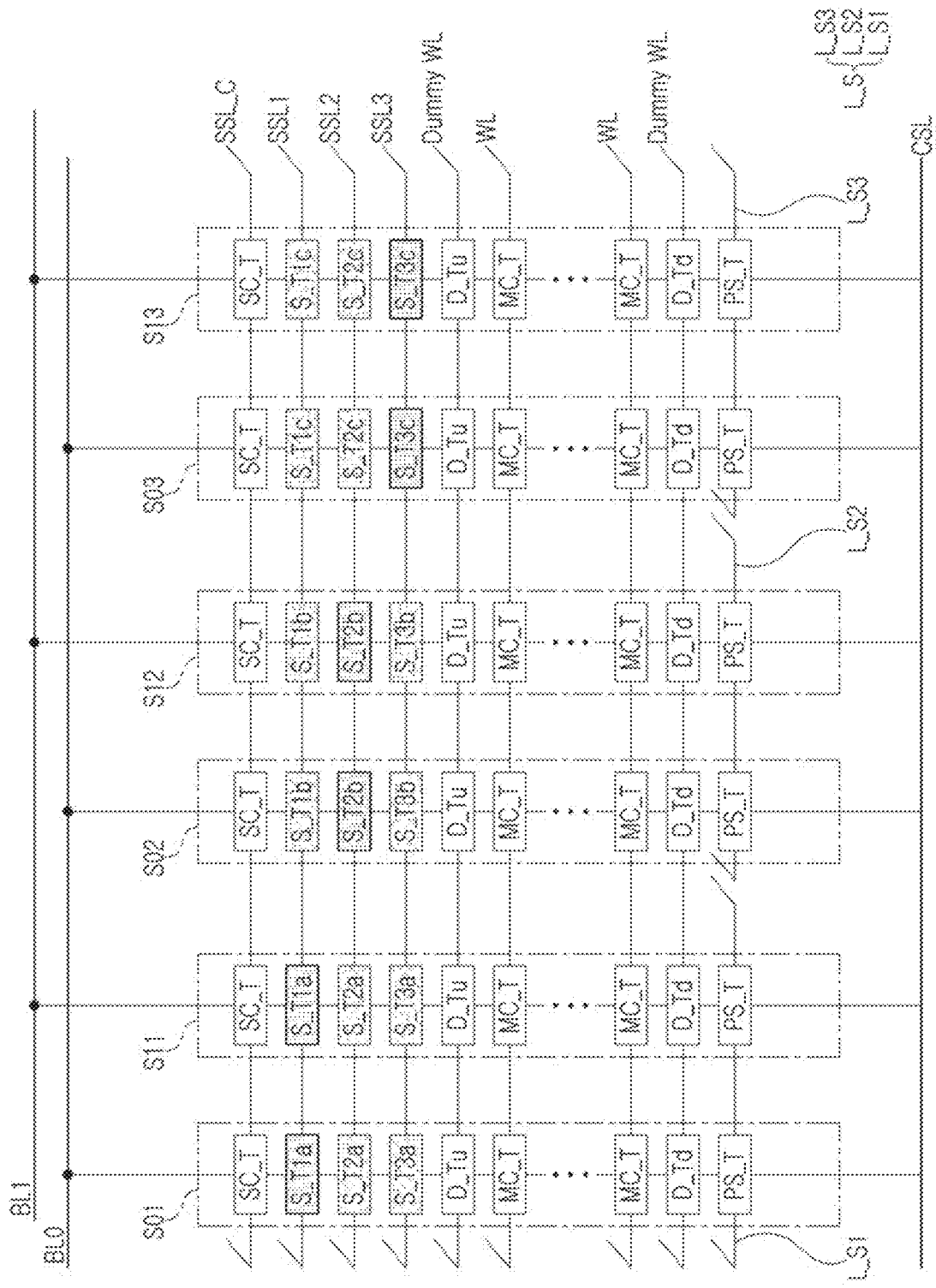
FIG. 25 is a schematic view illustrating a modified embodiment of a semiconductor device according to an embodiment of the present inventive concept.

A modified embodiment of a semiconductor device according to an embodiment of the present inventive concept will be described with reference to FIG. 25. FIG. 25 is a schematic view illustrating a circuit of a modified embodiment of a semiconductor device according to an embodiment of the present inventive concept.

Referring to FIG. 25, the lower common select gate electrode GSL_C described above with reference to FIGS. 1 to 6 may be omitted. Accordingly, the lower common select transistors GC_T may be omitted.

Figure 26:
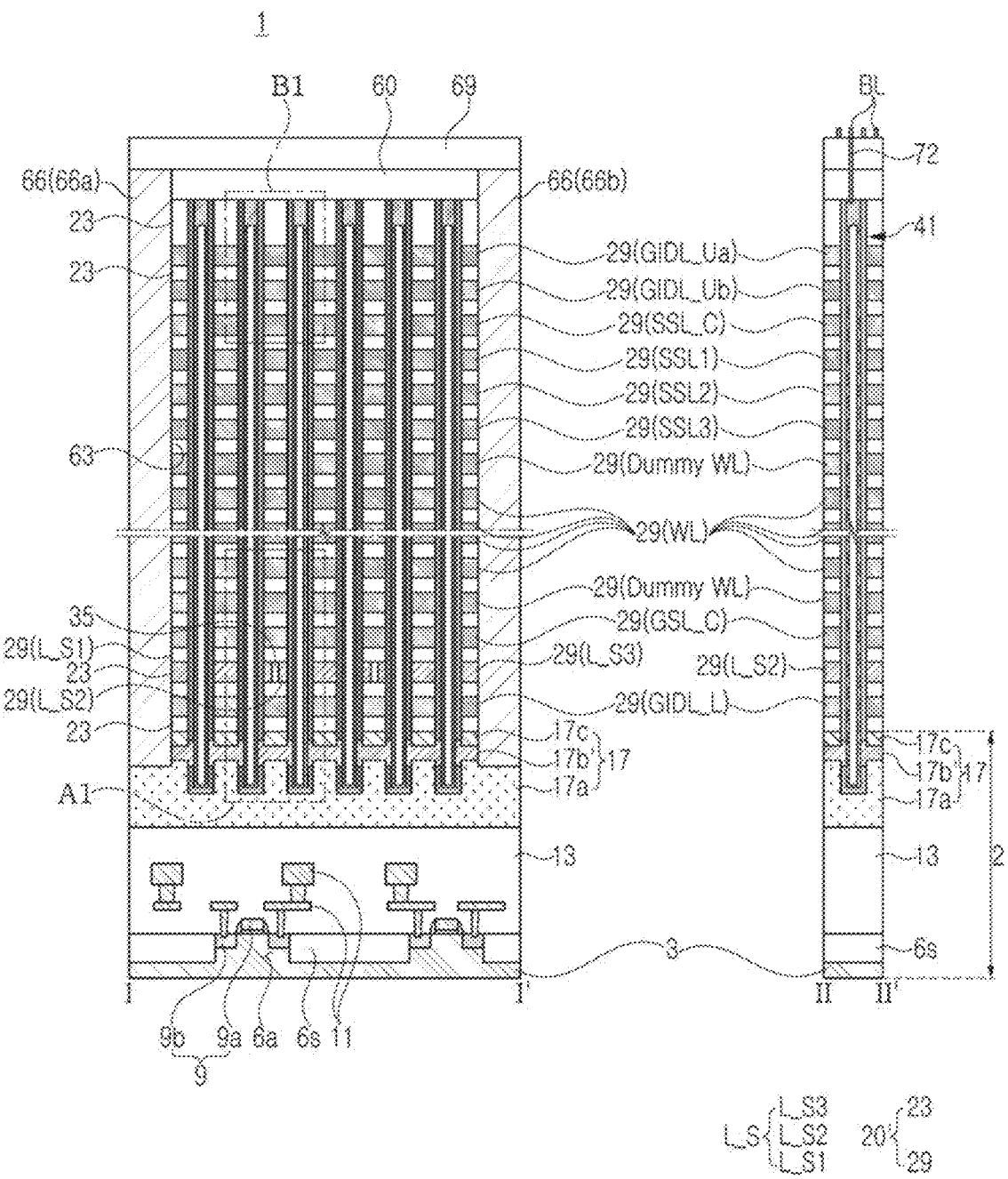
FIGS. 26, 27A, 27B, and 28 are schematic views illustrating a modified embodiment of a semiconductor device according to an embodiment of the present inventive concept.
Figure 27A:
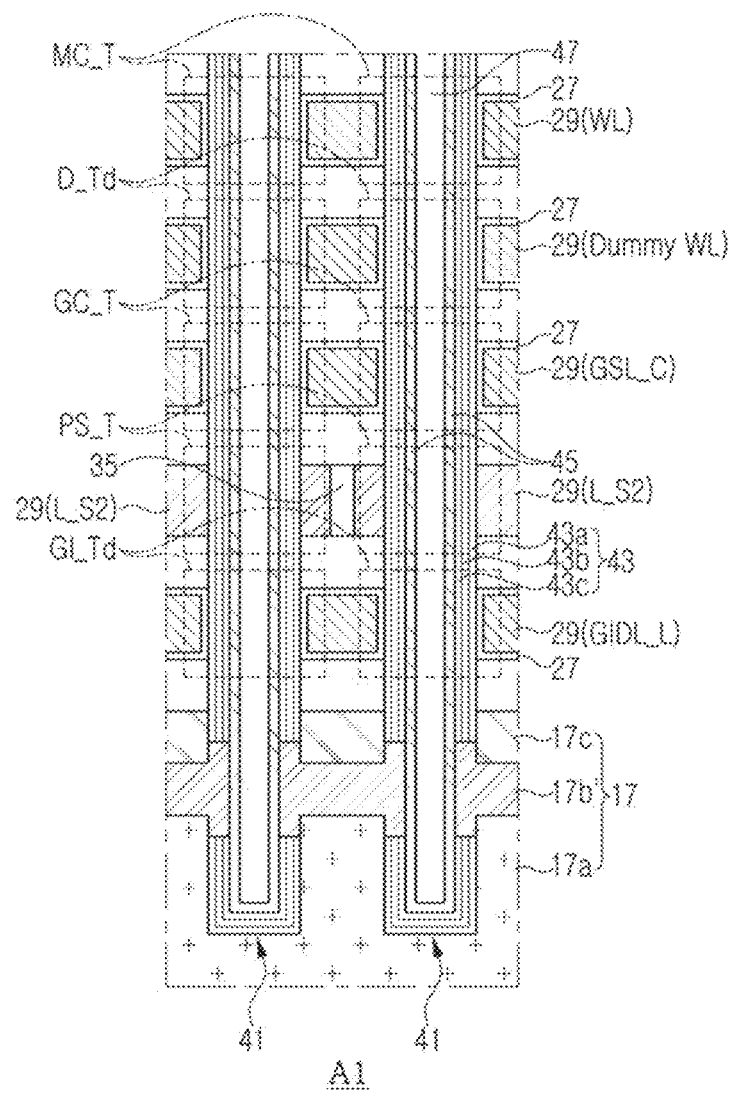
Figure 27B:
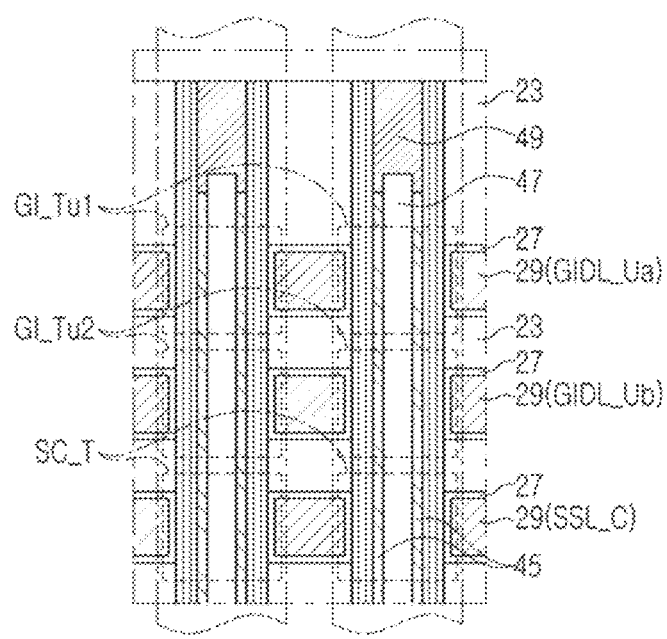
Figure 28:
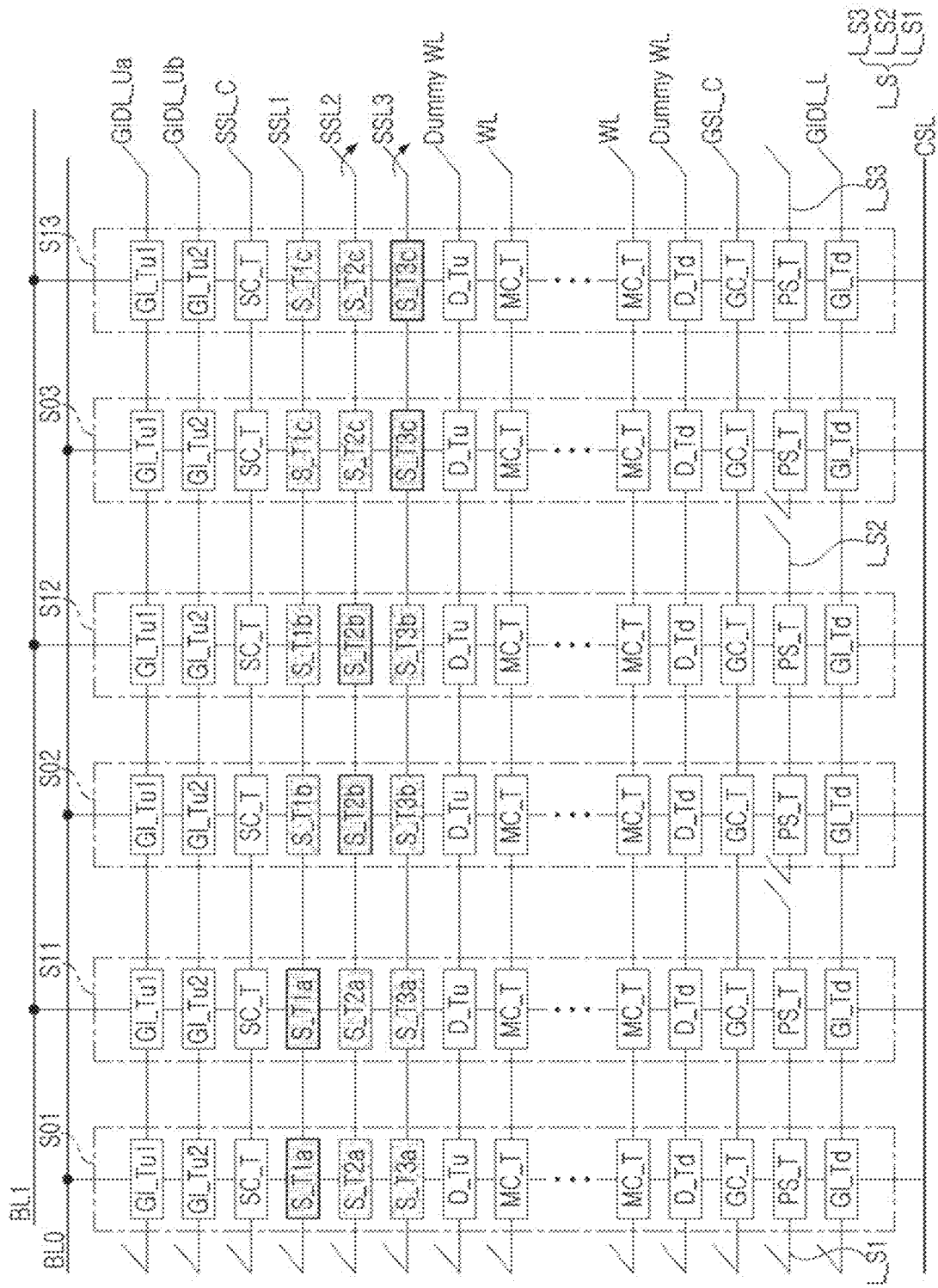

A modified embodiment of a semiconductor device according to an embodiment of the present inventive concept will be described with reference to FIGS. 26 to 28. In FIGS. 26 to 28, FIG. 26 is a cross-sectional view illustrating regions taken along line I-I' and II-II' of FIG. 1, FIGS. 27A and 27B are partially enlarged views illustrating regions indicated by "A1" and "B1" of FIG. 26, and FIG. 28 is a schematic view illustrating a circuit of a semiconductor device according to an embodiment of the present disclosure.

Referring to FIGS. 26 to 28, the gate electrodes 29 may further include upper erase gate electrodes GIDL_Ua and GIDL_Ub disposed on the upper common select gate electrode SSL_C and a lower erase gate electrode GIDL_L disposed between the lower select gate electrodes L_S and the patterned structure 17. Accordingly, the semiconductor device 1 according to an example embodiment may further include upper erase transistors GI_Tu1 and GI_Tu2 including the upper erase gate electrodes GIDL_Ua and GIDL_Ub and a lower erase transistor GI_Td including the lower erase gate electrode GIDL_L. The upper erase transistors GI_Tu1 and GI_Tu2 and the lower erase transistor GI_Td may be used to delete data stored in the memory cells of the memory cell transistors MC_T using a gate Induced drain leakage (GIDL) phenomenon.

Figure 29:
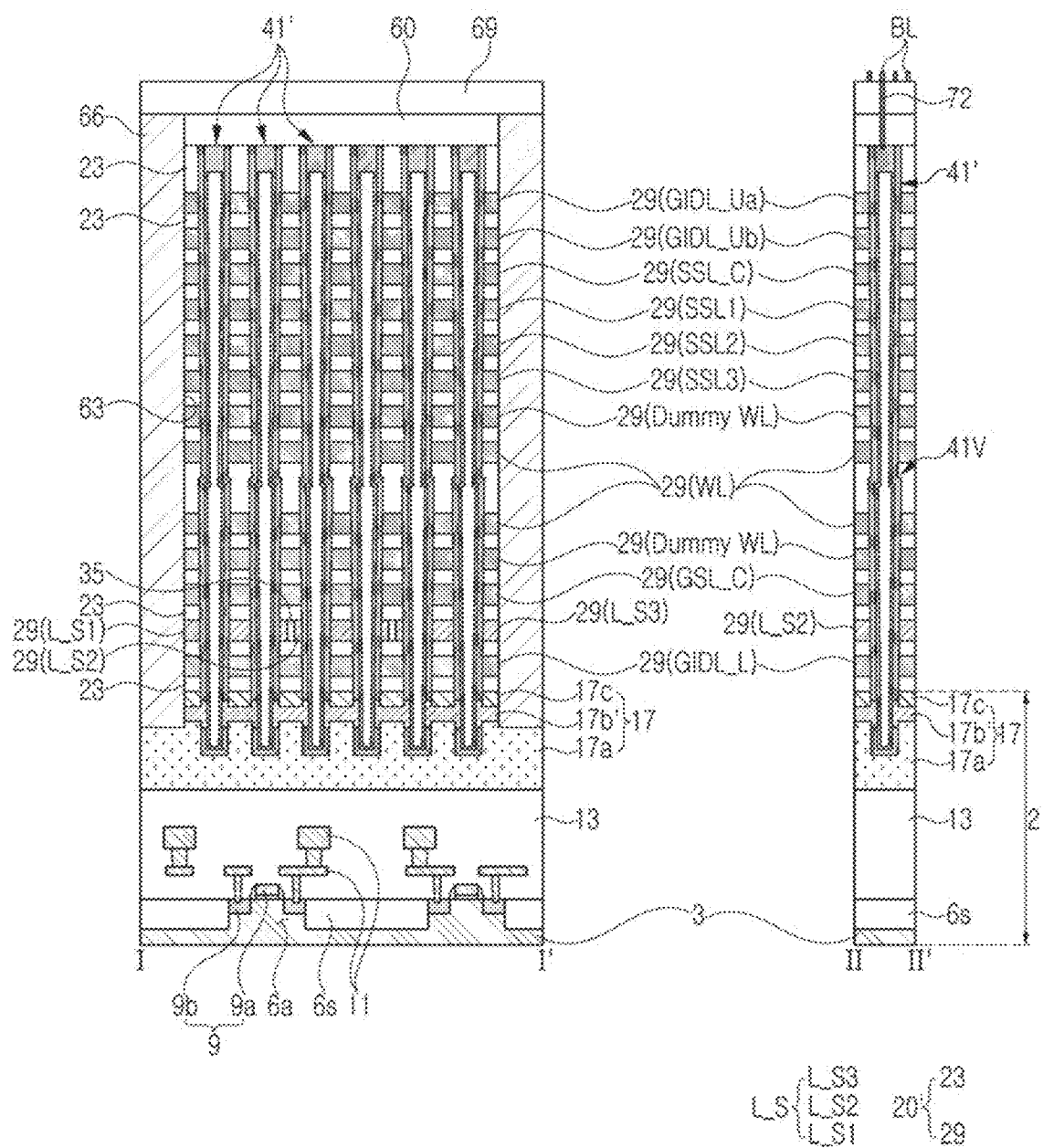
FIG. 29 is a schematic view illustrating a modified embodiment of a semiconductor device according to an embodiment of the present inventive concept.

A modified embodiment of a semiconductor device according to an embodiment of the present inventive concept will be described with reference to FIG. 29. FIG. 29 is a cross-sectional view illustrating a region taken along lines I-I' and II-II' of FIG. 1.

Referring to FIG. 29, the vertical structures 41 described above, e.g., each of the vertical structures 41 in FIG. 2, may be deformed into vertical structures 41' having a width change portion 41V in which a width is changed in a middle portion thereof. The width change portion 41V may also be referred to as a sidewall change portion. For example, in each of the vertical structures 41', an upper side surface may include a portion not aligned with a lower side surface based on the width change portion 41V. In each of the vertical structures 41', based on the width change portion 41V, a width of an upper region adjacent to the width change portion 41V may be smaller than a width of a lower region adjacent to the width change portion 41V. In each of the vertical structures 41', a plurality of word lines WL may be disposed above and below the width change portion 41V.

Figure 30:
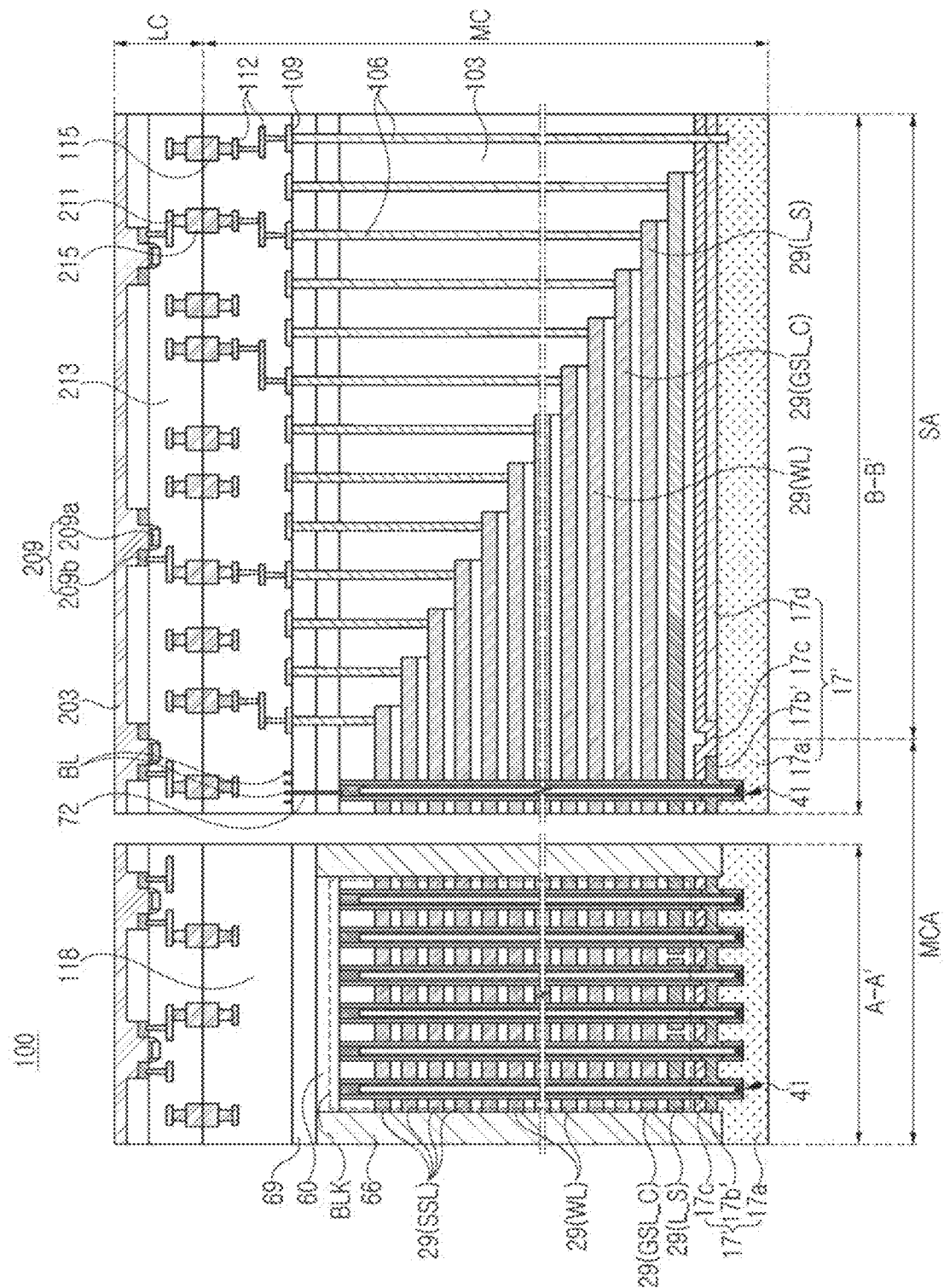
FIG. 30 is a schematic view illustrating a modified embodiment of a semiconductor device according to an embodiment of the present inventive concept.

A modified embodiment of a semiconductor device according to an embodiment of the present inventive concept will be described with reference to FIG. 30. In FIG. 30, a region indicated by A-A' may represent a region taken along line I-I' of FIG. 1, and a region indicated by B-B' may represent a region in which the gate electrodes 29 extends to a step region SA from the memory cell array region MCA to have end portions arranged in a step shape.

Referring to FIG. 30, the semiconductor device 100 according to the modified embodiment may include a lower chip structure MC and an upper chip structure LC overlapping in a vertical direction. The lower chip structure MC may be a memory semiconductor chip, and the upper chip structure LC may be a logic semiconductor chip.

The lower chip structure MC may include a patterned structure 17'. The patterned structure 17' may include the first to third layers 17a, 17b' and 17c, which are the same as those in FIG. 2, in the memory cell array region MCA and may include a fourth layer 17d on the first layer 17a and the third layer 17c covering the fourth layer 17d in the step region SA. The fourth layer 17d may include an insulating material, e.g., a silicon oxide layer, a silicon nitride layer, and a silicon oxide layer sequentially stacked. The second layer 17b' and the fourth layer 17d may be spaced apart from each other by the third layer 17c.

At least a portion of the patterned structure 17' may be a common source.

The lower chip structure MC may include the separation structures 66 and the block BLK as described above in the memory cell array region MCA, e.g., as in FIG. 2. The gate electrodes 29 in the block BLK may include the gate electrodes 29. The gate electrodes 29 may have end portions extending from the memory cell array region MCA into the step region SA and arranged in a step shape.

The lower chip structure MC may further include an insulating layer 103 covering the gate electrodes 29 in the step region SA and gate contact plugs 106 penetrating through the insulating layer 103 and electrically connected to the gate electrodes 29.

The lower chip structure MC may further include gate interconnection lines 109 electrically connected to the gate contact plugs 106 on the gate contact plugs 106, connection wirings 112 electrically connected to the gate interconnection lines 109 and the bit lines BL, first bonding pads 115 on the connection wirings 112, and an insulating layer 118 coplanar with an upper surface of the first bonding pads 115 and covering side surfaces of the connection wirings 112 and the first bonding pads 115.

The upper chip structure LC disposed on the block BLK and the bit lines BL may include a semiconductor substrate 203, a peripheral circuit 209 disposed between the semiconductor substrate 203 and the lower chip structure MC, an upper circuit interconnection 211 disposed between the peripheral circuit 209 and the lower chip structure MC, second bonding pads 215 connected to the upper circuit interconnection 211, and an insulating layer 213 covering side surfaces of the second bonding pads 215 and the upper circuit interconnection 211. The peripheral circuit 209 may include peripheral devices such as a transistor including a peripheral gate 209a and peripheral source/drain 209b. The second bonding pads 215 may be bonded with and may be in contact with the first bonding pads 115. The first and second bonding pads 115 and 215 may include, for example, copper.

Figure 31A:
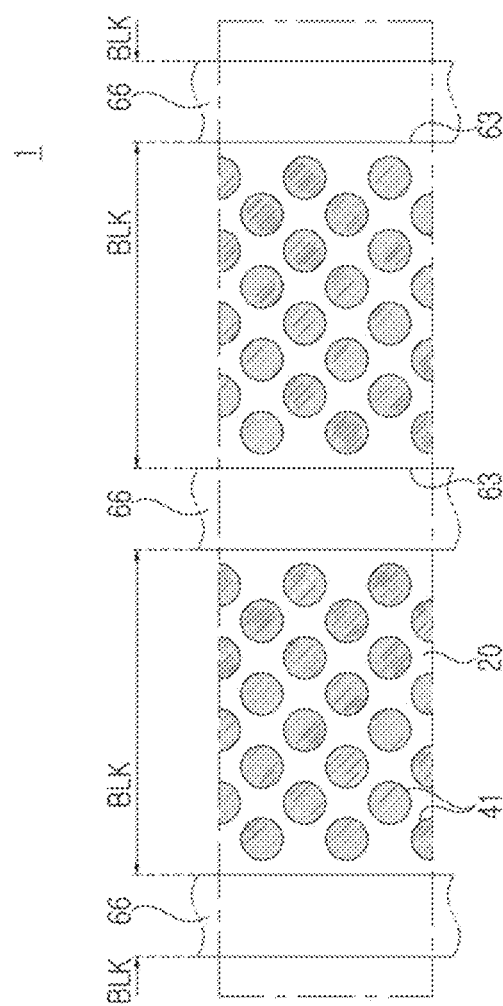
FIGS. 31A and 31B are schematic plan views illustrating a modified embodiment of a semiconductor device according to an embodiment of the present inventive concept.
Figure 31B:
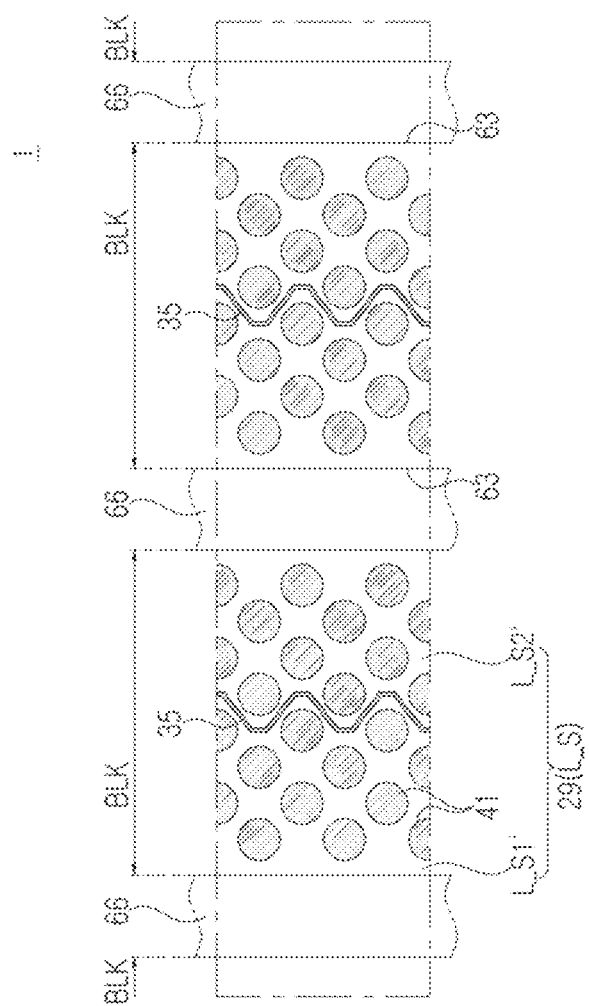

Next, a modified embodiment of the lower select gate electrodes L_S in the stack structure 20 will be described with reference to FIGS. 31A to 32B. As in FIGS. 2 and 4 described above, in one block BLK disposed between a pair of adjacent separation structures 66, the lower select gate electrodes L_S include three lower select gate electrodes L_S1, L_S2, and L_S3, but the present inventive concept is not limited thereto. FIGS. 31A and 31B are plan views illustrating an example in which the lower select gate electrodes L_S are separated into two lower select gate electrodes L_S1' and L_S2', and FIGS. 32A and 32B are plan views illustrating an example in which the lower select gate electrodes L_S are separated into three lower select gate electrodes L_S1," L_S2," and L_S3."

Referring to FIGS. 31A and 31B, in one block BLK disposed between a pair of adjacent separation structures 66, the lower select gate electrodes L_S in the stack structure 20 may be separated into two lower select gate electrodes L_S1' and L_S2'.

In an example embodiment, when the lower select gate electrodes L_S are separated into two lower select gate electrodes L_S1' and L_S2', the gate electrodes 29 may be formed of the same conductive material. For example, the gate electrodes 29 may include at least one of polysilicon, W, Ru, Mo, Ni, NiSi, Co, CoSi, Ti, TiN, or WN.

Figure 32A:
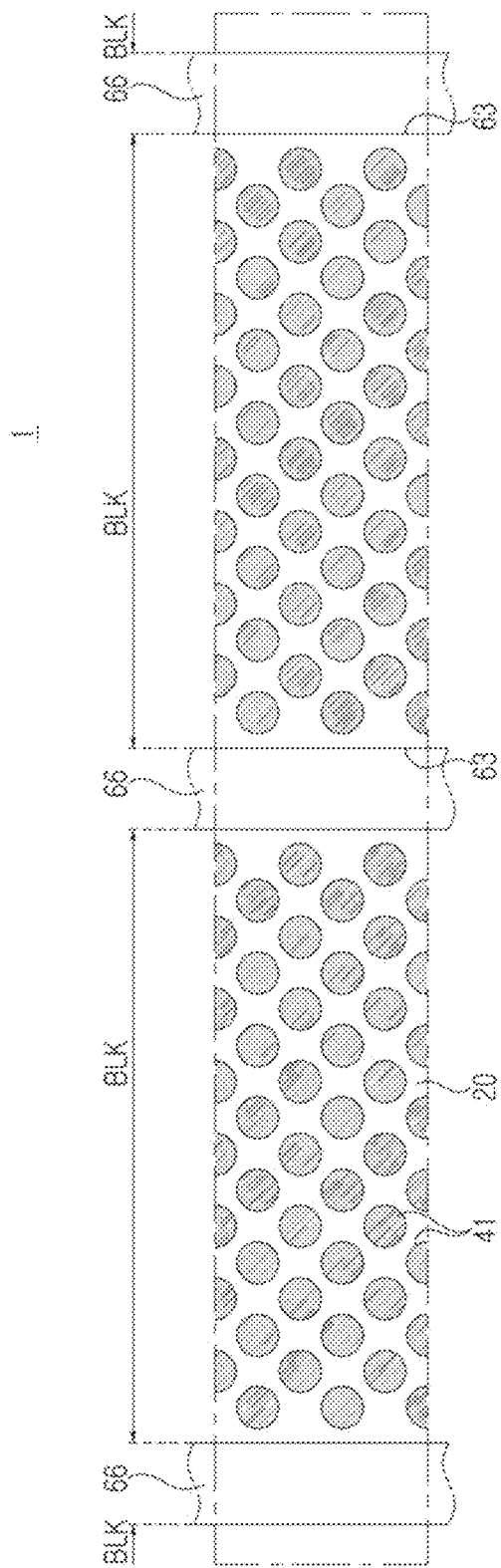
FIGS. 32A and 32B are schematic plan views illustrating a modified embodiment of a semiconductor device according to an embodiment of the present inventive concept.
Figure 32B:
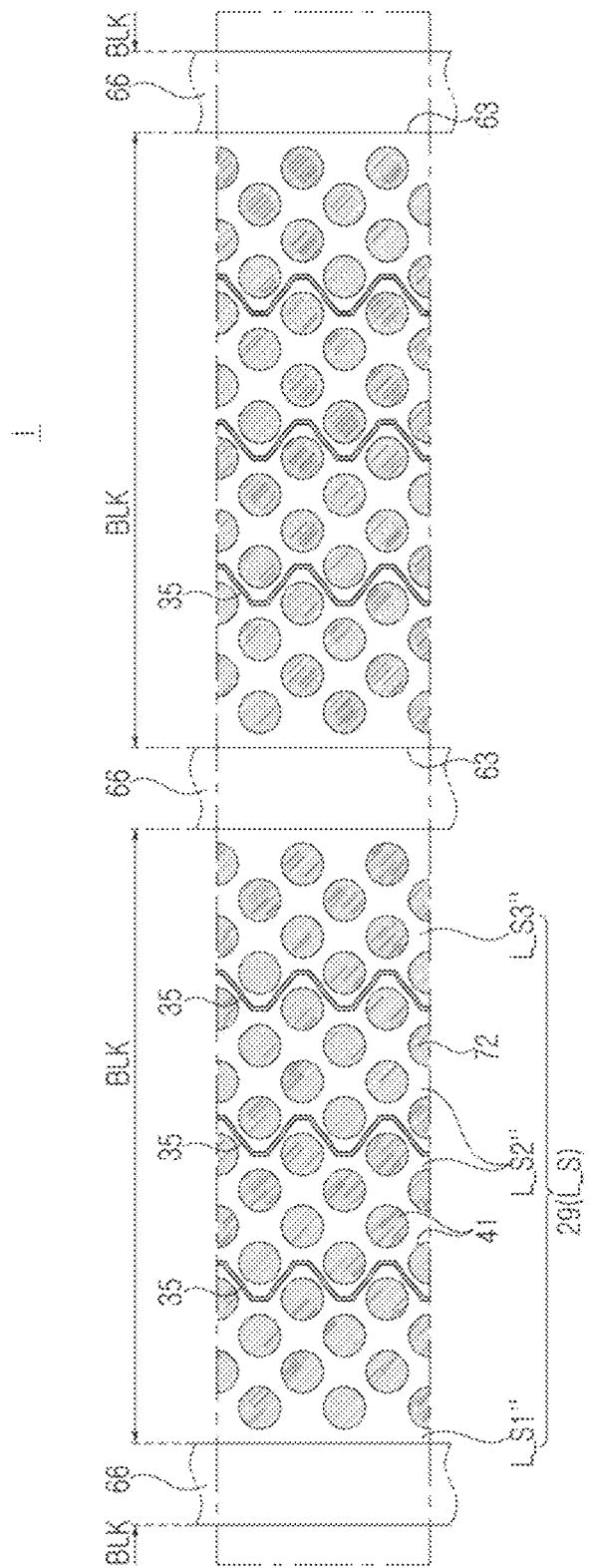

Referring to FIGS. 32A and 32B, in one block BLK disposed between a pair of adjacent separation structures 66, the lower select gate electrodes L_S in the stack structure 20 may be separated into three lower select gate electrodes L_S1", L_S2", and L_S3" by insulating separation patterns 35. For example, the lower select gate electrodes L_S1," L_S2," and L_S3" may include a pair of lower select gate electrodes L_S1" and L_S3" in contact with a pair of separation structures 66 and a plurality of lower select gate electrodes L_S2" disposed between the pair of lower select gate electrodes L_S1" and L_S3".

Among the gate electrodes 29 of the stack structure 20, the lower common select gate electrode GSL_C, the dummy word line Dummy WL, the word lines WL, the upper select gate electrodes SSL1, SSL2, and SSL3, and the upper common select gate electrode SSL_C may be formed of a first conductive material, and the lower select gate electrodes L_S1", L_S2", and L_S3" may be formed of a second conductive material different from the first conductive material. For example, the first conductive material may include at least one of W, Ru, Mo, Ni, NiSi, Co, CoSi, Ti, TiN, or WN, and the second conductive material may include at least one of polysilicon, W, Ru, Mo, Ni, NiSi, Co, CoSi, Ti, TiN, or WN.

Next, methods of forming a semiconductor device according to an embodiment of the present inventive concept will be described with reference to FIGS. 33A to 33F. FIGS. 33A to 33F are cross-sectional views illustrating a region taken along line I-I' of FIG. 1 to describe methods of forming a semiconductor device according to an embodiment of the present inventive concept.

Figure 33A:
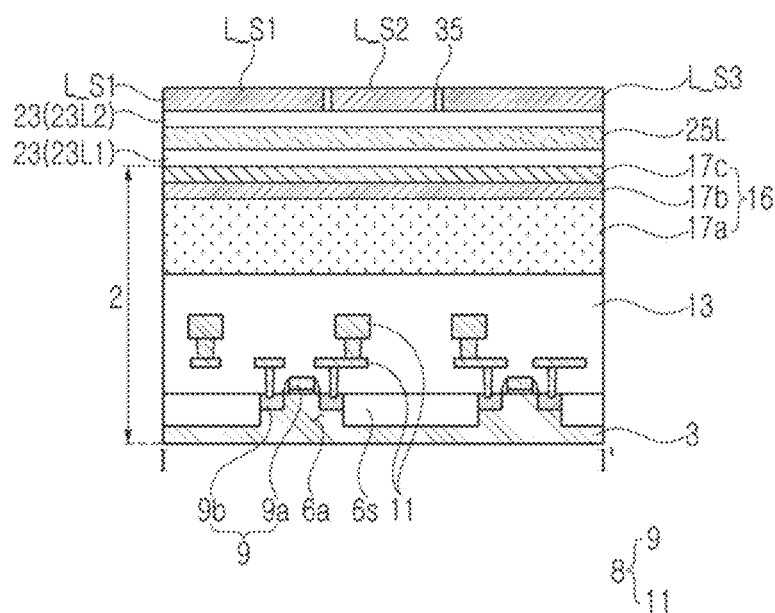
FIGS. 33A, 33B, 33C, 33D, 33E, and 33F are cross-sectional views illustrating methods of forming a semiconductor device according to an embodiment of the present inventive concept.

Referring to FIGS. 1 and 33A, the peripheral circuit 8 and the lower insulating layer 13 covering the peripheral circuit 8 may be formed on the semiconductor substrate 3. The peripheral circuit 8 may include the circuit element 9 such as a transistor including the peripheral gate 9a and the peripheral source/drain 9b and a circuit interconnection 11 electrically connected to the circuit element 9.

A preliminary patterned structure 16 may be formed on the lower insulating layer 13. Forming the preliminary patterned structure 16 may include forming a lower patterned layer 17a, a preliminary intermediate patterned layer 17b, and an upper patterned layer 17c which are sequentially stacked. The lower patterned layer 17a and the upper patterned layer 17c may be formed of, for example, silicon layers. At least one of the lower patterned layer 17a and the upper patterned layer 17c may be formed of, for example, a doped silicon layer, e.g., a polysilicon layer having an N-type conductivity. The preliminary intermediate patterned layer 17b may include sequentially stacked layers, e.g., a silicon oxide layer, a silicon nitride layer, and a silicon oxide layer which are sequentially stacked.

The lowermost interlayer insulating layer 23L1, the lowermost sacrificial gate layer 25L, and a second lowermost interlayer insulating layer 23L2 may be sequentially formed on the preliminary patterned structure 16. The lowermost interlayer insulating layer 23L1 and the second lowermost interlayer insulating layer 23L2 may be formed of, for example, silicon oxide. The lowermost sacrificial gate layer 25L may be formed of, for example, silicon nitride.

In an example embodiment, forming of the lowermost sacrificial gate layer 25L and the second lowermost interlayer insulating layer 23L2 may be omitted. Lower select gate electrodes L_S spaced apart from each other may be formed on the second lowermost interlayer insulating layer 23L2. Insulating separation patterns 35 may be formed to fill spaces between the lower select gate electrodes L_S.

The lower select gate electrodes L_S may be formed of, for example, doped polysilicon, metal nitride, or a metal.

In an example, the lower select gate electrodes L_S may be plural. For example, the lower select gate electrodes L_S may form first to third lower select gate electrodes L_S1, L_S2, and L_S3 spaced apart from each other.

Figure 33B:
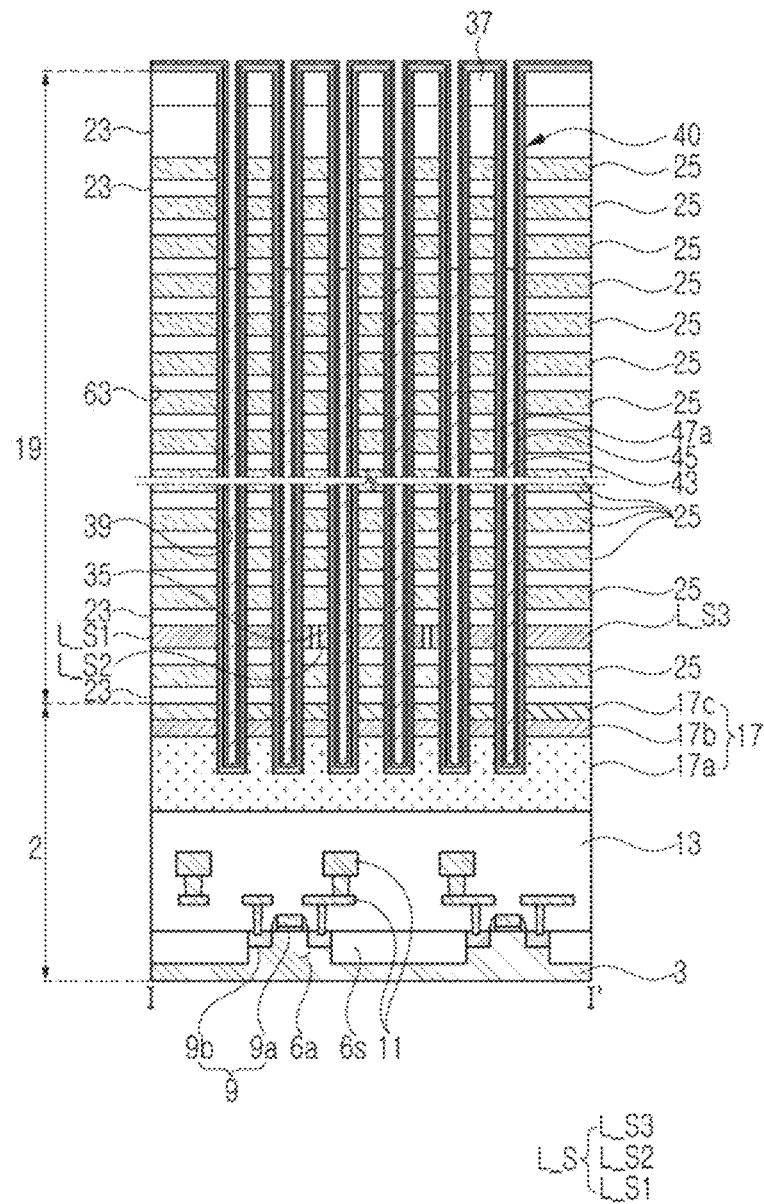

Referring to FIGS. 1 and 33B, the interlayer insulating layers 23 and the sacrificial gate layers 25 alternately and repeatedly stacked on the lower select gate electrodes L_S may be formed. An uppermost layer among the interlayer insulating layers 23 and the sacrificial gate layers 25 may be an uppermost interlayer insulating layer. A structure from the lowermost interlayer insulating layer 23 to the uppermost interlayer insulating layer 23 is defined as a preliminary stack structure 19. A mask pattern 37 may be formed on the preliminary stack structure 19. The interlayer insulating layers 23 may be formed of, for example, silicon oxide. The sacrificial gate layers 25 may be formed of, for example, silicon nitride.

Channel holes 39 passing through the mask pattern 37 and the preliminary stack structure 19 and extending into the preliminary patterned structure 16 may be formed. The channel holes 39 may pass through the upper patterned layer 17c and the preliminary intermediate patterned layer 17b and extend into the lower patterned layer 17a.

A preliminary vertical structure 40 may be formed in each of the channel holes 39. Forming the preliminary vertical structure 40 may include sequentially forming a dielectric structure 43 and a channel layer 45 conformally covering the inner wall of each of the channel holes 39 and forming a preliminary gap-fill layer 47a partially filling the channel holes 39. Forming the dielectric structure 43 may include sequentially forming a first dielectric layer, a charge trap layer, and a second dielectric layer. The preliminary gap-fill layer 47a may be formed of, for example, silicon oxide.

Figure 33C:
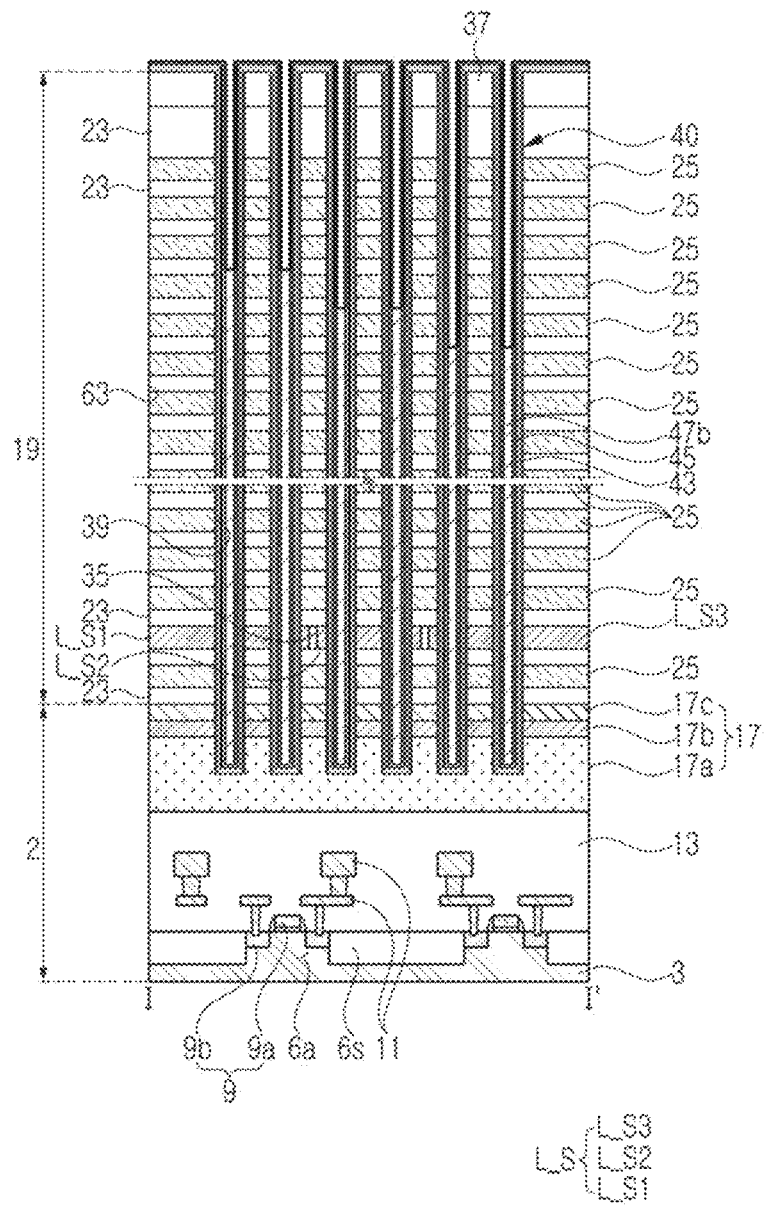

Referring to FIGS. 1 and 33C, a photo process and an etching process for partially etching the preliminary gap-fill layers 47a may be repeatedly performed to form lower gap-fill layers 47b having different heights in the channel holes 39.

Figure 33D:
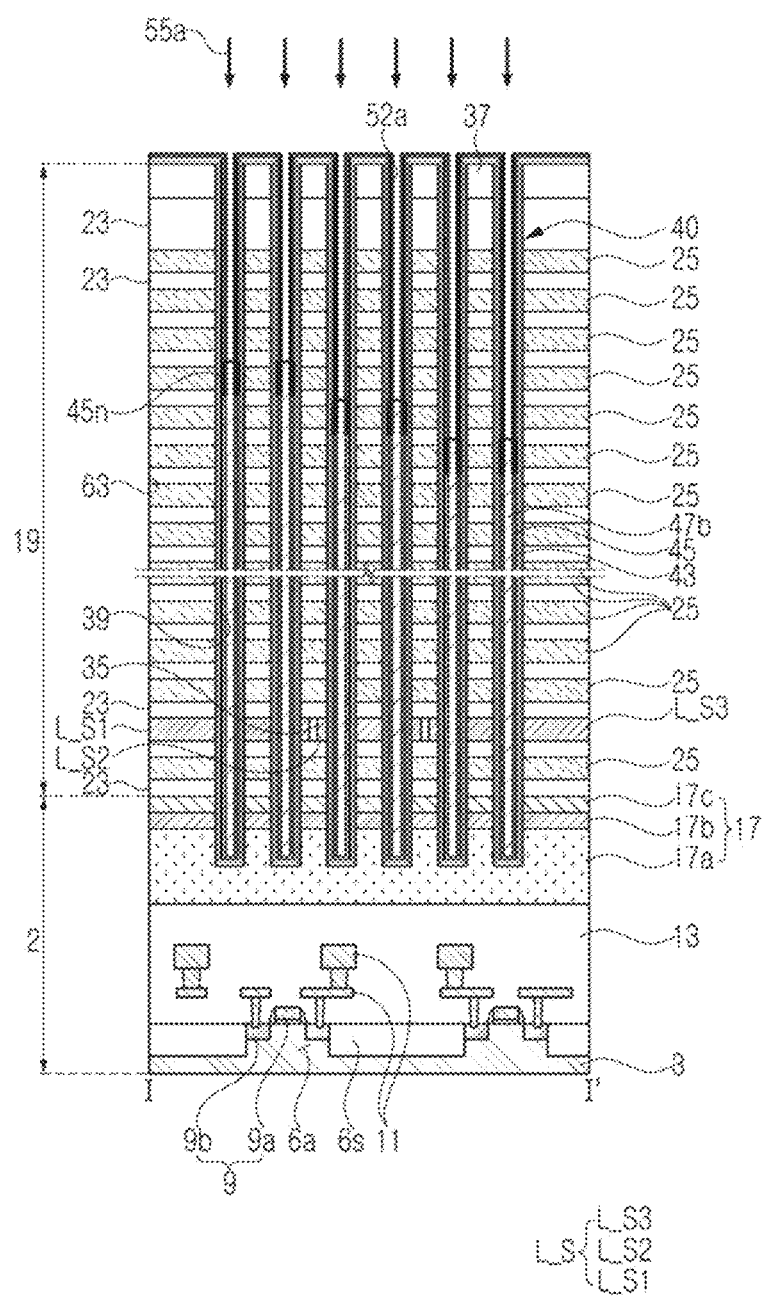

Referring to FIGS. 1 and 33D, sacrificial spacers 52a may be formed to cover side surfaces of the channel layer 45 on the lower gap-fill layers 47b. Subsequently, an ion implantation process 55a may be performed to form an impurity region having an N-type conductivity in the channel layer 45 below the sacrificial spacers 52a. Subsequently, the sacrificial spacers 52a may be removed.

The impurity region formed in the channel layer 45 by the ion implantation process 55a may be a region doped with "P" or "As" and may be formed as the first channel regions (e.g., 45n of FIG. 9) of the depletion mode transistors described above, i.e., the upper select transistors S_T1a, S_T2b, and S_T3c.

"P" or "As" may be implanted into the lower gap-fill layers 47b by the ion implantation process 55a. Accordingly, the lower gap-fill layers 47b may include a region (e.g., 47d of FIG. 9) doped with "P" or "As."

In another example, before the ion implantation process 55a is performed, the lower gap-fill layers 47b may be partially etched to expose a portion of the channel layer 45 positioned below the sacrificial spacers 52a, and the ion implantation process 55a may then be performed to dope the exposed channel layer 45 with impurities such as "P" or "As." During the ion implantation process 55a, impurities such as "P" or "As" may be doped on an upper surface of the lower gap-fill layers 47b. The ion implantation process 55a may be, for example, a plasma doping process.

Figure 33E:
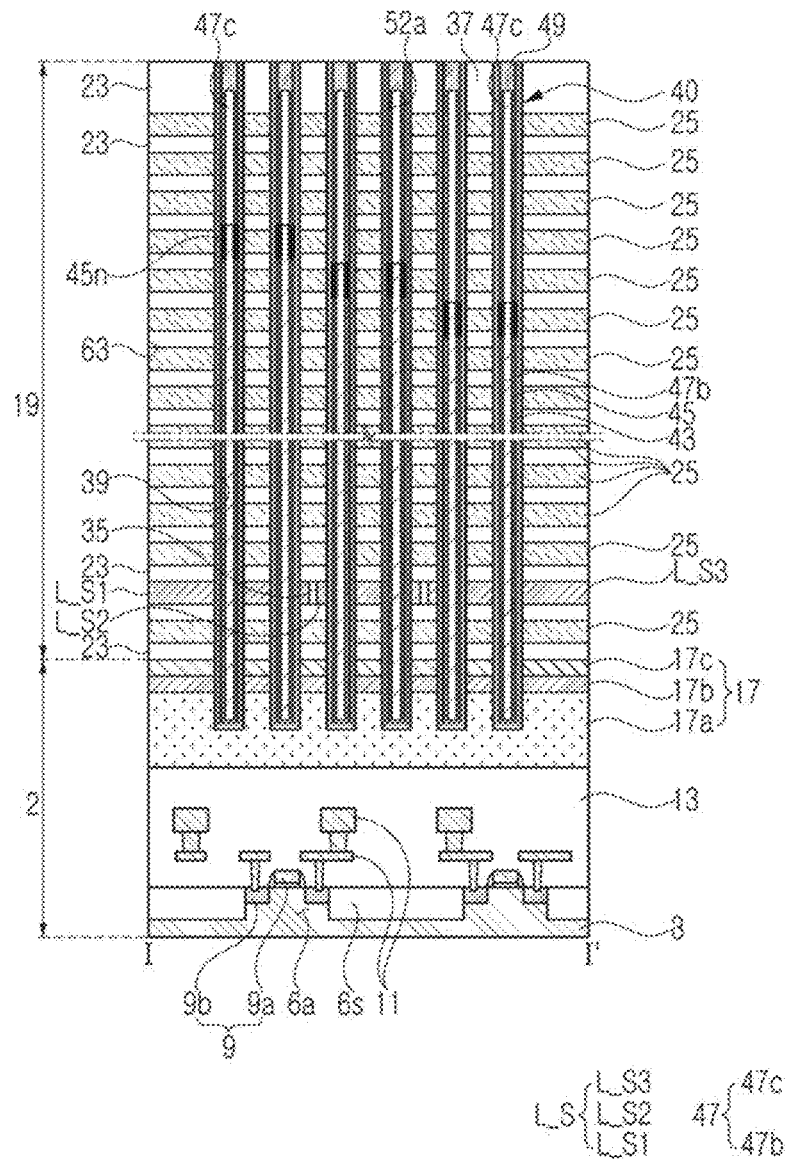

Referring to FIGS. 1 and 33E, an upper gap-fill layer 47c may be formed on the lower gap-fill layer 47b in each of the channel holes 39. The lower and upper gap-fill layers 47b and 47c may form a gap-fill layer 47. A pad pattern 49 may be formed on the gap-fill layer 47. Accordingly, the vertical structures 41 may be formed in the channel holes 39.

In another example, after the channel holes 39 are formed, the ion implantation process 55a of implanting impurities into the channel layer 45 may be omitted.

Figure 33F:
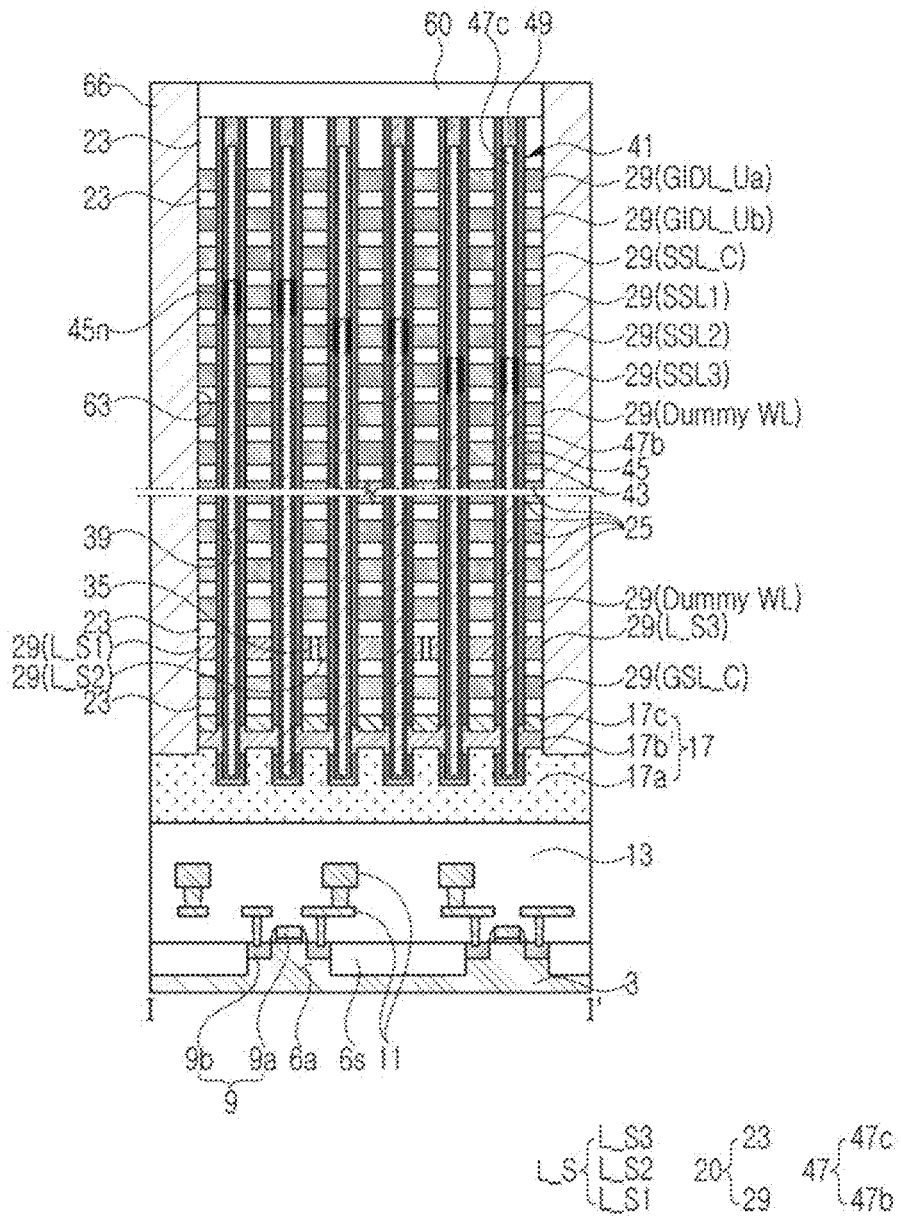

Referring to FIGS. 1 and 33F, a first upper insulating layer 60 may be formed on the preliminary stack structure 19. Separation trenches 63 penetrating through the first upper insulating layer 60 and the preliminary stack structure 19 may be formed. A protective spacer may be formed on sidewalls of the separation trenches 63, the third patterned layer 17c and the preliminary intermediate patterned layer 17b may be sequentially etched to expose a side surface of the preliminary intermediate patterned layer 17b, the preliminary intermediate patterned layer 17b and the dielectric structure 43 may be sequentially etched, and a second patterned layer 17b' may be formed in a space in which the preliminary intermediate patterned layer 17b and the dielectric structure 43 are etched. After the protective spacer on the sidewalls of the separation trenches 63 is removed, the sacrificial gate layers 25 may be removed to form voids, and gate dielectric layers 27 and gate electrodes 29 may be sequentially formed in the voids. Separation structures 66 filling the separation trenches 63 may be formed.

Figure 34:
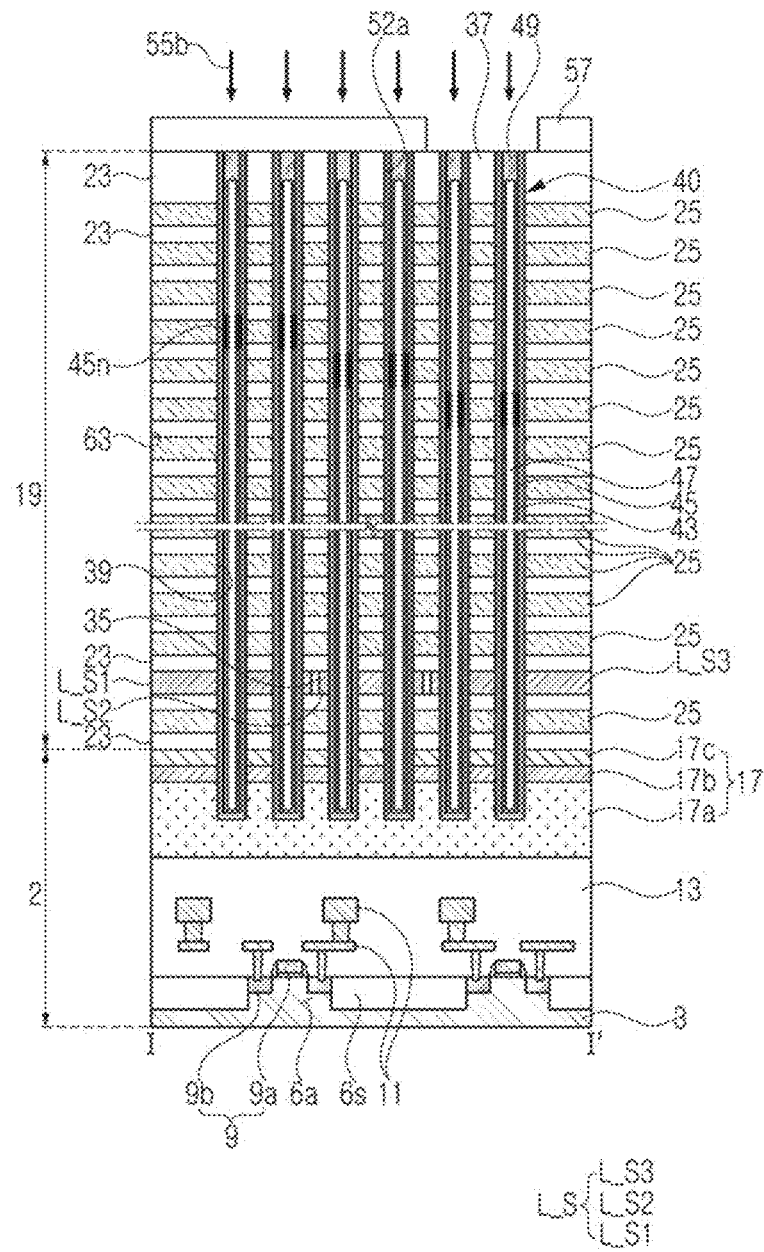
FIG. 34 is a cross-sectional view illustrating a modified embodiment of a method of forming a semiconductor device according to an embodiment of the present inventive concept.

FIG. 34 is a cross-sectional view illustrating a modified embodiment of a method of forming a semiconductor device according to an embodiment of the present inventive concept.

Referring to FIG. 34, after forming the channel holes 39 as described above with reference to FIG. 33B, vertical structures 41 may be formed in the channel holes 39. Each of the vertical structures 41 may include an insulating core pattern 47, a channel layer 45 covering side surfaces and a bottom surface of the insulating core pattern 47, a pad pattern 49 in contact with the channel layer 45 on the insulating core pattern 47, and a dielectric structure 43 covering an outer surface of the at least channel layer 45.

An ion implantation mask 57 forming process and an ion implantation process 55b may be repeated a plurality of times to form impurity regions positioned at different height levels in the channel layer 45. After the ion implantation process 55b is performed, the ion implantation mask 57 may be removed. The impurity regions formed in the channel layer 45 by the ion implantation process 55b may be formed as the first channel regions (45n of FIG. 9) of the depletion mode transistors described above, that is, the upper select transistors S_T1a, S_T2b, and S_T3c, as regions doped with "P" or "As."

Next, data storage systems including a semiconductor device according to an example embodiment of the present inventive concept will be described with reference to FIGS. 35, 36 and 37.

Figure 35:
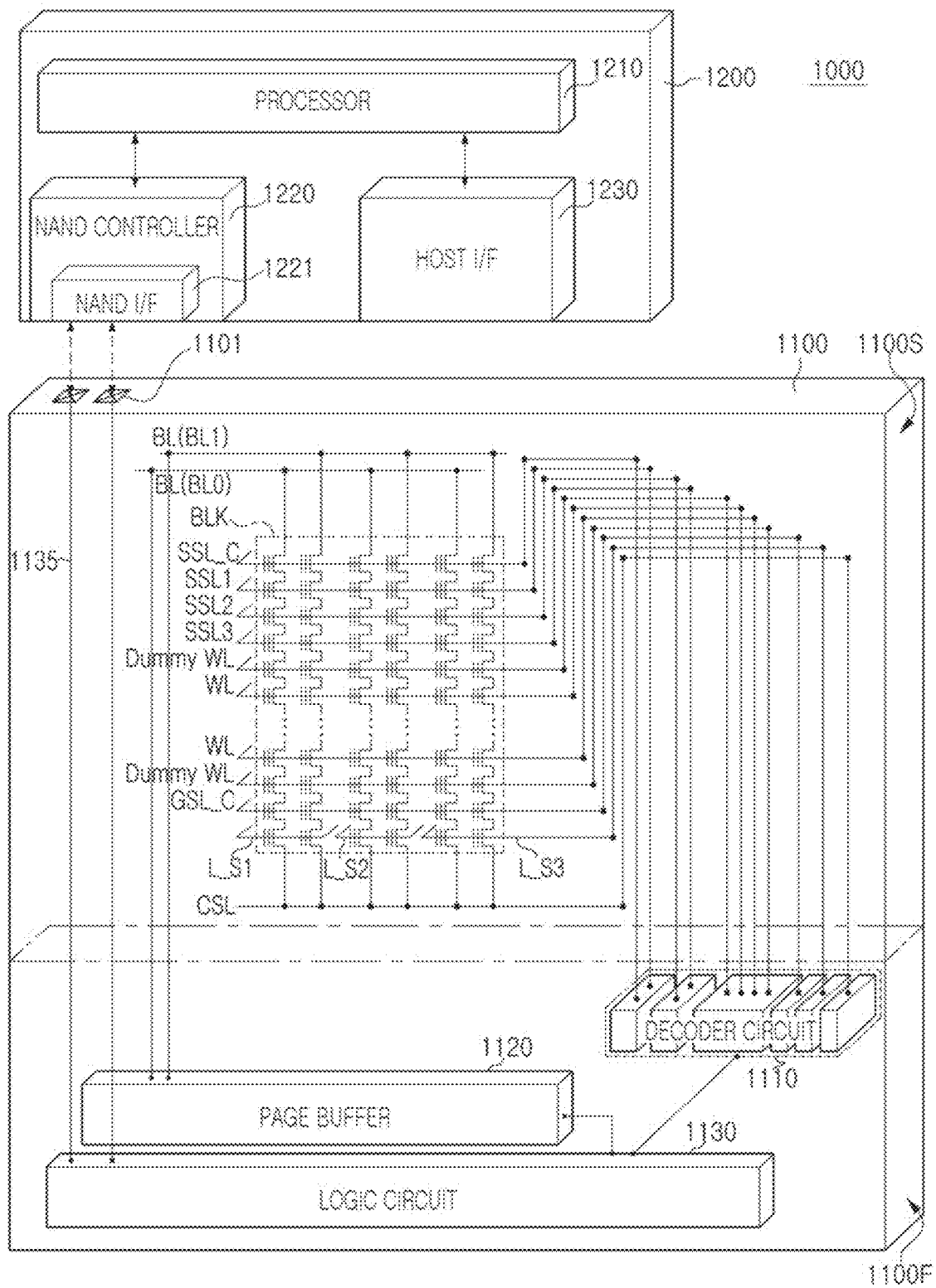
FIG. 35 is a view schematically illustrating a data storage system including a semiconductor device according to an example embodiment of the present inventive concept.

FIG. 35 is a view schematically illustrating a data storage system including a semiconductor device according to an example embodiment of the present inventive concept.

Referring to FIG. 35, a data storage system 1000 according to an example embodiment of the present inventive concept may include a semiconductor device 1100 and a controller 1200 electrically connected to the semiconductor device 1100. The data storage system 1000 may be a storage device including the semiconductor device 1100 or an electronic device including the storage device. For example, the data storage system 1000 may be a solid state drive (SSD) device, a universal serial bus (USB), a computing system, a medical device, or a communication device including the semiconductor device 1100.

In an embodiment, the data storage system 1000 may be an electronic system for storing data.

The semiconductor device 1100 may be the semiconductor device according to any one of the embodiments described above with reference to FIGS. 1 to 34. The semiconductor device 1100 may include a first structure 1100F and a second structure 1100S on the first structure 1100F.

The first structure 1100F may be a peripheral circuit structure including a decoder circuit 1110, a page buffer 1120, and a logic circuit 1130. For example, the first structure 1100F may include the peripheral circuit (e.g., 8 of FIG. 2) described above.

The second structure 1100S may include the bit lines BL, the common source CSL, and the block BLK described above. For example, the block BLK may include the lower select gate electrodes L_S1, L_S2 and L_S3, the lower common select gate electrode GSL_C, the dummy word line Dummy WL, the word lines WL, the upper select gate electrodes SSL1, SSL2, and SSL3, and the upper common select gate electrode SSL_C as described above with reference to FIGS. 2 to 6. For example, the block BLK may include strings (e.g., S01, S02, S03, S11, S12, S13 in FIGS. 5 and 6) including the transistors as in FIGS. 5 and 6 or strings (e.g., S01, S02, S03, S11, S12, and S13 of FIG. 28) including the transistors as in FIG. 28. The aforementioned patterned structure (17 of FIG. 2) may include a silicon layer having an N-type conductivity, and the silicon layer having an N-type conductivity may be the common source CSL.

The common source CSL, the lower select gate electrodes L_S1, L_S2, and L_S3, the lower common select gate electrode GSL_C, the dummy word line Dummy WL, the word lines WL, the upper select gate electrodes SSL1, SSL2, and SSL3, and the upper common select gate electrode SSL_C may be electrically connected to the decoder circuit 1110 through connection wirings. The decoder circuit 1110 may include a circuit for setting threshold voltages of the upper select transistors described above with reference to FIGS. 12 to 16. The decoder circuit 1110 may include a circuit capable of performing a read operation, an erase operation, and a write operation on the memory cells of the memory cell transistors MC_T described above with reference to FIGS. 17, 18 and 19. The bit lines BL may be electrically connected to the page buffer 1120.

In the first structure 1100F, the decoder circuit 1110 and the page buffer 1120 may execute a control operation on at least one selected memory cell transistor among the plurality of memory cell transistors MC_T. The decoder circuit 1110 and the page buffer 1120 may be controlled by the logic circuit 1130. The data storage system 1000 may communicate with the controller 1200 through the input/output pad 1101 electrically connected to the logic circuit 1130. The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. In some embodiments, the data storage system 1000 may include a plurality of semiconductor devices 1100. In this case, the controller 1200 may control the plurality of semiconductor devices 1100.

The processor 1210 may control an overall operation of the data storage system 1000 including the controller 1200. The processor 1210 may operate according to certain firmware and may access the semiconductor device 1100 by controlling the NAND controller 1220. The NAND controller 1220 may include a NAND interface 1221 processing communication with the semiconductor device 1100. Through the NAND interface 1221, a control command for controlling the semiconductor device 1100, data to be written to the memory cell transistors (e.g., MC_T in FIG. 5) of the semiconductor device 1100, data to be read from the memory cell transistors (e.g., MC_T in FIG. 5) may be transmitted. The host interface 1230 may provide a communication function between the data storage system 1000 and an external host. When a control command is received from an external host through the host interface 1230, the processor 1210 may control the semiconductor device 1100 in response to the control command.

Figure 36:
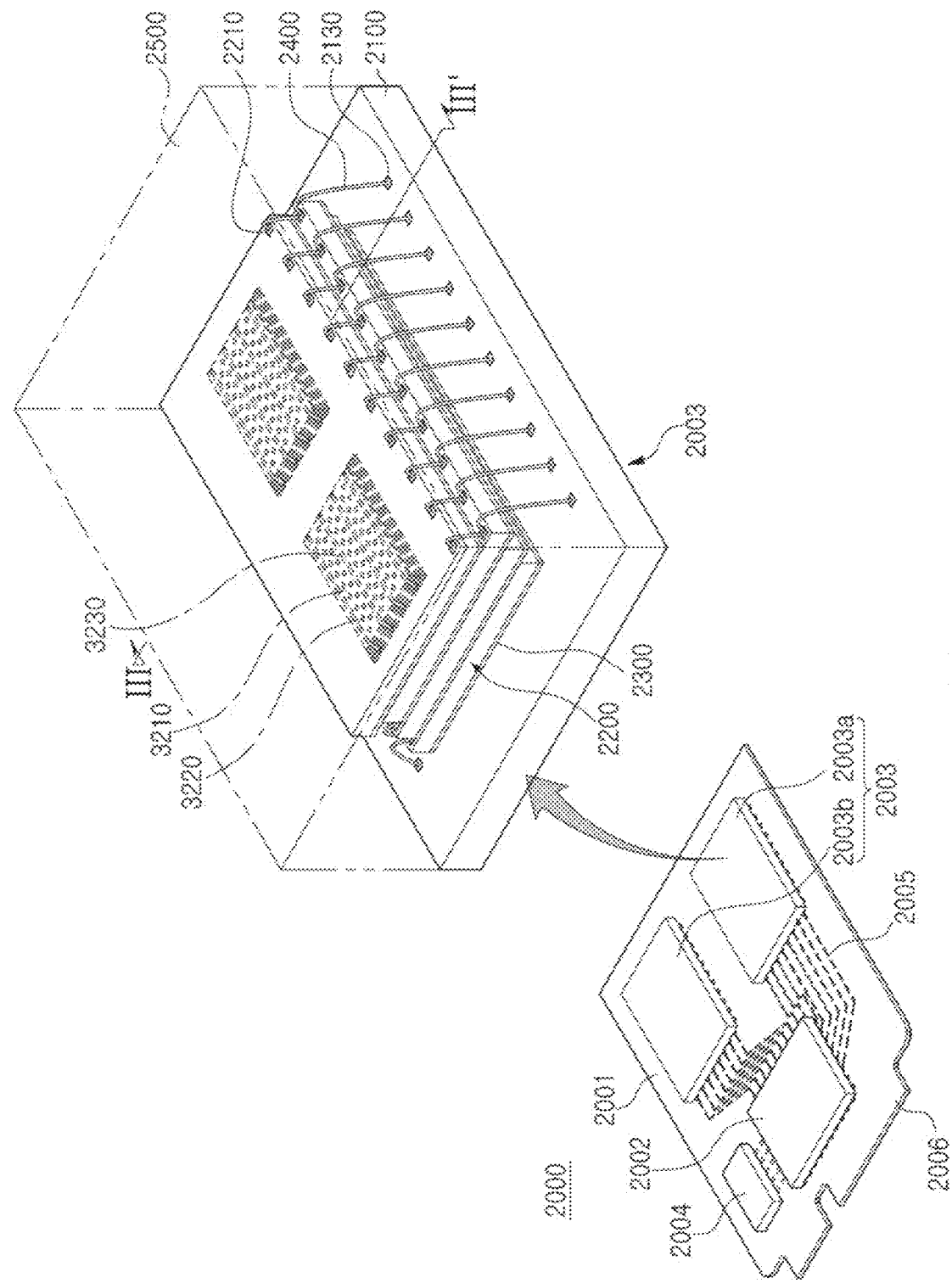
FIG. 36 is a perspective view schematically illustrating a data storage system including a semiconductor device according to an example embodiment of the present inventive concept.

FIG. 36 is a perspective view schematically illustrating a data storage system including a semiconductor device according to an example embodiment of the present inventive concept.

Referring to FIG. 36, a data storage system 2000 according to an example embodiment of the present inventive concept may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with the external host according to any one of interfaces such as a universal serial bus (USB), peripheral component interconnect express (PCI-Express), serial advanced technology attachment (SATA), and M-Phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data into or read data from the semiconductor package 2003 and may improve an operating speed of the data storage system 2000.

The DRAM 2004 may be a buffer memory for mitigating a speed difference between the semiconductor package 2003 as a data storage space and an external host. The DRAM 2004 included in the data storage system 2000 may also operate as a kind of cache memory and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the semiconductor chips 2200 may include the semiconductor device according to any one of the embodiments described above with reference to FIGS. 1 to 34.

Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210.

In example embodiments, the connection structure 2400 may be a bonding wire electrically connecting the input/output pad 2210 and the upper package pads 2130 to each other. Accordingly, in each of the first and second semiconductor packages 2003a and 2003b, the semiconductor chips 2200 may be electrically connected to each other by a bonding wire method and may be electrically connected to the package upper pads 2130 of the package substrate 2100. According to some embodiments, in each of the first and second semiconductor packages 2003a and 2003b, the semiconductor chips 2200 may be electrically connected to each other by a connection structure including a through-silicon via (TSV), instead of the bonding-wire-type connection structure 2400.

In example embodiments, the controller 2002 and the semiconductor chips 2200 may be included in one package. For example, the controller 2002 and the semiconductor chips 2200 may be mounted on a separate interposer substrate different from the main substrate 2001, and the controller 2002 and the semiconductor chips 2200 may be connected to each other by a wiring formed on the interposer substrate.

Figure 37:
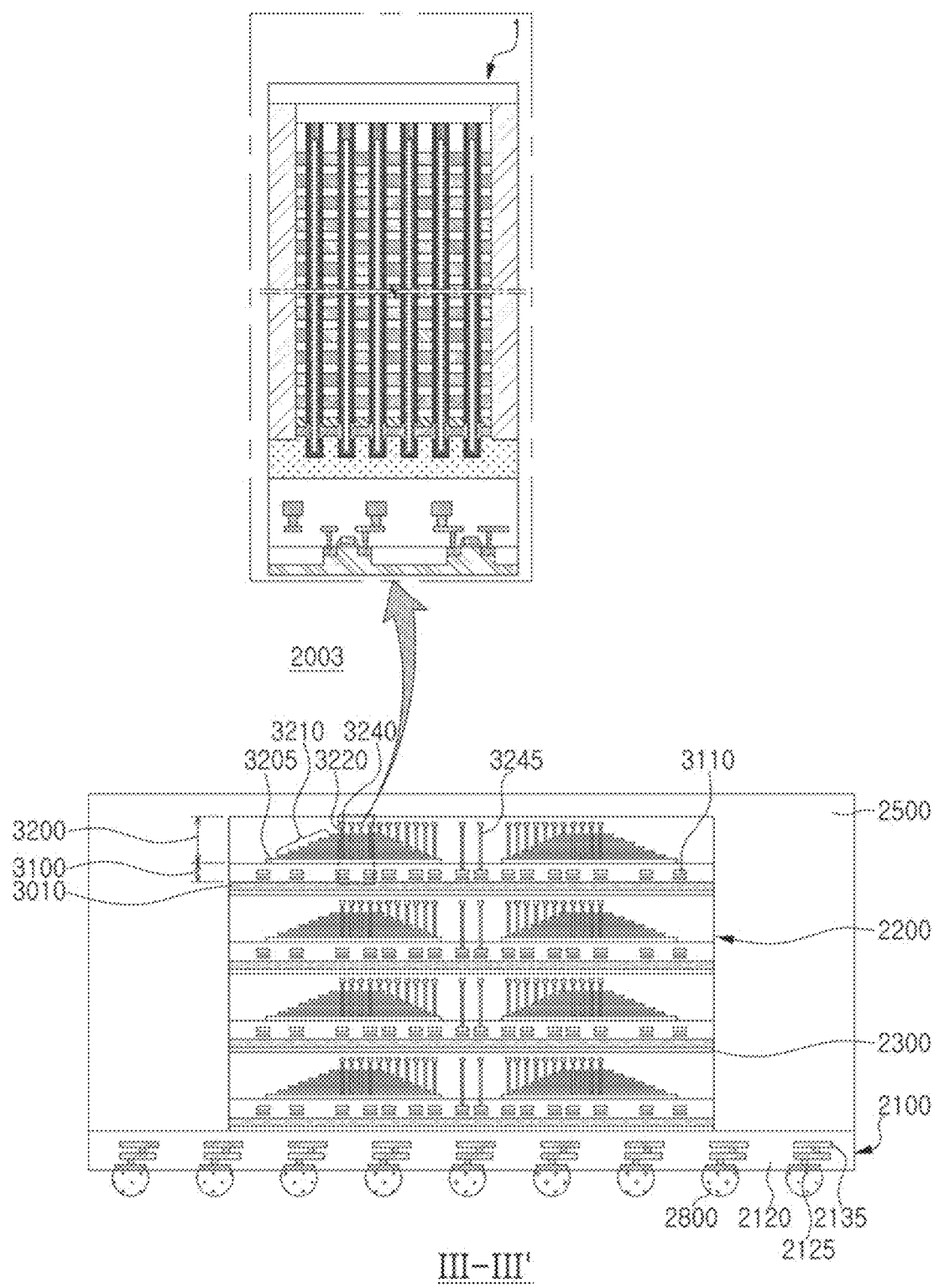
FIG. 37 is a cross-sectional view schematically illustrating a data storage system including a semiconductor device according to an example embodiment of the present inventive concept.

FIG. 37 is a cross-sectional view schematically illustrating a semiconductor package according to an example embodiment of the present inventive concept. FIG. 37 illustrates an example embodiment of the semiconductor package 2003 of FIG. 36 and conceptually illustrates a region of the semiconductor package 2003 of FIG. 36, taken along line III-III'.

Referring to FIG. 37, in the semiconductor package 2003, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal interconnection 2135 electrically connecting the upper pads 2130 and the lower pads 2125 to each other in the package substrate body portion 2120. The upper pads 2130 may be electrically connected to the connection structures 2400. The lower pads 2125 may be connected to the wiring patterns 2005 of the main substrate 2010 of the data storage system 2000 through conductive connection portions 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral interconnection 3110. The second structure 3200 may include a common source line 3205, a gate stack structure 3210 on the common source line 3205, memory channel structures 3220 and separation structures 3230 penetrating through the gate stack structure 3210, bit lines 3240 electrically connected to the memory channel structures 3220, and gate connection wirings electrically connected to the word lines WL of the gate stack structure 3210. The first structure 3100 may include the first structure 1100F of FIG. 35, and the second structure 3200 may include the second structure 1100S of FIG. 35.

Each of the semiconductor chips 2200 may include a through interconnection 3245 electrically connected to the peripheral interconnection 3110 of the first structure 3100 and extending into the second structure 3200. The through interconnection 3245 may penetrate the gate stack structure 3210 and may be further disposed outside the gate stack structure 3210.

Each of the semiconductor chips 2200 may further include an input/output connection wiring 2210 of FIG. 36 electrically connected to the peripheral interconnection 3110 of the first structure 3100 and extending into the second structure and an input/output pad 2210 electrically connected to the input/output connection wiring 3265.

In FIG. 37, an enlarged portion indicated by reference numeral '1' is to explain that the semiconductor chips 2200 of FIG. 37 may be modified to include the cross-sectional structure as in FIG. 2. Accordingly, each of the semiconductor chips 2200 may include the semiconductor device 1 according to any one of the embodiments described above with reference to FIGS. 1 to 34.

As set forth above, according to embodiments of the inventive concept, a semiconductor device including string select transistors having different threshold voltages and sharing one string select gate electrode which is not electrically separated in one block may be provided. Accordingly, since the string select transistors positioned on the same height level may share one string select gate electrode which is not electrically separated, a process for separating the string select gate electrode may be omitted. Also, since patterns for separating the string select gate electrode may be omitted, the degree of integration of the semiconductor device may be improved.

While example embodiments have been shown and described above, it will be apparent to those skilled in the art that modified embodiments and variations could be made without departing from the scope of the present inventive concept as defined by the appended claims.

What is claimed is:

1. A semiconductor device comprising:
   a first separation structure and a second separation structure parallel to each other on a lower structure;
   a block between the first separation structure and the second separation structure and on the lower structure; and
   a plurality of bit lines on the first and second separation structures and on the block,
   wherein
   the block includes a plurality of strings,
   the plurality of bit lines include a first bit line that is electrically connected to a first string and a second string of the plurality of strings,
   each of the plurality of strings includes a lower select transistor, a plurality of memory cell transistors, and a plurality of upper select transistors, the plurality of memory cell transistors are between the lower select transistor and the plurality of upper select transistors, and the lower select transistor, the plurality of memory cell transistors, and the plurality of upper select transistors are connected in series,
   the plurality of upper select transistors in each of the plurality of strings include a first upper select transistor and a second upper select transistor that is between the first upper select transistor and the plurality of memory cell transistors,
   the first upper select transistor of the first string and the first upper select transistor of the second string respectively include first and second portions of a single first upper select gate electrode,
   the lower select transistor of the first string includes a first lower select gate electrode, and
   the lower select transistor of the second string includes a second lower select gate electrode having a surface that is coplanar with a surface of the first lower select gate electrode and is electrically isolated from the first lower select gate electrode.

2. The semiconductor device of claim 1, wherein a voltage difference between a threshold voltage of the first upper select transistor of the first string and a threshold voltage of the first upper select transistor of the second string is about 2 V or more.

3. The semiconductor device of claim 2, wherein the first upper select transistor of the first string has a positive threshold voltage, and the first upper select transistor of the second string has a negative threshold voltage.

4. The semiconductor device of claim 1, wherein
   the second upper select transistor of the first string and the second upper select transistor of the second string respectively include first and second portions of a single second upper select gate electrode,
   the first upper select transistor of the first string and the second upper select transistor of the second string are depletion mode transistors, and
   the second upper select transistor of the first string and the first upper select transistor of the second string are enhancement mode transistors.

5. The semiconductor device of claim 1, wherein
   the plurality of strings further include a third string that is adjacent to the second string and is electrically connected to the first bit line, in each of the plurality of strings, the plurality of upper select transistors further include a third upper select transistor between the second upper select transistor and the plurality of memory cell transistors, the first upper select transistor of the third string includes a third portion of the single first upper select gate electrode, the second upper select transistors of the first, second and third strings respectively include first, second and third portions of a single second upper select gate electrode, the third upper select transistors of the first, second and third strings respectively include first, second and third portions of a single third upper select gate electrode, the lower select transistor of the third string includes a third lower select gate electrode, and the first lower select gate electrode, the second lower select gate electrode, and the third lower select gate electrode are electrically isolated from each other.

6. The semiconductor device of claim 5, wherein
the first upper select transistor of the first string, the second upper select transistor of the second string, and the third upper select transistor of the third string have a first threshold voltage,
the first upper select transistors of the second and third strings have a second threshold voltage,
the second upper select transistors of the first and third strings have a third threshold voltage,
the third upper select transistors of the first and second strings have a fourth threshold voltage, and
the first, second, third and fourth threshold voltages are different from each other.

7. The semiconductor device of claim 5, wherein
the first upper select transistor of the first string, the second upper select transistor of the second string, and the third upper select transistor of the third string have a first threshold voltage,
the first upper select transistors of the second and third strings, the second upper select transistors of the first and third strings, and the third upper select transistors of the first and second strings have a second threshold voltage, and
the second threshold voltage is higher than the first threshold voltage.

8. The semiconductor device of claim 5, wherein
the first upper select transistor of the first string, the second upper select transistor of the second string, and the third upper select transistor of the third string have a negative threshold voltage, and
the second and third upper select transistors of the first string, the first and third upper select transistors of the second string, and the first and second upper select transistors of the third string have a positive threshold voltage.

9. The semiconductor device of claim 1, wherein
each of the plurality of strings further includes a lower common select transistor that is between the plurality of memory cell transistors and the lower select transistor and is connected to the lower select transistor in series, and
the lower common select transistor of the first string and the lower common select transistor of the second string respectively include first and second portions of a single lower common select gate electrode.

10. The semiconductor device of claim 1, wherein
each of the plurality of strings further includes an upper common select transistor on the plurality of memory cell transistors, the upper common select transistor of the first string and the upper common select transistor of the second string respectively include first and second portions of a single upper common select gate electrode, and the upper common select transistor of the first string and the upper common select transistor of the second string have substantially the same threshold voltage.

11. The semiconductor device of claim 1, wherein the lower structure includes a peripheral circuit region and a common source on the peripheral circuit region, and
wherein the common source is electrically connected to the plurality of strings.

12. The semiconductor device of claim 11, wherein each of the plurality of strings further includes:
a lower erase transistor that is connected to the lower select transistor in series and is between the common source and the lower select transistor; and
an upper erase transistor that is connected to the plurality of upper select transistors in series and is between the plurality of bit lines and the plurality of upper select transistors.

13. The semiconductor device of claim 1, further comprising:
a common source that is electrically connected to the plurality of strings and is at a lower portion of the block; and
a chip structure that is on the block and the plurality of bit lines and includes a peripheral circuit region.

14. A semiconductor device comprising:
a lower structure;
a stack structure including a plurality of interlayer insulating layers and a plurality of gate electrodes alternately stacked on the lower structure;
a plurality of separation structures extending through the stack structure;
a plurality of vertical structures extending through the stack structure between the plurality of separation structures; and
a plurality of bit lines on the stack structure and the plurality of separation structures, each of the plurality of vertical structures being electrically connected to at least one of the plurality of bit lines,
wherein the stack structure includes a stack portion between a pair of separation structures of the plurality of separation structures, and the pair of separation structures are adjacent and are parallel to each other,
the plurality of gate electrodes of the stack portion include a plurality of lower select gate electrodes that are spaced apart from each other and are on the same plane, a plurality of word lines that are stacked and spaced apart from each other in a vertical direction and are on the a plurality of lower select gate electrodes, and a plurality of upper select gate electrodes that are stacked and spaced apart from each other in the vertical direction and are on the plurality of word lines, and
the plurality of word lines and the plurality of upper select gate electrodes include opposing side surfaces in contact with the pair of separation structures, respectively.

15. The semiconductor device of claim 14, further comprising:
an insulating separation pattern between the plurality of lower select gate electrodes,
wherein the insulating separation pattern has a wavy shape in a plan view.

16. The semiconductor device of claim 14, wherein each of the plurality of vertical structures includes an insulating core pattern, a channel layer on a side surface and a bottom surface of the insulating core pattern, a pad pattern in contact with the channel layer on the insulating core pattern, and a dielectric structure on an outer surface of the channel layer, the dielectric structure includes a first dielectric layer, a second dielectric layer, and a charge trap layer between the first and second dielectric layers, and the second dielectric layer is between the charge trap layer and the channel layer.

17. The semiconductor device of claim 16, wherein, between the pair of separation structures, the plurality of upper select gate electrodes, the channel layer facing the plurality of upper select gate electrodes, and the dielectric structure between the plurality of upper select gate electrodes and the channel layer constitute a plurality of upper select transistors, and between the pair of separation structures, the plurality of word lines, the channel layer facing the plurality of word lines, and the dielectric structure between the plurality of word lines and the channel layer constitute a plurality of memory cell transistors, and the plurality of upper select transistors include a plurality of first upper select transistors that are between the pair of separation structures, are on the same height level and include one or more first threshold voltage transistors having a first threshold voltage, and the plurality of upper select transistors include a plurality of second threshold voltage transistors having a second threshold voltage, a number of the plurality of second threshold voltage transistors is greater than a number of the one or more first threshold voltage transistors, and the plurality of upper select transistors further include a plurality of second upper select transistors that are between the pair of separation structures, share a channel layer of any one of the plurality of vertical structures, and are on different height levels, and the plurality of second upper select transistors include one or more third threshold voltage transistors having a third threshold voltage and a plurality of fourth threshold voltage transistors having a fourth threshold voltage, a number of the plurality of fourth threshold voltage transistors is greater than the number of the one or more third threshold voltage transistors.

18. The semiconductor device of claim 17, wherein the one or more first threshold voltage transistors and the one or more third threshold voltage transistors are depletion mode transistors, the plurality of second threshold voltage transistors and the plurality of fourth threshold voltage transistors are enhancement mode transistors, the channel layer of the depletion mode transistors is a silicon layer having an N-type conductivity, the channel layer of the depletion mode transistors has a doping profile of impurities changing in the vertical direction, the doping profile of impurities is asymmetrical in the vertical direction, and an upper portion of the doping profile changes more steeply than a lower portion of the doping profile.

19. The semiconductor device of claim 16, wherein the stack portion further includes a lower erase gate electrode between the lower select gate electrodes and the lower structure and an upper erase gate electrode on the upper select gate electrodes, each of the lower and upper erase gate electrodes includes opposing side surfaces in contact with the pair of separation structures, respectively, each of the plurality of vertical structures further includes a portion extending into the lower structure, the lower structure includes a silicon layer having an N-type conductivity, and a portion of the silicon layer of the lower structure extends through the dielectric structure of each of the vertical structures and is in contact with the channel layer of the vertical structures.

20. A data storage system comprising:

a system substrate;

a semiconductor device on the system substrate; and a controller electrically connected to the semiconductor device on the system substrate, wherein the semiconductor device includes:

a first separation structure and a second separation structure parallel to each other on a lower structure;

a block between the first separation structure and the second separation structure and on the lower structure; and a plurality of bit lines on the first and second separation structures and on the block, wherein the block includes a plurality of strings, the plurality of bit lines include a first bit line that is electrically connected to a first string and a second string of the plurality of strings, each of the plurality of strings includes a lower select transistor, a plurality of memory cell transistors, and a plurality of upper select transistors, the plurality of memory cell transistors are between the lower select transistor and the plurality of upper select transistors, and the lower select transistor, the plurality of memory cell transistors, and the plurality of upper select transistors are connected in series, the plurality of upper select transistors in each of the plurality of strings include a first upper select transistor and a second upper select transistor that is between the first upper select transistor and the plurality of memory cell transistors, the first upper select transistor of the first string and the first upper select transistor of the second string respectively include first and second portions of a single first upper select gate electrode, the lower select transistor of the first string includes a first lower select gate electrode, and the lower select transistor of the second string includes a second lower select gate electrode having a surface that is coplanar with a surface of the first lower select gate electrode and is electrically isolated from the first lower select gate electrode.

* * * * *